(12) United States Patent
Okuda et al.

(10) Patent No.: US 7,298,156 B2
(45) Date of Patent: Nov. 20, 2007

(54) ELECTRONIC PART TEST APPARATUS

(75) Inventors: Hiroshi Okuda, Tokyo (JP); Toshiyuki Kiyokawa, Tokyo (JP); Haruki Nakajima, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 49 days.

(21) Appl. No.: 10/505,959

(22) PCT Filed: Dec. 3, 2002

(86) PCT No.: PCT/JP02/12663

§ 371 (c)(1),
(2), (4) Date: Oct. 27, 2004

(87) PCT Pub. No.: WO03/075023

PCT Pub. Date: Sep. 12, 2003

(65) Prior Publication Data

US 2005/0151551 A1  Jul. 14, 2005

(30) Foreign Application Priority Data

Mar. 7, 2002 (WO) .................... PCT/JP02/02141

(51) Int. Cl.
*G01R 31/26* (2006.01)
*G01R 31/02* (2006.01)

(52) U.S. Cl. ..................... 324/765; 324/758

(58) Field of Classification Search ............... None
See application file for complete search history.

(56) References Cited

U.S. PATENT DOCUMENTS

| | | | | |
|---|---|---|---|---|
| 4,786,867 A | * | 11/1988 | Yamatsu | 324/758 |
| 5,184,068 A | * | 2/1993 | Twigg et al. | 324/755 |
| 5,290,134 A | * | 3/1994 | Baba | 414/404 |
| 5,523,678 A | | 6/1996 | Mitsui | |
| 5,640,101 A | * | 6/1997 | Kuji et al. | 324/754 |
| 5,740,272 A | * | 4/1998 | Shimada | 324/770 |
| 5,999,268 A | * | 12/1999 | Yonezawa et al. | 324/754 |
| 6,002,792 A | * | 12/1999 | Oguri et al. | 324/750 |

(Continued)

FOREIGN PATENT DOCUMENTS

DE    298 12 292 U1    11/1998

(Continued)

*Primary Examiner*—Jermele Hollington
(74) *Attorney, Agent, or Firm*—Birch, Stewart, Kolasch & Birch, LLP

(57) ABSTRACT

A holding side contact arm (317) for holding an IC to be tested is positioned on the optical axis (OP) of an alignment CCD camera (326) of an alignment device (320), the IC to be tested is inserted to a first opening (321a) formed on an alignment movable portion (321), and a contact member (317d) of the holding side contact arm (317) is brought to contact the alignment movable portion (321). Then, an alignment amount for correcting a position of the IC to be tested is calculated by taking an image by the camera (326) and performing image processing. A lock-and-free means (318) provided to a first contact arm ($315a_1$) is made to be in a non-restricted state, a movable portion driving device (322) is driven based on the alignment amount, and the holding side contact arm (317) contacting the alignment movable portion (321) is moved with respect to a root side contact arm (316), so that alignment of a position of the IC to be tested is performed.

28 Claims, 33 Drawing Sheets

U.S. PATENT DOCUMENTS

| | | | |
|---|---|---|---|
| 6,384,360 B1 * | 5/2002 | Masuo et al. | 209/573 |
| 6,456,062 B2 * | 9/2002 | Yamashita et al. | 324/754 |
| 6,847,202 B2 * | 1/2005 | Hwang et al. | 324/158.1 |
| 6,906,546 B2 * | 6/2005 | Tanioka et al. | 324/765 |
| 7,023,197 B2 * | 4/2006 | Jung | 324/158.1 |
| 2002/0036512 A1 * | 3/2002 | Maeda et al. | 324/758 |

FOREIGN PATENT DOCUMENTS

| | | |
|---|---|---|
| EP | 1097 387 B1 | 2/2003 |
| JP | 2-28545 A | 1/1990 |
| JP | 03-248444 A | 11/1991 |
| JP | 5-275518 A | 10/1993 |
| JP | 6-249915 A | 9/1994 |
| JP | 7-239362 A | 9/1995 |
| JP | 09/293771 A | 11/1997 |
| WO | WO-00/03255 A2 | 1/2000 |

* cited by examiner

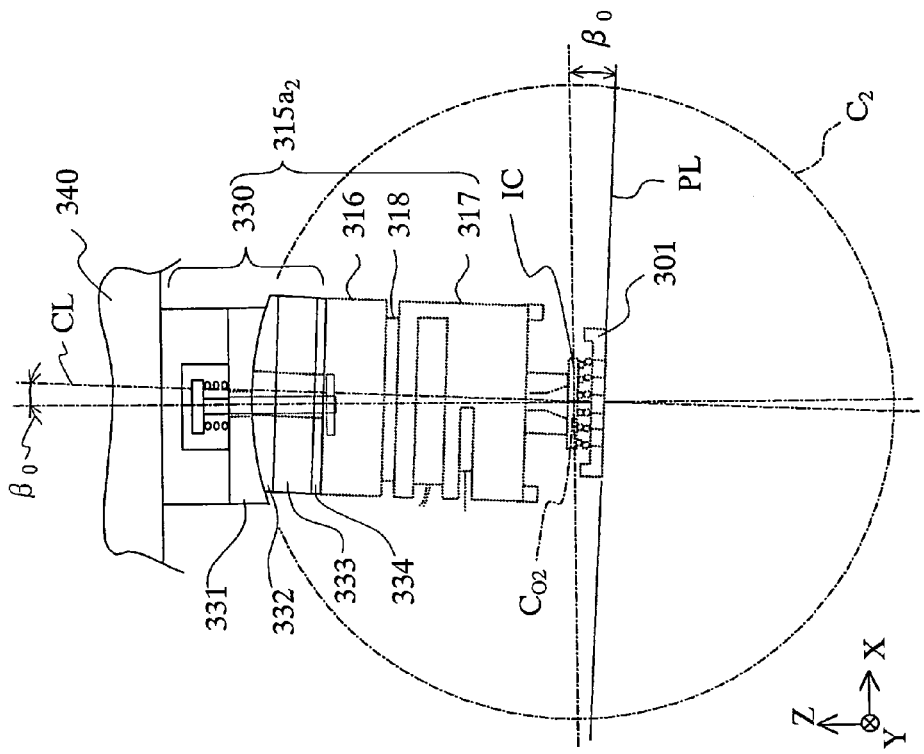
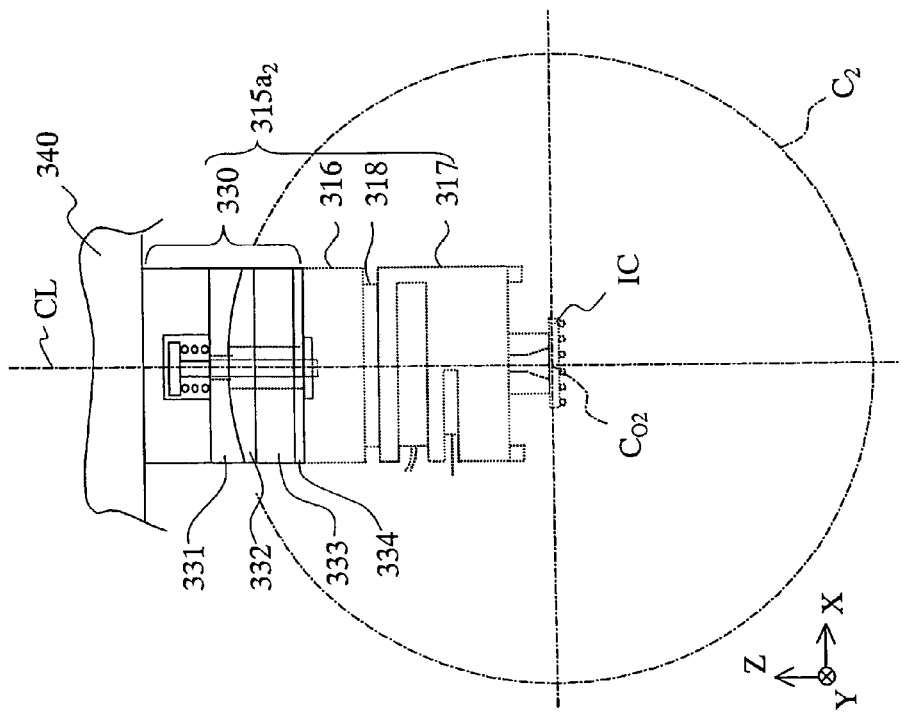

ELECTRONIC PART TEST APPARATUS

TECHNICAL FIELD

The present invention relates to an electronic device testing apparatus for testing a semiconductor integrated circuit element and other various electronic devices (hereinafter, also representatively referred to as ICs), and particularly relates to an electronic device testing apparatus wherein erroneous contact is reduced.

This application is a 371 of PCT/JP02/1263 filed on Dec. 4, 2002.

FIELD OF THE INVENTION

In an electronic device testing apparatus called a handler, a large number of ICs to be tested held on a tray are conveyed into the handler, and the respective ICs to be tested are brought to electrically contact a test head for conducting a test by an electronic device testing apparatus body (hereinafter, also referred to as a tester). When the test is finished, the ICs are taken out from the test head and reloaded to trays in accordance with the test results so as to be classified to categories of good ones and defective ones, etc.

In a conventional handler, a contact arm for bringing an electronic device to be tested to contact a contact portion of a test head is provided with a plurality of actuators. Alignment of the electronic device to be tested with the contact portion is performed by controlling the actuators.

However, a contact arm configured as above has a relatively heavy weight and it is hard to move at a high speed. This disadvantage becomes particularly noticeable when the number of contact arms increases along with an increase of a simultaneously measured amount.

On the other hand, if the alignment of the electronic device with the contact portion is not performed appropriately, a significant problem of erroneous contact occurs between the electronic device and the contact portion.

DISCLOSURE OF THE INVENTION

An object of the present invention is to provide an electronic device testing apparatus for accurately and surely performing alignment of an electronic device to be tested with a contact portion, reducing frequency of erroneous contact, and enabling to move a contact arm for holding and conveying the electronic device at a high speed.

To attain the above object, according to the present invention, there is provided an electronic device testing apparatus comprising a first contact arm for holding the electronic device to be tested and bringing the electronic device to be tested to contact a contact portion of a test head, and a moving means provided on a base side for moving said first contact arm, including: a first image pickup means for taking an image of the electronic device to be tested in a state of being held by said first contact arm; an image processing means for recognizing a relative position of the electronic device to be tested held by said first contact arm with respect to said contact portion based on image information taken by said first image pickup means; and a contact arm position correction means for correcting the position of said first contact arm holding said electronic device to be tested based on the relative position of the electronic device to be tested with respect to said contact portion recognized by said image processing means.

As a result that the first image pickup means takes an image of an electronic device to be tested held on the first contact arm, the image processing means recognizes a relative position of the electronic device to be tested held on the first contact arm with respect to the contact portion based on the taken image information, and the contact arm position correction means corrects a position of the first contact arm holding the electronic device to be tested based on the recognition, it becomes possible to attain accurate contact of the electronic device to be tested and the contact portion and to reduce the frequency of erroneous contact.

Also, while it is not particularly limited in the above invention, preferably, the first contact arm comprises a holding side contact arm for holding the electronic device to be tested; a fixing side contact arm fixed to the moving means; and a lock-and-free means provided between the holding side contact arm and the fixing side contact arm, for restricting or non-restricting a planar movement of the holding side contact arm with respect to the fixing side contact arm on a X-Y plane substantially in parallel with the contact portion.

While it is not particularly limited in the above invention, preferably, the contact arm position correction means is provided on the base side.

As a result that the first contact arm comprises a holding side contact arm, a lock-and-free means and a fixing side contact arm, the lock-and-free means is provided between the holding side contact arm and the fixing side contact arm, and the lock-and-free means restrains or releases restriction of a planar movement of the holding side contact arm with respect to the fixing side contact arm on the X-Y plane being substantially in parallel with the contact portion, the first contact arm does not need to comprise a position correction means, a weight of the contact arm reduces, a moving means is able to move at a high speed, and the frequency of erroneous contact reduces.

BRIEF DESCRIPTION OF DRAWINGS

Below, embodiments of the present invention will be explained based on drawings.

FIG. 28A and FIG. 28B are views for explaining a following operation of rotation about an X-axis of the first contact arm in the second embodiment of the present invention, wherein FIG. 28A shows a state before the following operation and FIG. 28B shows a state during the following operation;

FIG. 29A and FIG. 29B are views for explaining a following operation of rotation about a Y-axis of the first contact arm in the second embodiment of the present invention, wherein FIG. 29A shows a state before the following operation and FIG. 29B shows a state during the following operation;

FIG. 32A, 32B and FIG. 32C are plan schematic views of examples of an arrangement of the first contact arm in the third embodiment of the present invention, wherein FIG. 32A shows an arrangement of four rows by two columns, FIG. 32B shows an arrangement of two rows by two columns and FIG. 32C shows an arrangement of two rows by one column;

BEST MODE FOR CARRYING OUT THE INVENTION

First Embodiment

Figure 1:
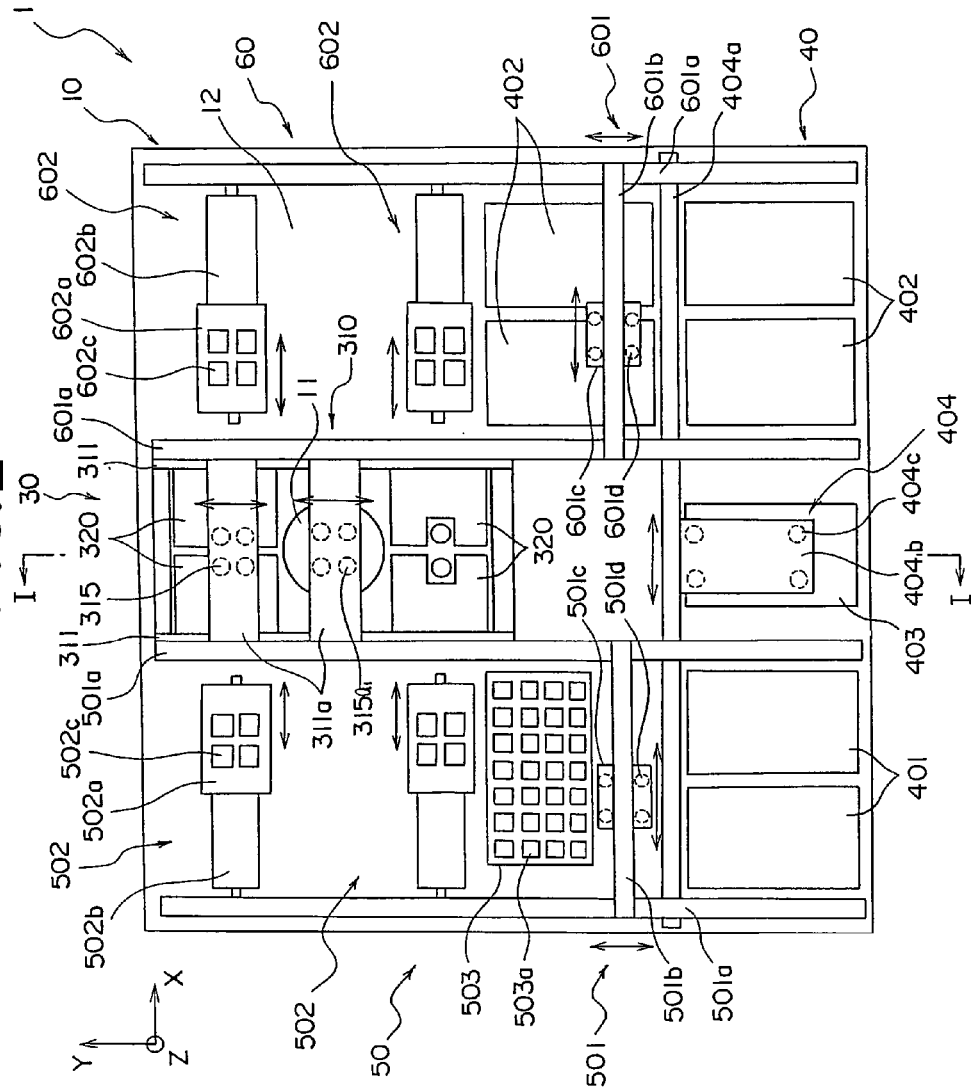
FIG. 1 is a plan view of a first embodiment of an electronic device testing apparatus of the present invention.
Figure 2:
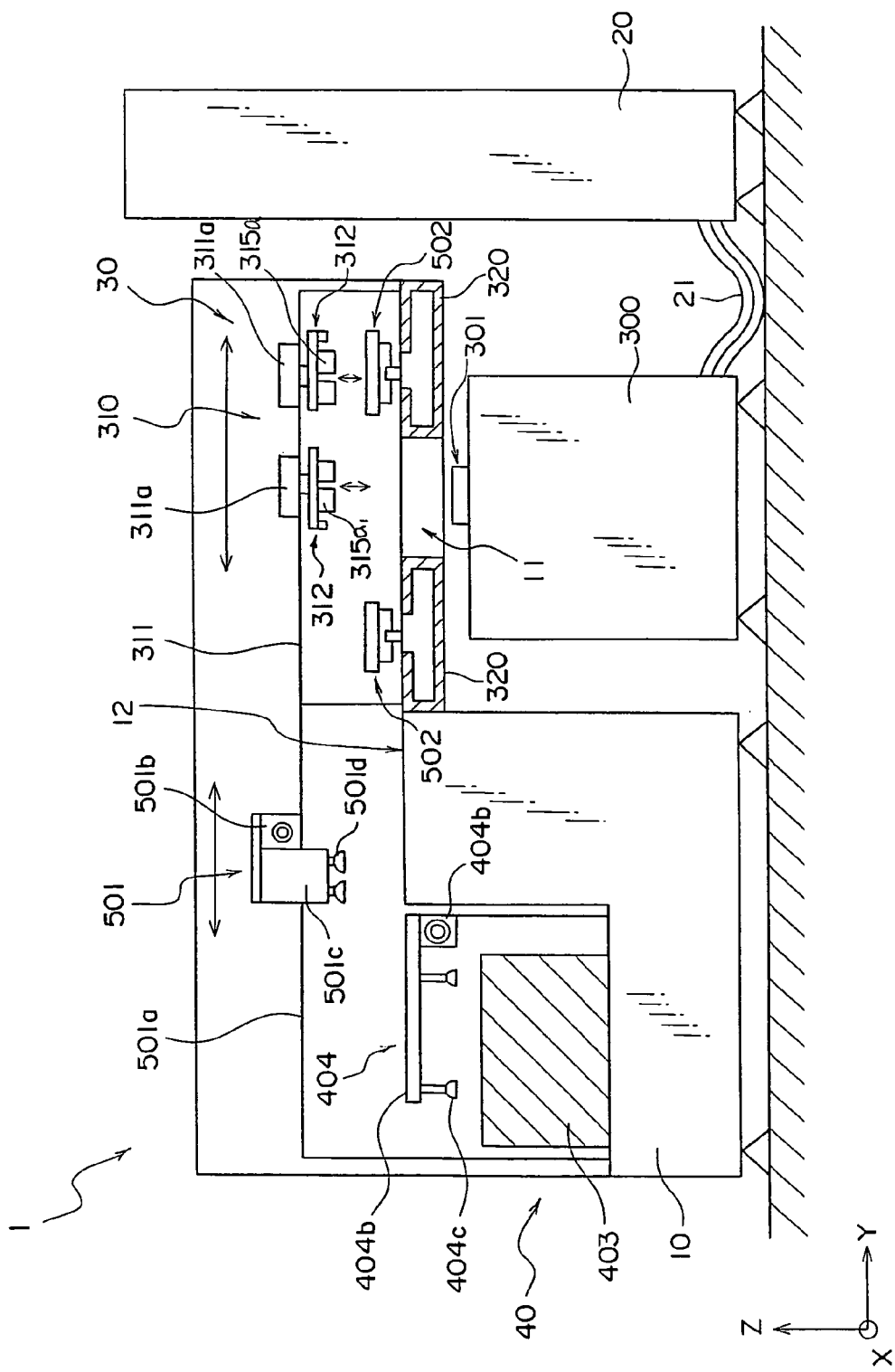
FIG. 2 is a sectional view along the line I-I in FIG. 1.

As shown in FIG. 1 and FIG. 2, an electronic device testing apparatus 1 in the first embodiment of the present invention comprises a handler 10, a test head 300 and a tester 20, wherein the test head 300 and the tester 20 are connected by a cable 21. Pre-test ICs on a supply tray held in a supply tray stocker 401 of the handler 10 are pressed against the contact portion 301 of the test head 300 by a YZ-transfer device 310 (moving means), and after being subjected to a test via the test head 300 and the cable 21, the post-test ICs are loaded on a classification trays held in a classification tray stocker 402 in accordance with the test result.

The handler 10 mainly comprises a test section 30, an IC magazine 40, a loader section 50 and an unloader section 60.

IC Magazine 40

The IC magazine 40 is a means for accommodating pre-test and post-test ICs and mainly comprises a supply tray stocker 401, a classification tray stocker 402, an empty tray stocker 403 and a tray conveyor 404.

The supply tray stocker 401 accommodates a plurality of stacked supply trays loaded with a plurality of pre-test ICs and two supply tray stockers 401 are provided as shown in FIG. 1 in the present embodiment.

The classification tray stocker 402 accommodates a plurality of stacked classification trays loaded with a plurality of post-test ICs and four classification tray stockers 402 are provided as shown in FIG. 1 in the present embodiment. Due to the provision of the four classification tray stockers 402, it is configured to be able to accommodate ICs to be tested sorted into a maximum of four classes in accordance with the test results. That is, in addition to classifying ICs as good and defective, it is possible to divide the good ICs into ones with high operating speeds, ones with medium speeds, and ones with low speeds and the defective ICs into ones requiring retesting, etc. Note that, for example, in the four classification tray stockers 402 in FIG. 1, ICs to be tested having a test result which relatively less frequently arises may be classified to two classification tray stockers 402 close to the test section 30 and ICs to be tested having a test result which relatively highly frequently arises may be classified to two classification tray stockers 402 away from the test head.

The empty tray stocker 403 accommodates empty trays after the all pre-test ICs loaded on the supply tray stocker 401 are supplied to the test section 30.

The tray conveyor 404 is a conveying means movable in the X-axis and Z-axis directions in FIG. 1, mainly comprises X-direction rail 404a, a movable head portion 404b and four suction pads 404c, and operates in a range including the supply tray stockers 401, a part of classification tray stockers 402 and the empty tray stockers 403.

In the tray conveyor 404, the X-axis direction rail 404a fixed on the base 12 of the handler 10 supports one side of the movable head portion 404b so that it is movable in the X-axis direction, and the movable head portion 404b is provided with a Z-axis direction actuator (not shown) and four suction pads 404c at its end portion.

The tray conveyor 404 holds an empty tray emptied in the supply tray stocker 401 by picking up with the suction pads 404c, elevates it by the Z-axis direction actuator and conveys it to the empty tray stocker 403 by sliding the movable head portion 404b on the X-axis direction rail 404a. In the same way, in the case a classification tray becomes full with post-test ICs in the classification tray stocker 402, an empty tray is picked up by suction from the empty tray stocker 403, elevated by the Z-axis direction actuator and conveyed to the classification tray stocker 402 by sliding the movable head portion 404b on the X-axis direction rail 404a.

Note that, while not illustrated, the respective stockers 401, 402 and 403 are provided with an elevator able to move up and down in the Z-axis direction and an operation range of the tray conveyor 404 is set not to overlap with operation ranges of a later explained first XYZ transfer device 501 and a second XYZ transfer device 601 on the Z-axis direction as shown in FIG. 2, so that an operation of the tray conveyor 404 dose not interfere with operations of the first XYZ transfer device 501 and second XYZ transfer device 601.

Note that the number of stockers explained above may be suitably set respectively in accordance with needs.

Loader Section 50

The loader section 50 is a means for supplying ICs to be tested from the supply tray stocker 401 of the IC magazine 40 to the test portion 30, and mainly comprises a first XYZ transfer device 501, two loader buffer portions 502 (two in the negative direction of the X-axis in FIG. 1) and a heat plate 503.

The first XYZ transfer device 501 is a means for transferring ICs to be tested from a supply tray of the supply tray stocker 401 of the IC magazine 40 to the heat plate 503, mainly comprises Y-axis direction rails 501a, an X-direction rail 501b, a movable head portion 501c and suction heads 501d, and has an operation range including the supply tray stocker 401, the heat plate 503 and the two loader buffer portions 502.

As shown in FIG. 1, the two Y-axis direction rails 501a of the first XYZ transfer device 501 are fixed on the base 12 of the handler 10, and between them, the X-axis direction rail 501b is supported so as to be able to slide in the Y-axis direction. The X-axis direction rail 501b supports the movable head portion 501c having the Z-axis direction actuator (not shown), so that it is able to slide in the X-axis direction. Furthermore, the movable head portion 501c comprises four suction pads 501d on the lower end portion and elevates the four suction pads 501d in the Z-axis direction by driving the provided Z-axis direction actuator.

The first XYZ transfer device 501 positions the four suction pads 501d on four ICs to be tested loaded on the supply tray, picks up the four ICs to be tested at a time, transfer to above the heat plate 503, locates them with concave portions 503a formed on the surface of the heat plate 503 and releases them. Note that one suction pad 501d can pick up one IC to be tested.

The heat plate 503 is a heating source for applying predetermined thermal stress to ICs to be tested and, for example, it is a metal plate having a heat source (not shown) under it. On an upper surface of the heat plate 503 is formed a plurality of concave portions 503a into which ICs to be tested are dropped, and pre-test ICs are transferred to the concave portions 503a from the supply tray stocker 401 by the first XYZ transfer device 501. After the ICs to be tested are heated by the heat plate 503 to be a predetermined temperature, the ICs are transferred to the loader buffer portion 502 by the first XYZ transfer device 501.

Note that, as will be explained later on, since alignment of the ICs to be tested is performed by an alignment device 320 before a test, the concave portions 503a are not necessarily formed on the heat plate 503, the surface of the heat plate 503 may be left simply flat and ICs may be loaded on the flat surface by the XYZ transfer device 501. Also, the surface of the heat plate 503 may be a flat surface provided with suction pads facing vertically upward, and ICs to be tested may be put on the suction pads by the XYZ transfer device 501 and sucked by the suction pads provided on the heat plate.

The loader buffer portion 502 is a means to move ICs to be tested back and forth between the operation range of the first XYZ transfer device 501 and the operation range of the YZ transfer device 310 and mainly comprises a movable portion 502a and an X-axis direction actuator 502b.

The movable portion 502a is supported at an end portion of the X-axis direction actuator 502b fixed on the base 12 of the handler 10, and on an upper surface of the movable portion 502a is formed four concave portions 502c to which ICs to be tested are dropped. The first XYZ transfer device 501 picks up at a time and holds four pre-test ICs heated to be a predetermined temperature on the heat plate 503, transfers the same and releases to the concave portions 502c of the loader buffer portion 502. The loader buffer portion 502 holding the four ICs to be tested moves the ICs to be tested from the operation range of the first XYZ transfer device 501 to the operation range of the YZ transfer device 310 as a result of extending the X-axis direction actuator 502b. Note that, as will be explained later on, alignment of positions of the ICs to be tested is performed by the alignment device 320 before a test, so that the concave portions 502c are not necessarily provided on the movable portion 502a and, for example, the surface of the movable portion 502a may be a flat surface provided with suction pads facing vertically upward. When suction pads are provided on the surface of the movable portion 502a, the first XYZ transfer device 501 puts ICs to be tested on the suction pads, the ICs are sucked by the suction pads provided on the movable portion 502a, the X-axis direction actuator 502b is extended to transfer the ICs into the operation range of the YZ transfer device 310, the suction pads releases the ICs when the transfer is completed, and the ICs are held by the YZ transfer device 310.

As explained above, due to the provision of the loader buffer portion 502, the first XYZ transfer device 501 and the YZ transfer device 310 do not interfere with each other and they can operate at the same time. Also, due to the provision of two loader buffer portions 502 as in the present embodiment, it becomes possible to efficiently supply ICs to be tested to the test head 300 and operation rates of the test head 300 is raised. Note that the number of the loader buffer portions 502 is not limited to two, and may be suitably set based on a time required for aligning positions of ICs to be tested explained later on and a time required for testing the ICs.

Test Section 30

The test section 30 is a means for aligning a position of an IC to be tested and conducting a test by bringing input/output terminals HB of the IC to be tested electrically contact the contact pins 302 of the contact portion 301, and mainly comprises the YZ transfer device 310 and four alignment devices 320 (contact arm position correction means).

The test head 300 is composed of a set of four contact portions 301 in the present embodiment. The contact portions 301 are arranged so as to substantially match an arrangement of first contact arms $315a_1$ provided to the movable head portion 312 of the YZ transfer device 310. Furthermore, each of the contact portions 301 is provided with a plurality of contact pins 302 arranged so as to substantially match an arrangement of input/output terminals HB of an IC to be tested. Note that when a shape of an IC to be tested or an arrangement of input/output terminals HB is changed as a result a lot of ICs to be tested is changed, etc., the simultaneously measured amount, which is limited in the electronic device testing apparatus 1, can be optimized by changing the test head 300 to other test head 300 suitable to the ICs to be tested.

As shown in FIG. 2, in the test section 30, the base 12 of the handler 10 is formed openings 11, and ICs to be tested are pressed against the contact portion 301 of the test head 300 arranged on the back surface of the handler 10 through the openings 11.

The YZ transfer device 310 is a means to transfer ICs to be tested between the alignment device 320 and the test head 300, assists alignment of a position of an IC to be tested in the alignment device 320 and assists a test of the IC to be tested in the test head 300.

As shown in FIG. 2, in the present embodiment, two movable head portions 312 are provided to the YZ transfer device 310. Accordingly, while one movable head portion 312 is conducting a test, the other movable head portion 312 performs alignment of a position of an IC to be tested explained later on, so that operating rates of the test head 300 can be raised.

The two Y-axis direction rails 311 of the YZ transfer device 310 fixed on the base 12 of the handler 10 support two X-axis direction supporting members 311a so that they can slide in the Y-axis direction on the two Y-axis direction rails 311. Furthermore, an approximate center portion of each of the X-axis direction supporting members 311a supports a movable head portion 312 having an operation range including a later explained alignment device 320 and the test head 300. Note that the movable head portions 312 supported by the two X-axis direction supporting members 311a operating at the same time on a set of Y-axis direction rails 311 are controlled so that operations are not interfered from each other.

Each of the movable head portions 312 mainly comprises a Z-axis direction actuator 313 and four first contact arms $315a_1$ corresponding to an arrangement of the contact portion 301, wherein the four ICs to be tested held by the first contact arms $315a_1$ can move in the Y-axis direction and the Z-axis direction. Note that the four ICs to be tested are assumed that two first contact arms $315a_1$ positioned in the Y-axis positive direction are on the first row, two first contact arms $315a_1$ positioned in the Y-axis negative direction are on the second row, two first contact arms $315a_1$ positioned in the X-axis negative direction are on the first column, and two first contact arms $315a_1$ positioned in the X-axis positive direction are on the second column. Below, an explanation will be made by following this matrix of two rows by two columns (particularly the same in FIG. 13 to FIG. 21).

Figure 3:
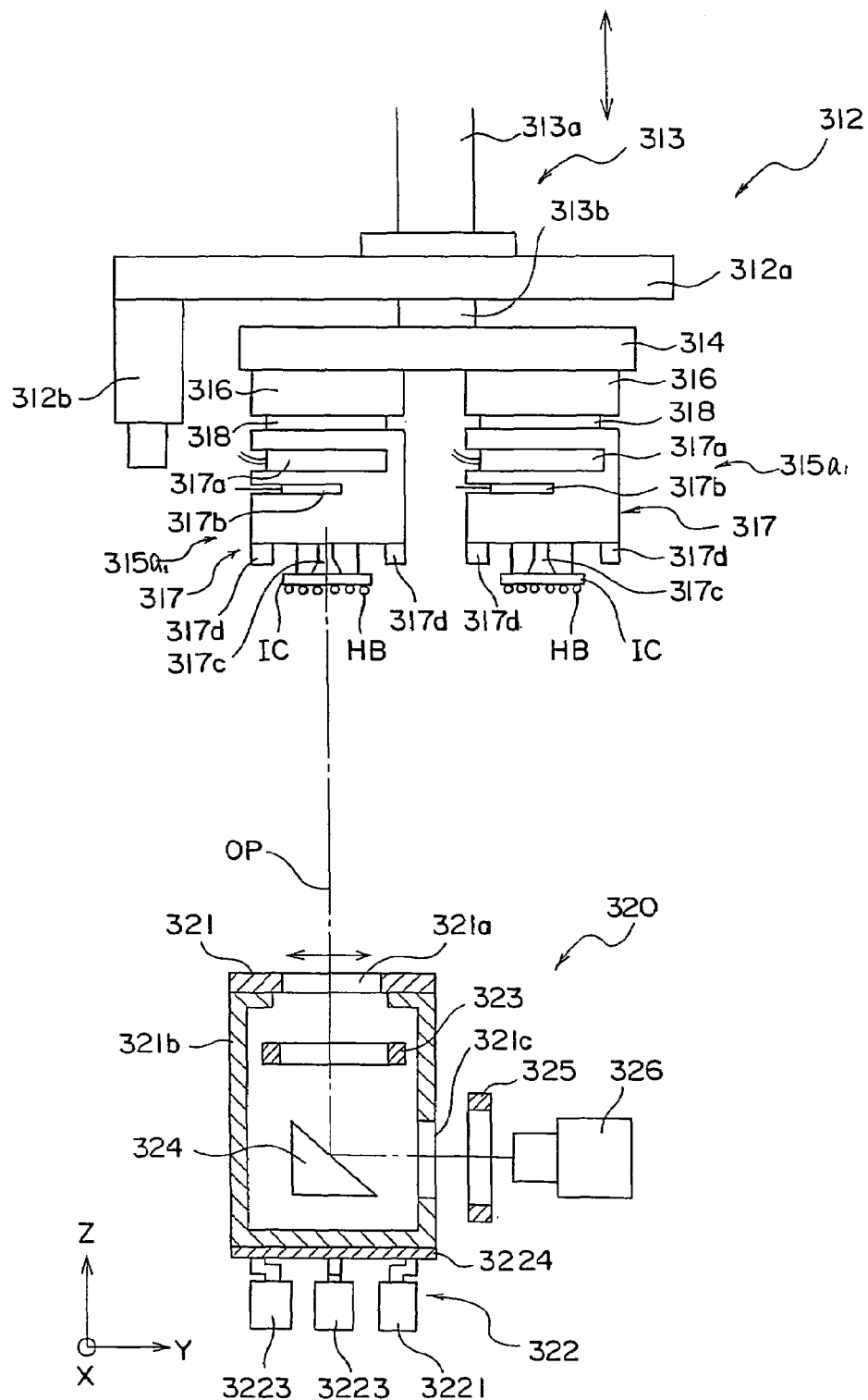
FIG. 3 is a schematic sectional view of a first contact arm of a YZ-transfer device and an alignment device in the first embodiment of the present invention.

As shown in FIG. 3, the movable head portion 312 comprises a camera supporting member 312a, a contact portion recognition CCD camera 312b (second image pickup means), one Z-axis direction actuator 313, one root portion 314 and four first contact arms $315a_1$. Furthermore, each of the first contact arms $315a_1$ comprises a holding side contact arm 317, a lock-and-free mechanism 318 and a root side contact arm 316 (fixing side contact arm).

An end of a body portion 313a of the Z-axis actuator 313 is fixed to the X-axis direction supporting member 311a and the anther end thereof supports the camera supporting member 312a. The camera supporting portion 312a is provided with the contact portion recognition CCD camera 312b at the end portion close to the test head 300, so that an optical axis becomes in the negative direction of the Z-axis. Note that it is not limited to the above providing method, and the contact portion recognition CCD camera 312b may be provided at the end portion close to the test head 300 of the root portion 314 supported at an end of a movable rod portion 313b of the Z-axis direction actuator 313. By making the contact portion recognition CCD camera 312b movable in the Z-axis direction by the Z-axis direction actuator 313, it becomes possible to change a focus of the CCD camera 312b and to adjust illuminance when the CCD camera 312b has a light.

Also, at an end of the movable rod portion 313b of the Z-axis actuator 313 is fixed the root portion 314, and the root portion 314 moves up and down in the Z-axis direction by being driven by the Z-axis actuator 313. The root portion 314 is fixed four root side contact arms 316 in the Z-axis negative direction at pitches corresponding to the four contact portions 301 of the test head 300, and a lower end surface of the each root side contact arm 316 is attached with the holding side contact arm 317 via the lock-and-free mechanism 318.

Each of the holding side contact arm 317 has a suction pad 317c for picking up an IC to be tested at the center of the bottom surface. Also, a heater 317a and a temperature sensor 317b are buried in the holding side contact arm 317. The applied thermal stress of a high temperature is maintained by the heater 317a, and a temperature of an IC to be tested is indirectly detected by detecting a temperature of the holding side contact arm 317 with the temperature sensor 317b and used for on/off controlling of the heater 317a.

Furthermore, a bottom surface end portion of the each holding side contact arm 317 is provided with a ring shaped contact member 317d having a shorter length than that of the suction pad 317c and protruding in the Z-axis negative direction, by which the holding side contact arm 317 is supported when applying a predetermined pressure to the alignment movable portion 321 by the movable head portion 312, so that the holding side contact arm 317 can follow a movement of the alignment movable portion 321 when the lock-and-free mechanism 318 is in the non-restricting state. Also, due to the ring shape of the contact member 317d, a contact area with the alignment movable portion 321 can be increased and a predetermined pressure is easily secured.

Figure 4:
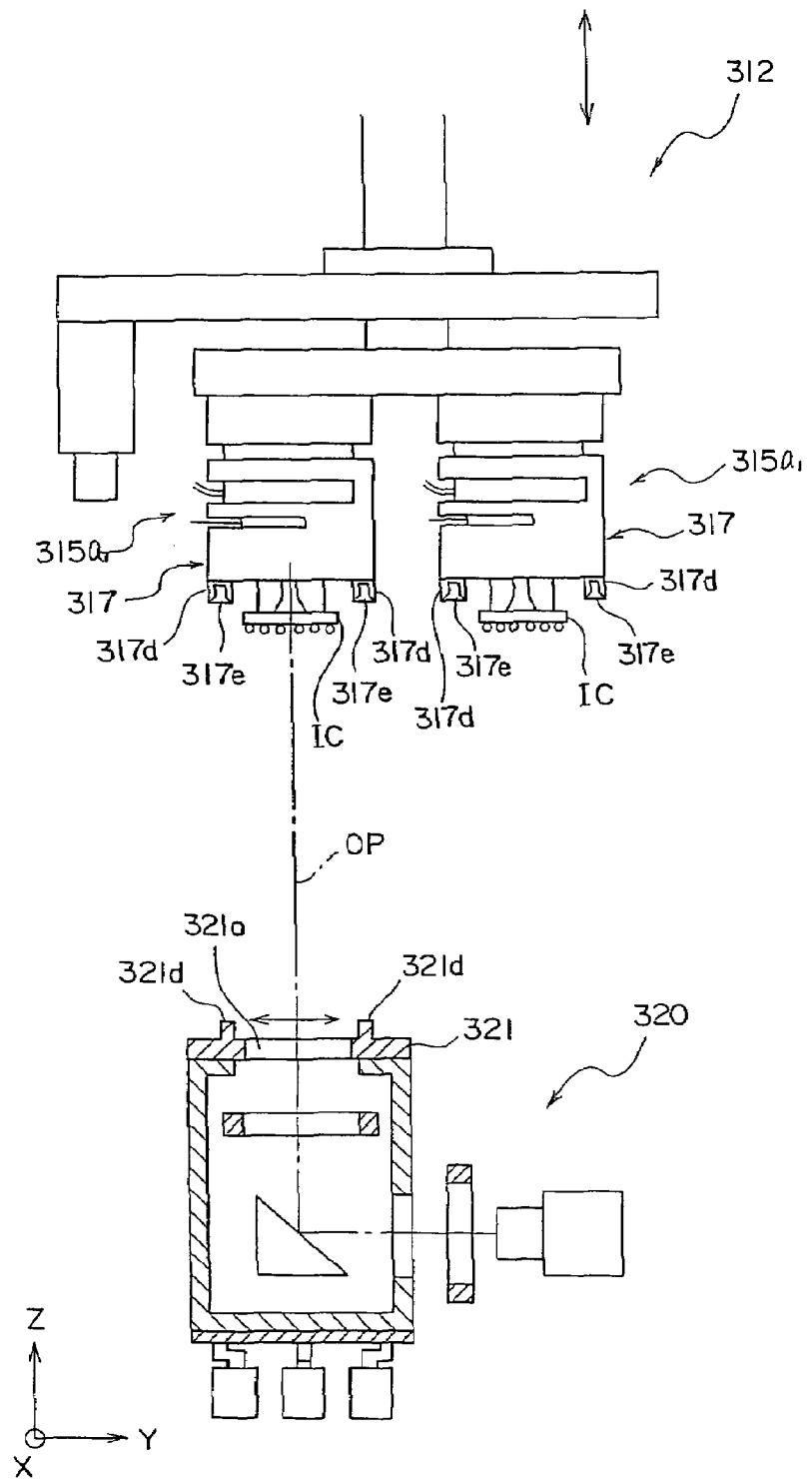
FIG. 4 is a schematic sectional view of a first contact arm of a YZ-transfer device and an alignment device in another example of the first embodiment of the present invention

Note that, for easier aligning, fixing and following of the holding side contact arm 317 to the alignment movable portion 321 at the time of aligning a position of an IC to be tested, the contact member 317d may be formed a concave portion 317e at its end portion and a convex portion 321d corresponding to the concave portion 317e around the first opening 321a of the alignment movable portion 321 as shown in FIG. 4 as another embodiment of the present invention, and alignment, fixing and following may be performed by fitting the concave portion 317e and the convex portion 321d. Alternately, for example, suction pads or magnetic may be provided at the end portion of the contact member 317d and around the first opening 321a of the alignment movable portion 321.

Figure 22A:
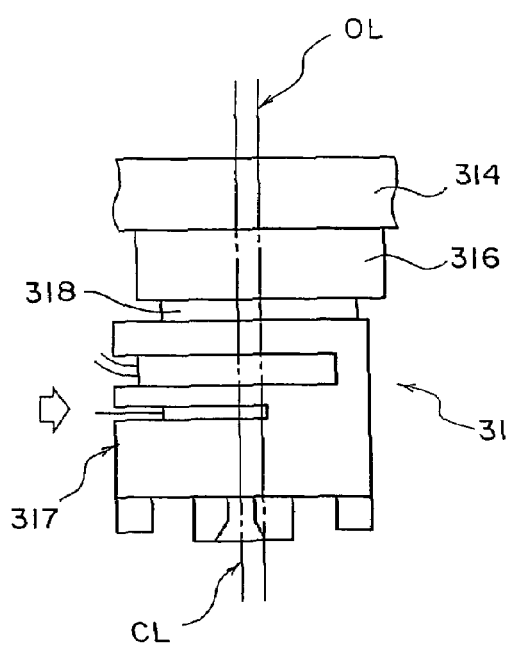
FIG. 22A and FIG. 22B are views of a centering operation of the first contact arm by the lock-and-free mechanism in the first embodiment of the present invention.
Figure 22B:
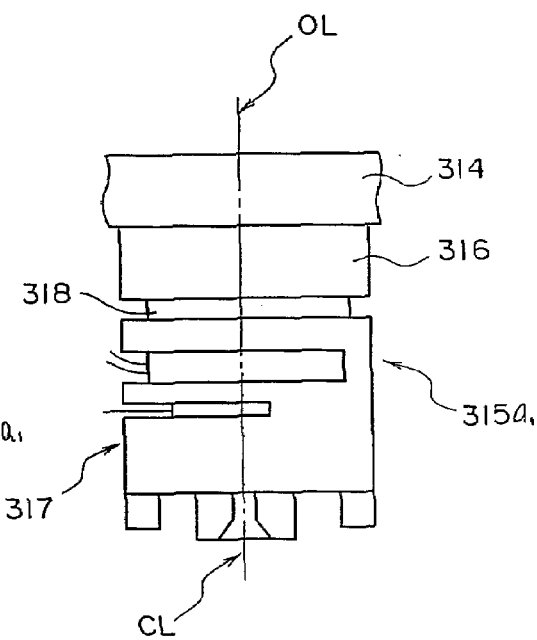

The lock-and-free mechanism 318 is a means for making the holding side contact arm 317 holding by suction an IC to be tested in a non-restricted state or in a restricted state for planar movements on a plane substantially in parallel with the contact portion with respect to the root side contact arm 316, that is, movements in the X-axis and Y-axis directions and θ rotation about the Z-axis. Furthermore, as shown in FIG. 22A and FIG. 22B, a centering function is provided for returning the holding side contact arm 317 in the X-axis and Y-axis directions and the θ rotation about the Z-axis, so that the center line CL of the holding side contact arm 317 substantially matches the center line OL of the root side contact arm 316 after releasing the IC to be tested.

Figure 5:
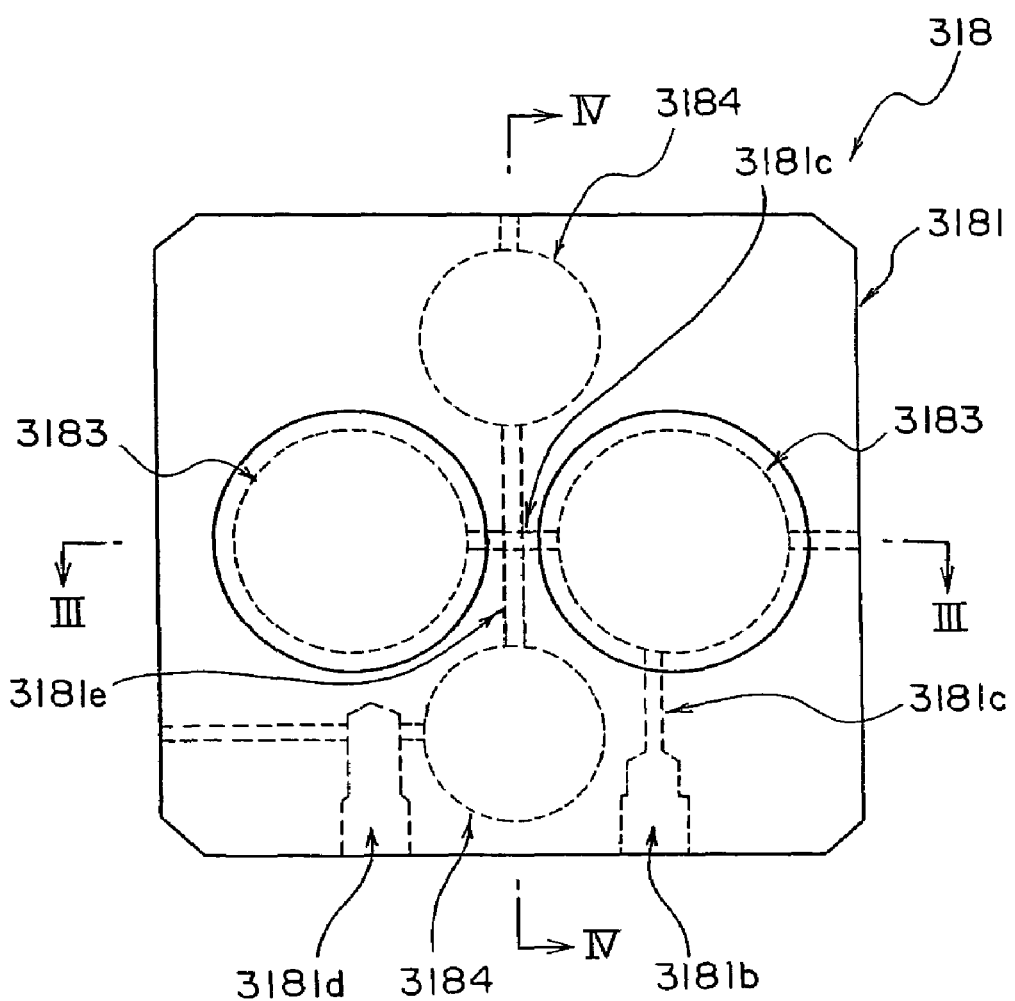
FIG. 5 is a plan view from above of a lock-and-free mechanism in the first embodiment of the present invention.
Figure 6:
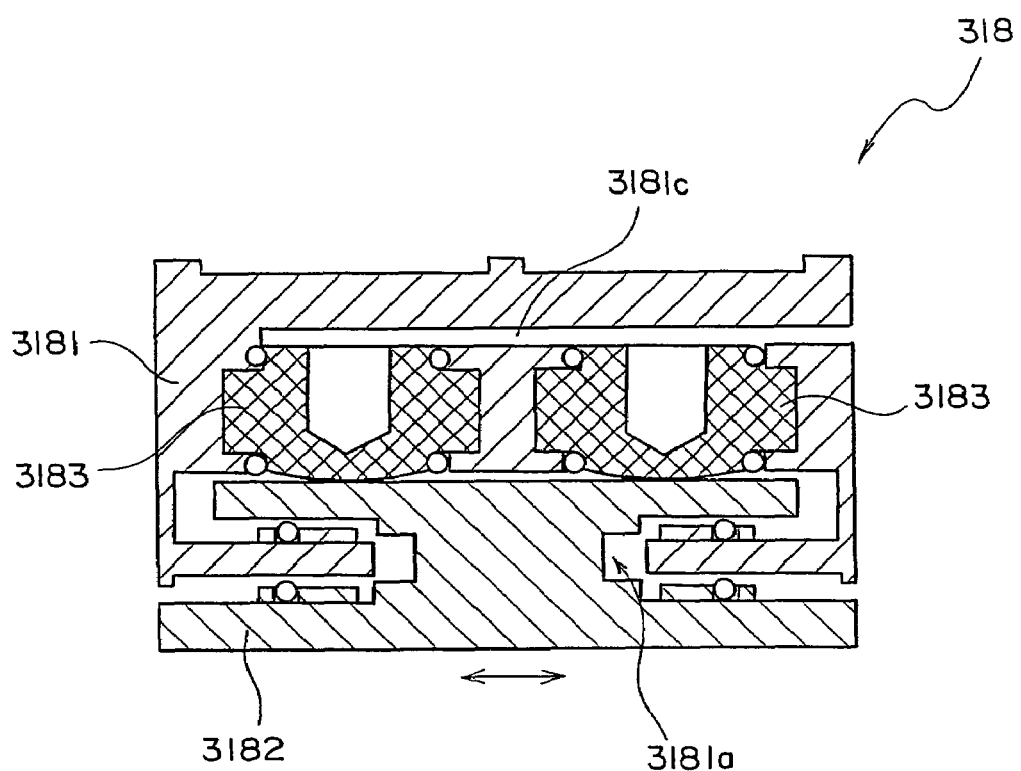
FIG. 6 is a sectional view along the line III-III in FIG. 5.
Figure 7:
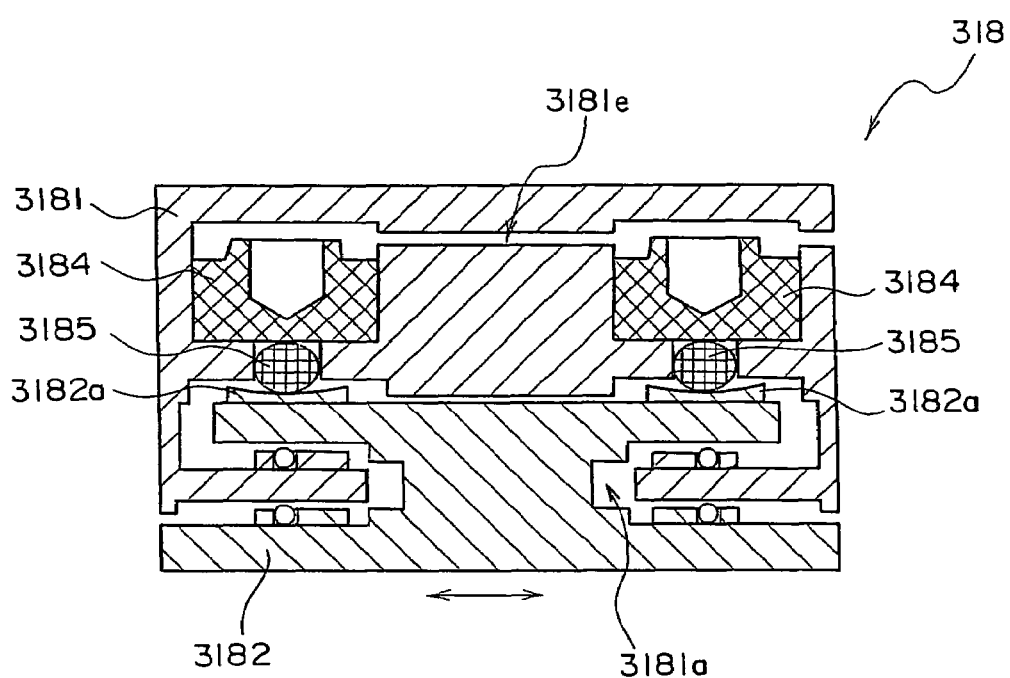
FIG. 7 is a sectional view along the line IV-IV in FIG. 5.

As shown in FIG. 5, FIG. 6 and FIG. 7, the lock-and-free mechanism 318 mainly comprises a lock-and-free fixing portion 3181, a lock-and-free movable portion 3182, restriction pistons 3183, centering pistons 3184 and centering balls 3185.

The lock-and-free fixing portion 3181 has an outer shape of an approximate square pole, wherein a hollow portion is formed inside of the lower portion to receive a part of the lock-and-free movable portion 3182. Also, circular openings 3181a are formed at the center portion of the lower surface of the lock-and-free fixing portion 3181 for holding the received lock-and-free movable portion 3182 so that it can move flatly.

Furthermore, inside the lock-and-free fixing portion 3181, a hollow portion is formed for being attached with two restriction pistons 3183, two centering pistons 3184 and two centering balls 3185. On one side surface of the lock-and-free fixing portion 3181 is formed a restriction air supply inlet 3181b for supplying an air to the restriction pistons 3183, and a restriction air path 3181c is formed from the restriction air supply inlet 3181b to the two restriction pistons 3183. Similarly, one side surface of the lock-and-free fixing portion 3181 is formed a centering air supply inlet 3181d for supplying an air to the centering pistons 3184, and a centering air path 3181e is formed from the centering air supply inlet 3181d to the two centering pistons 3184. Note that the restriction air path 3181c and the centering air path 3181e do not intersect with each other.

The lock-and-free movable portion 3182 has an approximately cylindrical shape constricted in the middle of its side surface, and an upper portion of the constricted portion fits in the hollow portion of inside of the lower portion of the lock-and-free fixing portion 3181 and the constricted portion positions at the openings 3181a. Thus, the lock-and-free movable portion 3182 is held by the lock-and-free fixing portion 3181, a movement of the lock-and-free movable portion 3182 in the Z-axis direction is suppressed and movement of the lock-and-free movable portion 3182 in the X-axis and Y-axis directions and in the θ rotation direction about the Z-axis are permitted.

Also, at the upper portion of the lock-and-free movable portion are formed two ball receiving portions 3182a having a concave arc shaped upper surface for supporting the centering ball 3185. The center of the concave arc shape of the ball receiving portion 3182a is made to match with the center line of the centering piston 3184 during a centering operation.

The restriction pistons 3183 are placed in the hollow portion formed inside the lock-and-free fixing portion 3181, and a lower surface of the restriction piston 3183 contacts an upper surface of the lock-and-free movable portion 3182.

Also, the centering pistons 3184 are placed in the hollow portion formed inside the lock-and-free fixing portion 3181, and their lower portions contact the centering balls 3185.

The centering ball 3185 has a substantially sphere shape, and its movements in the X-axis and Y-axis directions are restricted by the lock-and-free fixing portion 3181. An upper portion of the centering ball 3185 contacts the centering piston 3184, and the lower portion thereof contacts the ball receiving portion 3182a of the lock-and-free movable portion 3182.

When making the lock-and-free mechanism 318 to be non-restricting, supplying of an air to all pistons, that is, the two restriction pistons 3183 and the two centering pistons 3184 is stopped and the lock-and-free movable portion 3182 is made to be in a state being able to move flatly with respect to the lock-and-free fixing portion 3181.

When making the lock-and-free mechanism 318 to be restricting, an air is supplied to the two restriction pistons 3183, and the lock-and-free movable portion 3182 is fixed with respect to the lock-and-free fixing portion 3181. Note that an air is not supplied to the two centering pistons 3184.

When performing an centering operation on the lock-and-free mechanism 318, supplying of an air to the two restriction pistons 3183 is stopped to make the lock-and-free movable portion 3182 to be temporarily in a not restricting state, then, an air is supplied to the two centering pistons 3184 to press the centering balls 3185 to make them follow the concave arc shapes formed on the upper surfaces of the ball receiving portions 3182a and to move them to positions at the center of the concave arc shapes. Due to an operation of the two centering balls 3185, the lock-and-free movable portion 3182 is subjected to a centering operation so as to have the same center with the lock-and-free fixing portion 3181.

Note that the upper end surface of the lock-and-free fixing portion 3181 is attached to a lower end surface of the root side contact arm 316, and the lower end of the lock-and-free movable portion 3182 is attached to an upper end surface of the holding side contact arm 317.

By providing the lock-and-free mechanism 318 as explained above between the root side contact arm 316 and the holding side contact arm 317 for holding an IC to be tested, each of the holding side contact arms 317 does not need to comprise a driving portion for an alignment of a position of an IC to be tested, so that a weight of the movable head portion 312 of the YZ transfer device 310 can be reduced, movement at a high speed becomes possible, and the frequency of erroneous contact occurrence can be reduced.

The contact portion recognition CCD camera 312b is an image pickup means for taking an image of respective contact portions 301 of the test head 300 and used for recognizing positions and postures of the respective contact portions 301 when a lot of ICs to be tested is changed, etc.

An image taken by the CCD camera 312b is transmitted as image information to an image processing means 70. The image processing means 70 extracts positions of a plurality of contact pins 302 from the image information and a center position of the contact portions 301 and XY coordinate axes in the contact portions 301 are calculated from the extracted positions, consequently, positions and postures of the contact portions 301 in the image taken by the CCD camera 312b are calculated. Note that the calculation of the center position of the contact portions 301 and the XY coordinate axes is not limited to the extraction of the plurality of contact pins 302, and the calculation may be attained, for example, by providing simple type markers for alignment to the contact portions 301 and extracting the markers.

The alignment device 320 is a means for performing an alignment of a position of an IC to be tested by aligning a position of the holding side contact arm 317. In the present embodiment, as shown in FIG. 1, two alignment devices 320 is provided with respect to one movable head portion 312, and a total of two pairs, that is, four alignment devices 320 are provided to the handler 10. Accordingly, an alignment of positions of two ICs among four ICs to be tested held by one movable head portion 312 is performed at a time, so that four ICs to be tested are aligned by performing the alignment for two times. For example, while a test is conducted by one movable head portion 312 of the YZ transfer device 310, a pair of alignment devices 320 performs the alignment on two ICs arranged at the second row on the first column and at the second row on the second column with the other movable head portion 312 and then performs the alignment of positions of two ICs arranged at the first row on the first column and at the first row on the second column, aligned ICs to be tested are effectively supplied to the test head 300 and operating rates of the test head 300 can be raised thereby. Note that the number of the alignment devices 320 is not limited to the number above and may be suitably set based on a time required for aligning ICs to be tested and a time required for testing the ICs.

The alignment device 320 mainly comprises, as shown in FIG. 3, an alignment movable portion 321, an alignment movable portion driving device 322, an IC side light 323, an alignment reflection mirror 324 (reflection means), a CCD camera side light 325 and an alignment CCD camera 326 (first image pickup means).

The alignment CCD camera 326 and the alignment reflection mirror 324 are arranged so that an optical axis OP of the alignment CCD camera 326 (hereinafter, also simply referred to as an optical axis OP) reflects on the alignment reflection mirror 324 to be in the Z-axis positive direction. By providing the alignment reflection mirror 324 on the optical axis OP of the alignment CCD camera 326, the alignment CCD camera 326 can be arranged sideways with respect to the XZ plane, and a height of the handler 10 itself can be suppressed low.

Also, to secure sufficient brightness to visually recognize input/output terminals HB of an IC to be tested, a ring shaped IC side light 323 and a ring shaped CCD camera side light 325 are arranged so as not to interfere with a path of the optical axis OP and to secure a visible range, so that at least all of the input/output terminals HB of the IC to be tested are visible from the alignment CCD camera 326.

Note that calibration of the above contact portion recognition CCD camera 312b and the alignment CCD camera 326 is performed at the time of producing the handler 10.

A specific method of the calibration is, for example, to place a translucent calibration gauge in a shape of an IC to be tested, on which XY coordinate axes are drawn, on an alignment device 320 in a range visible from the alignment CCD camera 326 and to take an image thereof by the alignment CCD camera 326 to read the XY coordinate axes drawn on the calibration gauge and the center position. Next, the contact portion recognition CCD camera 312b is placed above the gauge and an image thereof is taken to read the XY coordinate axes drawn on the gauge and the center position. The XY coordinate axes of the calibration gauge is used as a reference X-Y coordinate system for the two CCD cameras 326 and 312b.

Furthermore, an alignment movable portion 321 having a first opening 321a is provided above the IC side light 323. The first opening 321a provided on the alignment movable portion 321 has a size sufficiently large for an IC to be tested to pass through but it is not large enough so that a contact members 317d provided at the bottom end portion of a holding side contact arm 317 of the movable head portion 312 explained above cannot pass through it. The alignment movable portion 321 is arranged so that the first opening 321a does not interfere with a path of the optical axis OP and to secure a visible range for the alignment CCD camera 326 to visually recognize at least all input/output terminals HB of an IC to be tested.

The alignment movable portion 321 is connected to a movable plane 3224 of an alignment movable portion driving device 322 explained later on via an alignment movable portion supporting member 321b, and able to move in the X-axis and Y-axis directions and rotate in the θ rotation direction about the Z-axis. The alignment movable portion supporting member 321b is provided with a second opening 321c so as not to interfere with a path of the optical axis OP and to secure a visible range for the alignment CCD camera 326 to visually recognize at least all input/output terminals HB of an IC to be tested.

Note that the IC side light 323, the alignment reflection mirror 324, the CCD camera side light 325 and the alignment CCD camera 326 are supported separately and independently from the alignment movable portion 321, the movable portion supporting member 321b and the alignment movable portion driving device 322 so as not to be moved by driving by the alignment movable portion driving device 322.

The holding side contact arm 317 holding an IC to be tested can perform an alignment in the X-axis and Y-axis directions and in the θ rotation direction about the Z-axis by following a driving operation by the alignment movable portion driving device 322 in a state where the lock-and-free mechanism 318 is in a non-restricting state and in a state of being applied with a predetermined pressure to the alignment movable portion 321 by the Z-axis actuator 313 of the movable head portion 312.

Figure 8:
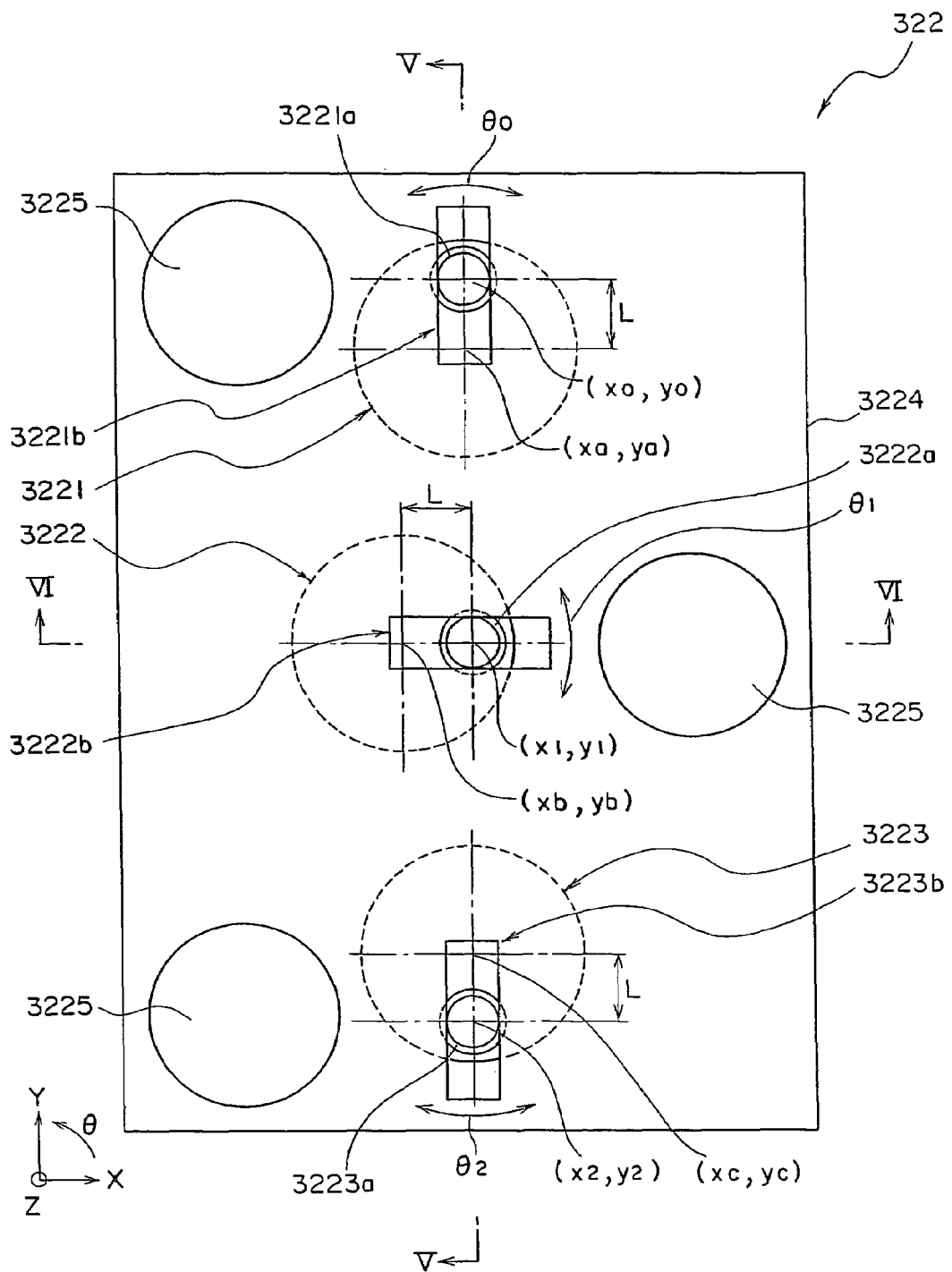
FIG. 8 is a plan view from above of an alignment movable portion driving device in the first embodiment of the present invention.

As shown in FIG. 8, the alignment movable portion driving device 322 (driving means) is a means for moving the alignment movable portion 321 in the X-axis and Y-axis directions on the XY plane and in the θ rotation direction about the Z-axis, and mainly comprises three driving motors 3221, 3222 and 3223, a movable plane 3224, movable plane supporting members 3225 and a foundation 3226.

The three driving motors 3221, 3222 and 3223 are provided on the foundation 3226, the first driving motor 3221 has a first eccentric shaft 3221a, and an eccentric side center $(x_0, y_0)$ of the first eccentric shaft 3221a positions away by a distance L from the center of a driving shaft $(x_a, y_a)$ of the first driving motor 3221. Similarly, the second driving motor 3222 has a second eccentric shaft 3222a, and an eccentric side center $(x_1, y_1)$ of the second eccentric shaft 3222a positions away by a distance L from the center of a driving shaft $(x_b, y_b)$ of the second driving motor 3222. Also, the third driving motor 3223 has a third eccentric shaft 3223a, and an eccentric side center $(x_2, y_2)$ of the third eccentric shaft 3223a positions away by a distance L from the center of a drive shaft ($x_c$, $y_c$) of the third driving motor 3223.

The movable plane 3224 is, for example, a rectangular plane, and a rectangular second opening 3222b having long sides in the X-axis direction is provided at the center. Furthermore, a rectangular first opening 3221b having long sides in the Y-axis direction is provided at one end portion of a Y-axis center line of the movable plane 3224. Also, a rectangular third opening 3223b having long sides in the Y-axis direction is provided at the other end portion of the Y-axis center line of the movable plane 3224.

Figure 9:
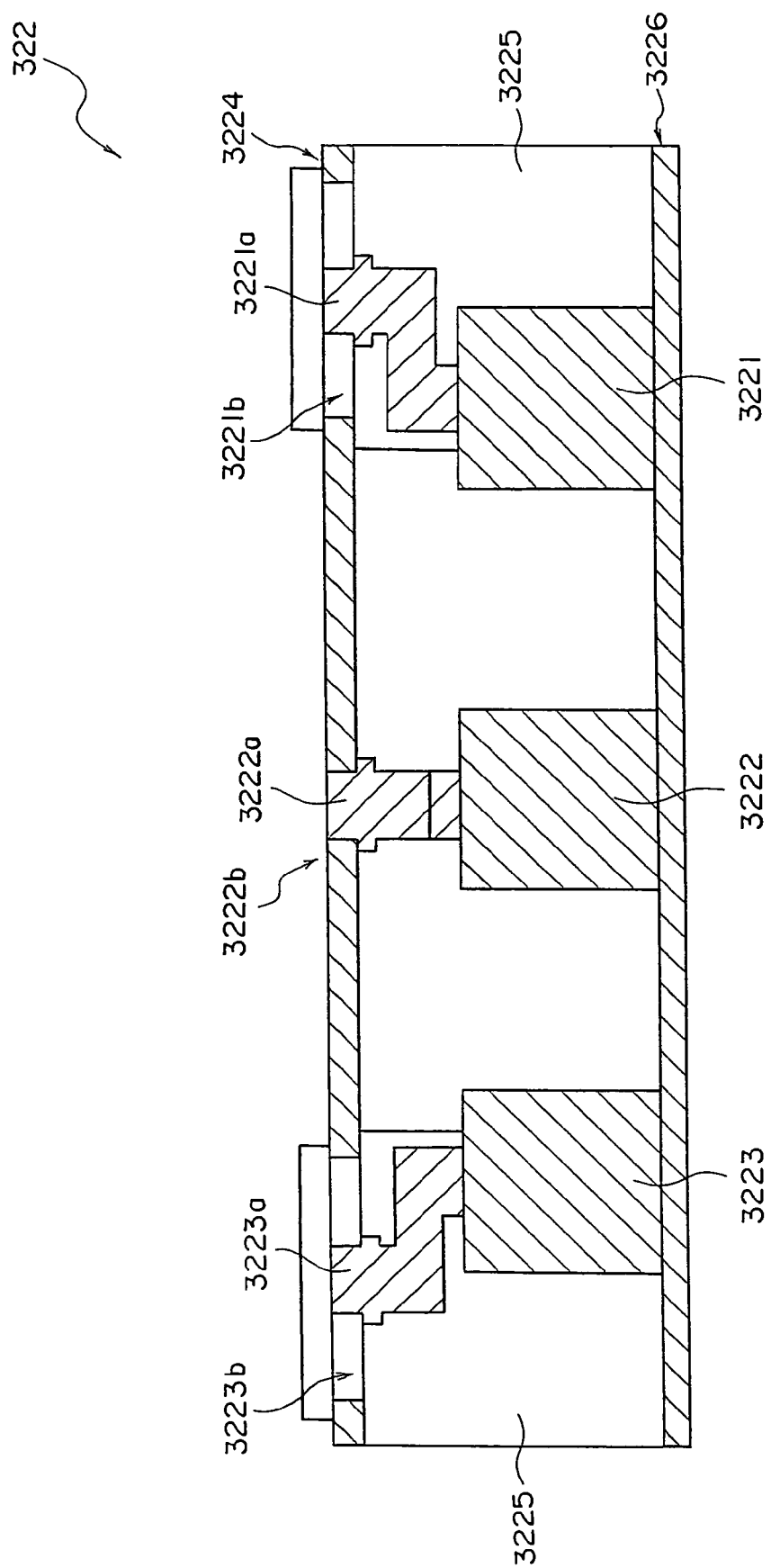
FIG. 9 is a sectional view along the line V-V in FIG. 8.

As is known from FIG. 9, the first eccentric shaft 3221a of the first driving motor 3221 is inserted to the center of the first opening 3221b in a movable and rotatable way. Similarly, the second eccentric shaft 3222a of the second driving motor 3222 is inserted to the center of the second opening 3222b in a movable and rotatable way, and the third eccentric shaft 3223a of the third driving motor 3223 is inserted to the center of the third opening 3223b in a movable and rotatable way. As a result that the three eccentric shafts 3221a, 3222a and 3223a are inserted in a movable and rotatable way, the movable plane 3224 can move on the X-Y plane.

Figure 10:
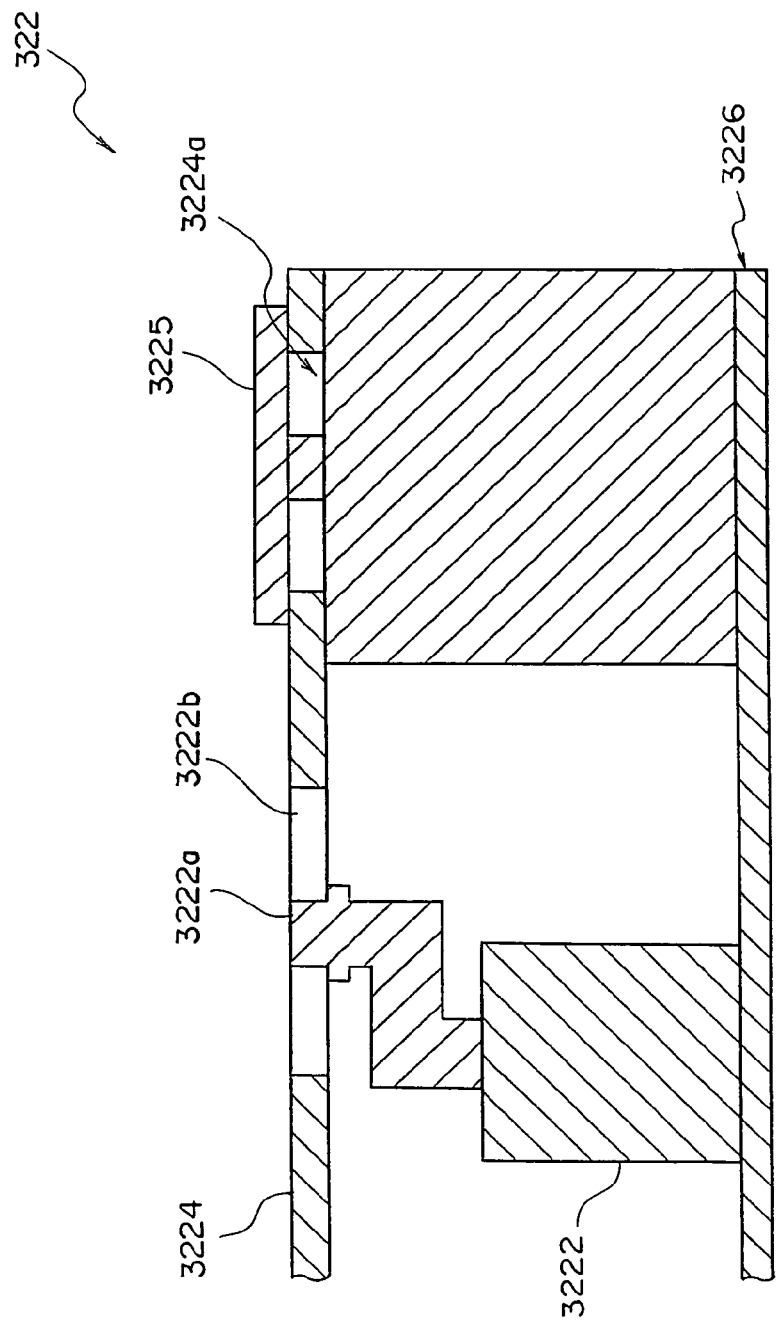
FIG. 10 is a sectional view of a key portion along the line VI-VI in FIG. 8.

Furthermore, to support the movable plane 3224 in an X-Y-θ movement, three movable plane supporting members 3225 are provided at positions on the foundation 3226 as shown in FIG. 8. As shown in FIG. 10, supporting openings 3224a having a smaller circumference than an outer circumference of the movable plane supporting member 3225 are provided at positions arranged with each of the movable plane supporting members 3225 of the movable plane 3224, and configured that the constricted portion of the movable plane supporting member 3225 positions at the supporting openings 3224a. As a result, it is possible to stably support the movable plane 3224 which moves and rotates by being driven by the driving motors 3221, 3222 and 3223.

In FIG. 8, when moving the movable plane 3224 of the alignment movable portion driving device 322 in the X-axis positive direction, the first driving motor 3221 is driven to rotate in the −θ direction, the third driving motor 3223 is driven to rotate in the +θ direction, and the second driving motor 3222 is not driven. Also, when moving the movable plane 3224 in the X-axis negative direction, the first driving motor 3221 is driven to rotate in the +θ direction, the third driving motor 3223 is driven to rotate in the −θ direction, and the second driving motor 3222 is not driven.

In FIG. 8, when moving the movable plane 3224 of the alignment movable portion driving device 322, the first driving motor 3221 and the third driving motor 3223 are not driven and only the second driving motor 3222 is driven to rotate in the +θ direction. Also, when moving the movable plane 3224 in the Y-axis negative direction, the first driving motor 3221 and the third driving motor 3223 are not driven and only the second driving motor 3222 is driven to rotate in the −θ direction.

In FIG. 8, when rotating the movable plane 3224 of the alignment movable portion driving device 322 in the +θ direction about the second eccentric shaft 3222a, the first driving motor 3221 is driven to rotate in the +θ direction, the third driving motor 3223 is driven to rotate in the +θ direction, and the second driving motor 3222 is not driven. Also, when rotating the movable plane 3224 in the −θ direction about the second eccentric shaft 3222a, the first driving motor 3221 is driven to rotate in the −θ direction, the third driving motor 3223 is driven to rotate in the −θ direction, and the second driving motor 3222 is not driven.

Note that, by driving to rotate the first driving motor 3221, the second driving motor 3222 and the third driving motor 3223 based on $\theta_0$, $\theta_1$ and $\theta_2$ calculated from the formulas below, the movable plane 3224 can be moved to a targeted position x, y and to rotate to a targeted posture θ. Note that the center of the rotation for the targeted posture θ is the center ($x_1$, $y_1$) of the second eccentric shaft 3222a.

In the case θ=0, the first driving motor 3221 drives to rotate based on $$\theta_0 = \tan^{-1}\left(\frac{-x/L}{\sqrt{1-(x/L)^2}}\right)$$

the second driving motor 3222 drives to rotate based on $$\theta_1 = \tan^{-1}\left(\frac{y/L}{\sqrt{1-(y/L)^2}}\right)$$

and the third driving motor 3223 drives to rotate based on $$\theta_2 = \tan^{-1}\left(\frac{x/L}{\sqrt{1-(x/L)^2}}\right)$$

Also, when θ>0, the first driving motor 3221 drives to rotate based on $$\theta_0 = \tan^{-1}\left(\frac{a}{\sqrt{1-a^2}}\right) - \theta$$

the second driving motor 3222 drives to rotate based on $$\theta_1 = \tan^{-1}\left(\frac{\sqrt{1-b^2}}{b}\right) + \pi/2 - \theta$$

and the third driving motor 3223 drives to rotate based on $$\theta_2 = -\tan^{-1}\left(\frac{\sqrt{1-c^2}}{c}\right) - \pi/2 - \theta$$

Also, when θ<0, the first driving motor 3221 drives to rotate based on $$\theta_0 = \tan^{-1}\left(\frac{a}{\sqrt{1-a^2}}\right) - \theta$$

the second driving motor 3222 drives to rotate based on $$\theta_1 = \tan^{-1}\left(\frac{\sqrt{1-b^2}}{b}\right) + \pi/2 - \theta$$

and the third driving motor 3223 drives to rotate based on $$\theta_2 = -\tan^{-1}\left(\frac{\sqrt{1-c^2}}{c}\right) - \pi/2 - \theta$$

Note that "a", "b" and "c" and "n" in the above formulas are $$a = \frac{x_a - x + n \cdot y - n \cdot y_a}{L \cdot \sqrt{n^2 + 1}}$$

$$b = \frac{y_b - y - n \cdot x - n \cdot x_b}{L \cdot \sqrt{n^2 + 1}}$$

$$c = \frac{-x_c + x - n \cdot y + n \cdot y_c}{L \cdot \sqrt{n^2 + 1}}$$

$$n = \tan\theta$$

Also, for example, in FIG. 8, in the case where centers of the driving shafts of the three driving motors 3221, 3222 and 3223 are (xa, ya)=(0, 50), (xb, yb)=(−10, 0) and (xc, yc)=(0, −50), in order to change the center of the rotation θ of the movable plane 3224 from the second eccentric shaft (x1, y1)=(0, 0) to (10, 10), the X-Y-θ movement when the rotation center of the movable plane 3224 is (10, 10) becomes possible by substituting (xa, ya)=(−10, 40), (xb, yb)=(−20, −10) and (xc, yc)=(−10, −60) in the above formulas.

By using the above movable portion driving device 322, a position of the holding side contact arm 317 for holding an IC to be tested can be moved and an alignment of a position of the IC to be tested can be attained.

The foundation 3226 for supporting the three driving motors 3221, 3222 and 3223 of the alignment movable portion driving device 322 is fixed to the base 12 side of the handler 10. Also, the movable plane 3224 is connected to the alignment movable portion 321 via the alignment movable portion supporting member 321b and arranged so that the center of the central axis of the second driving shaft 2222a and the optical axis OP of the alignment CCD camera are matched in an initial state as shown in FIG. 8.

Note that the first driving portion, second driving portion and the third driving portion referred to in claims are functional expressions respectively corresponding to the X-axis direction operation, Y-axis direction operation and the θ rotation operation about the Z-axis of the above movable plane 3224, and not corresponding to the first driving motor 3221, the second driving motor 3222 and the third driving motor 3223.

Figure 11:
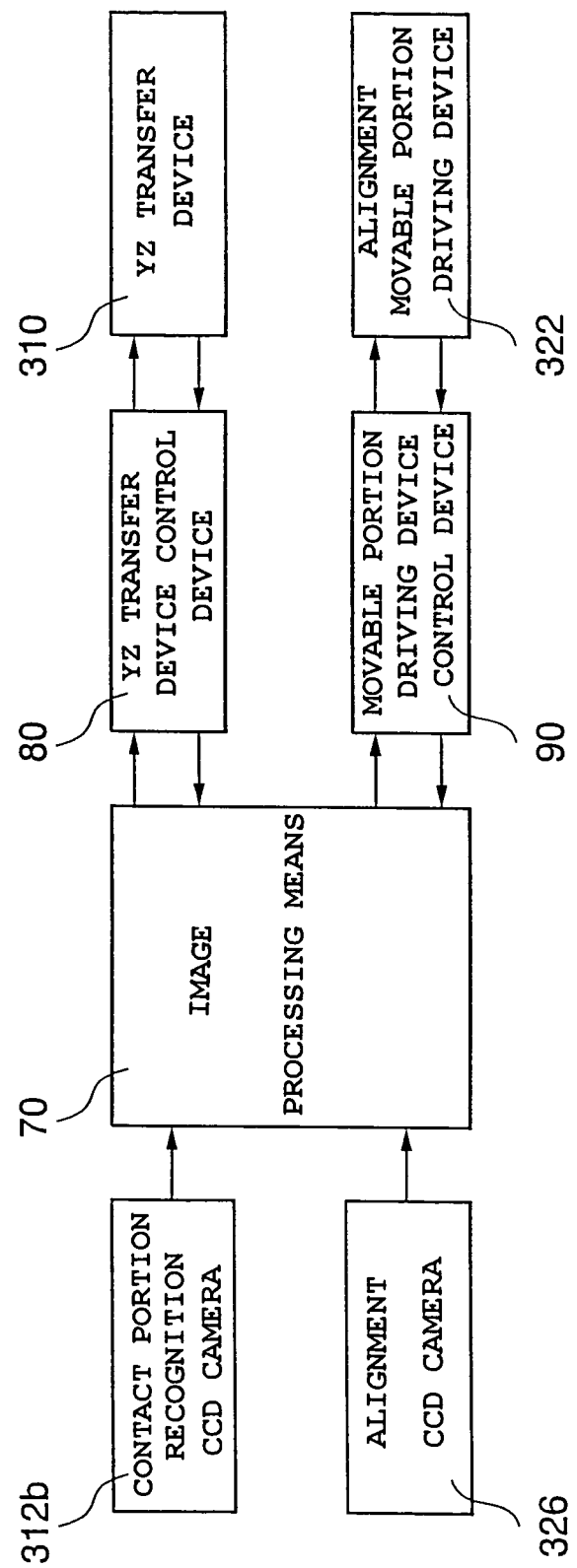
FIG. 11 is a block diagram of an image processing means and around it for an alignment of an IC to be tested in the first embodiment of the present invention.

Next, a block diagram of a system for an alignment of an IC to be tested by the alignment CCD camera 326 shown in FIG. 11 will be explained.

The system mainly comprises a contact portion recognition CCD camera 312b, an alignment CCD camera 326, an image processing device 70, a YZ transfer device control device 80 for controlling a YZ transfer device 310 and a movable portion driving device control device 90 for controlling the alignment movable portion driving device 322.

The contact portion recognition CCD camera 312b and the alignment CCD camera 326 are connected so as to transmit taken image information to the image processing device 70.

The image processing device 70 is a means to perform image processing on image information taken by the contact portion recognition CCD camera 312b and the alignment CCD camera 326, recognize positions and postures of the contact portion 301 and an IC to be tested in the image, and calculate an alignment amount of the IC to be tested.

When a lot of ICs to be tested is changed, etc., the image processing device 70 performs image processing on the image information taken and transmitted by the contact portion recognition CCD camera 312b to extract positions of a plurality of contact pins of the respective contact portions 301 and calculates the center position of the contact portions 301 and the XY coordinate axes in the contact portions 301 from the extracted positions, so that positions and postures of the contact portions 301 on the image taken by the CCD camera 312b is calculated. As a result, changes of positions of the contact portions 301 caused by changing the test head 300, etc. can be recognized.

Furthermore, the image processing device 70 performs image processing on the image information received from the alignment CCD camera 326 and recognizes a position and a posture of an IC to be tested on the image. Then, an amount of alignment of the X-axis and Y-axis directions and the θ rotation about the Z-axis required for the IC to be tested is calculated, so that the position and posture of the IC to be tested in the image matches the position and posture of the recognized contact portion 301. Note that the coordinates in the image taken by the contact portion recognition CCD camera 312b and the alignment CCD camera 326 is made to be correspondent by calibration between the CCD cameras 312b and 326 as explained above.

Furthermore, the image processing device 70 is connected to the YZ transfer control device 80 and the movable portion driving device control device 90 so for enabling to transmit and receive, and the calculated alignment amount is transmitted to the connected movable portion driving device control device 90. The movable portion driving device control device 90 controls respective actuators of the alignment movable portion driving device 322 based on the transmitted alignment amount and alignment of a position of the IC to be tested is attained.

Unloader Section 60

The unloader section 60 is a means to take out post-test ICs from the test section 30 to the IC magazine 40 and mainly comprises a second XYZ transfer device 601 and two unloader buffer portions 602 (two in the X-axis positive direction in FIG. 1).

The unloader buffer portion 602 is a means to move ICs to be tested back and forth between the operation range of the YZ transfer device 310 and the operation range of the second XYZ transfer device 601 and mainly comprises a movable portion 602a and an X-axis direction actuator 602b. The movable portion 602a is supported at an end portion of the X-axis direction actuator 602b fixed to the base 12 of the handler 10, and an upper surface of the movable portion 602a is formed four concave portions 602c to which ICs to be tested are dropped.

The YZ transfer device 310 drops post-test ICs to the concave portions 602c on the movable portion 602a of the unloader buffer portion 602 positioned in the operation range of the YZ transfer device 310, and the unloader buffer portion 602 moves the movable portion 602a into the operation range of the second XYZ transfer device 601 by contracting the X-axis direction actuator 602b. Note that the surface of the movable portion 602a may be not provided with the concave portions 602c and may be a flat surface provided with suction heads facing vertically upward. When providing the suction pads on the surface of the movable portion 602a, post-test ICs are put on the suction pads by the YZ transfer device 310, the suction pads suck the ICs, the movable portion 602a contracts the X-axis direction actuator 602b, the suction heads releases the ICs after completing a transfer into the operation range of the second XYZ transfer device 601, and the second XYZ transfer device 601 holds the post-test ICs.

As explained above, by providing the unloader buffer portion 602, the second XYZ transfer device 601 and the YZ transfer device 310 can operate at the same time without interfering with each other. Also, by providing two unloader buffer portions 602, ICs to be tested can be sufficiently supplied to the test head 300 and operating rates of the test head 300 is raised. Note that the number of the unloader buffer portions 602 is not limited to two and may be suitably set based on a time required for aligning ICs to be tested explained later on and a time required for testing the IC.

The second XYZ transfer device 601 is a means for transferring ICs to be tested on the unloader buffer 602 to a classification tray of the classification tray stocker 402, mainly comprises Y-axis direction rails 601a, an X-axis direction rail 601b, a movable head portion 601c and suction pads 601d, and has an operation range including the two unloader buffer portions 602 and the classification tray stocker 402.

As shown in FIG. 1, the two Y-axis direction rails 601a of the second XYZ transfer device 601 are fixed to the base 12 of the handler 10, and the X-axis direction rail 601b is supported between them so as to be able to slide in the Y-axis direction. The X-axis direction rail 601b supports the movable head portion 601c provided with a Z-axis direction actuator (not shown) so that it can slide in the X-axis direction. Furthermore, the movable head portion 601c has four suction pads 601d at its lower end portion, and the four suction pads 601d are moved up and down in the Z-axis direction by driving the provided Z-axis direction actuator.

The second XYZ transfer device 601 places the four suction pads 601d on ICs put on the unloader buffer portion 602, picks up four ICs to be tested at a time, moves to a classification tray of the classification stocker 402 and releases the ICs to be tested on the classification tray after locating.

Next, an operation will be explained.

A test of an IC to be tested by the electronic device testing apparatus 1 will be explained below with reference to FIG. 1, and FIG. 12 to FIG. 24.

Figure 12:
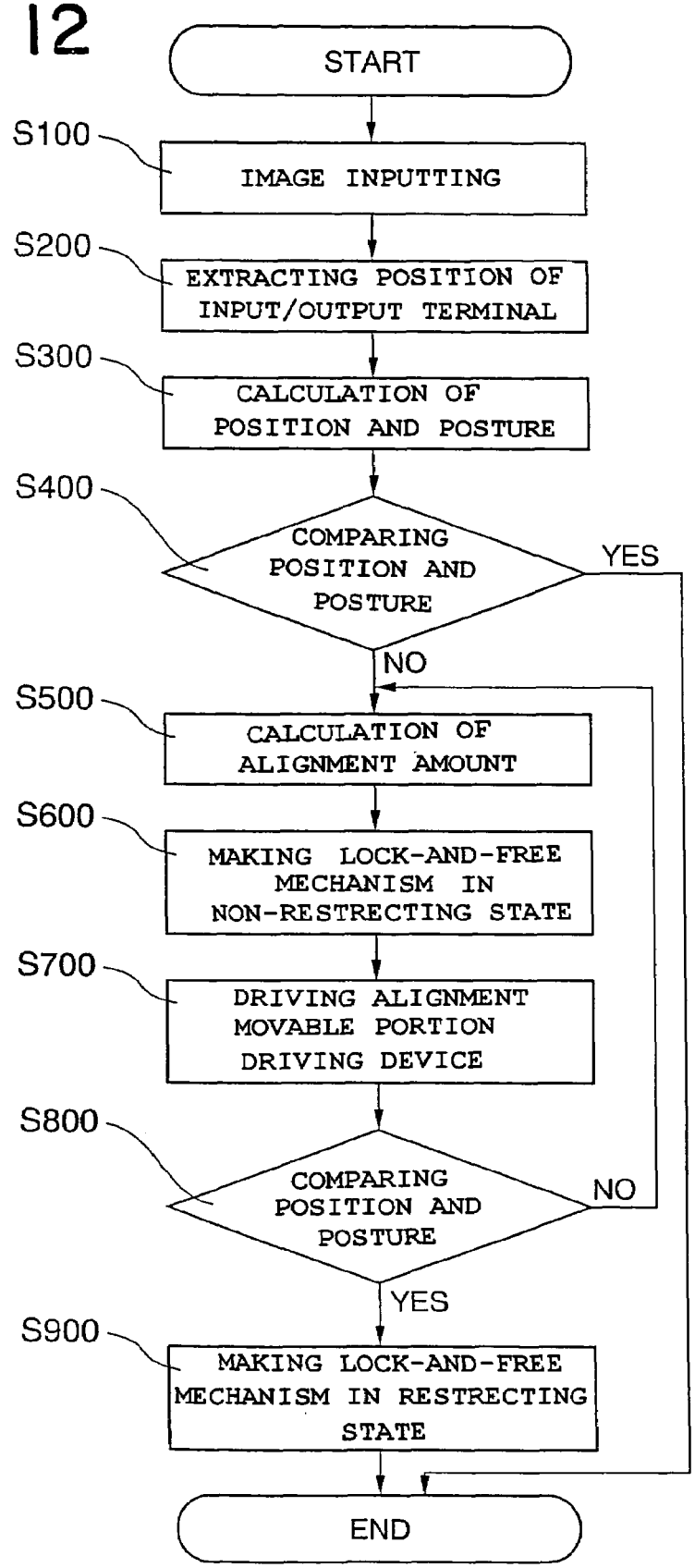
FIG. 12 is a flowchart of alignment processing of a position of an IC to be tested in the first embodiment of the present invention.
Figure 23:
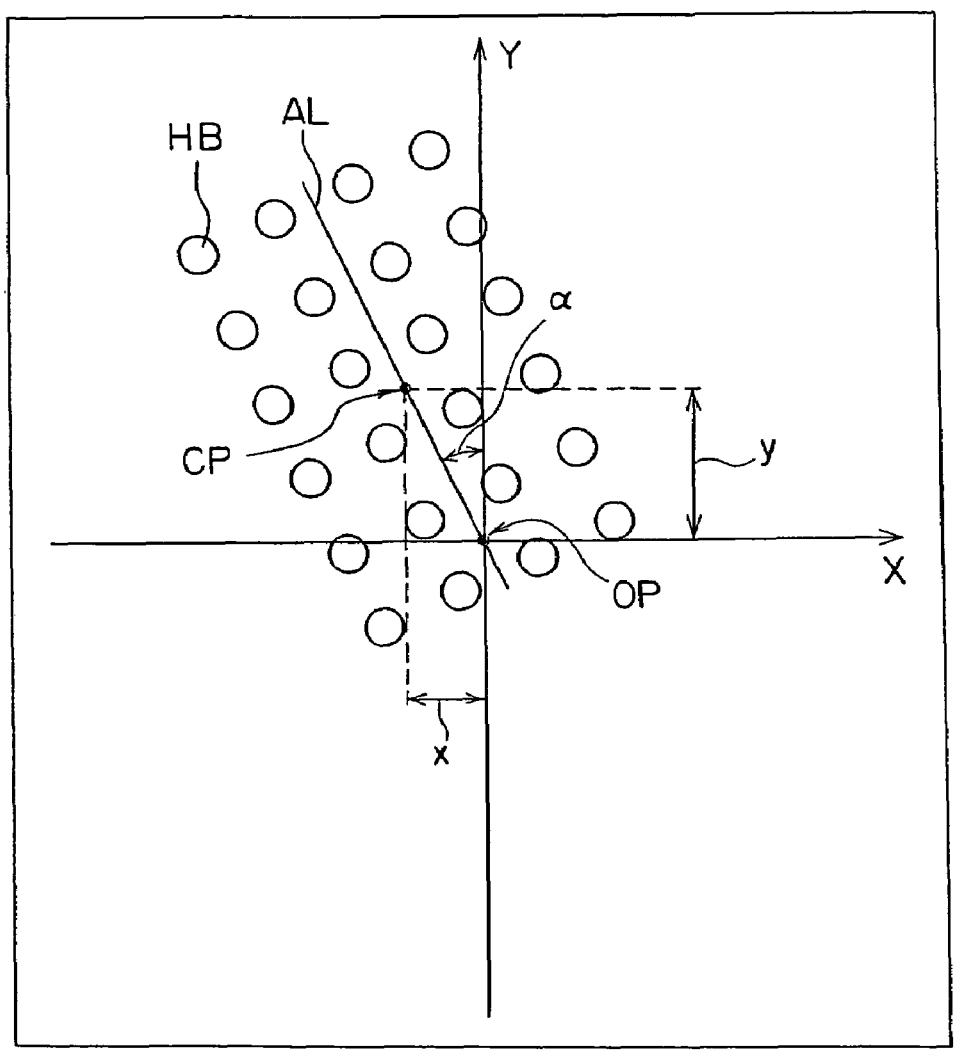
FIG. 23 is a view of an example of an image of a position of an IC to be tested before alignment by the alignment device in the first embodiment of the present invention.
Figure 24:
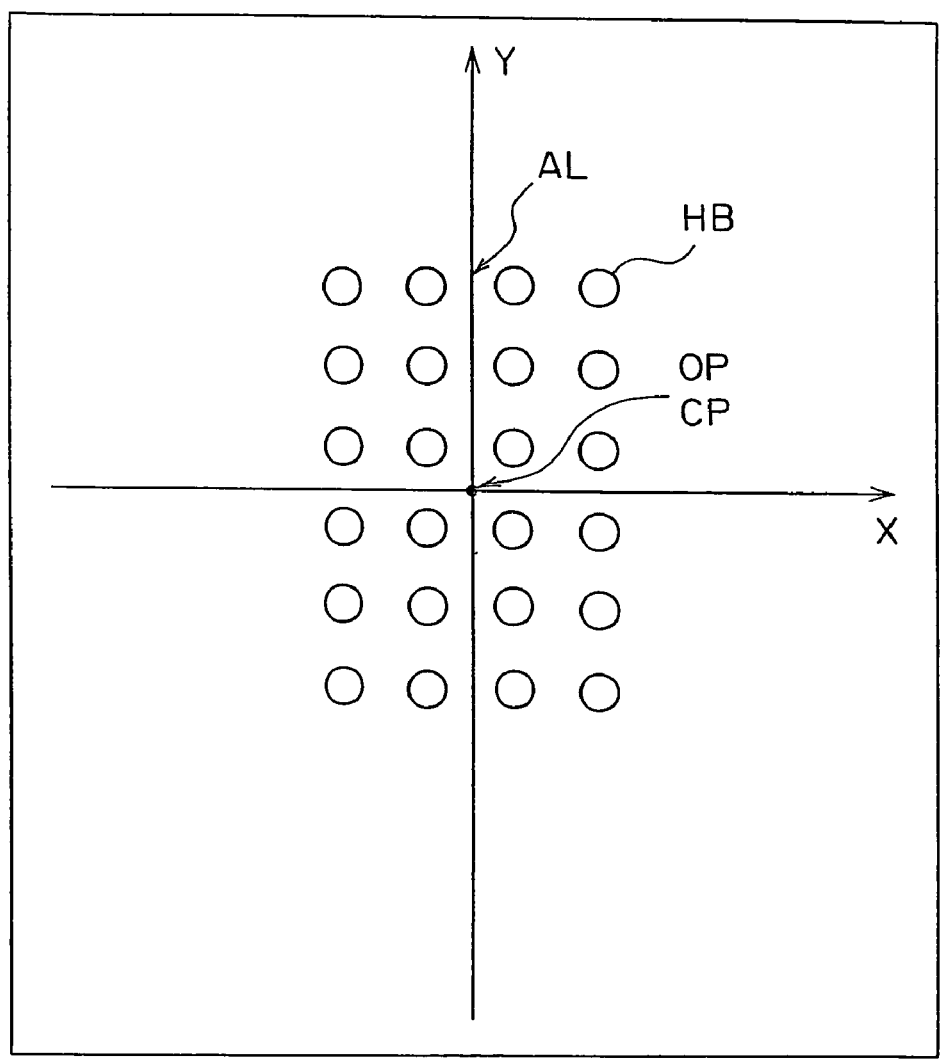
FIG. 24 is a view of an example of an image of a position of an IC to be tested after alignment by the alignment device in the first embodiment of the present invention.

FIG. 12 is a flowchart of alignment processing of a position of an IC to be tested in the first embodiment of the present invention. Also, FIG. 13 to FIG. 21 are schematic sectional views of an operation of the alignment of the position of the IC to be tested in the first embodiment of the present invention, also FIG. 22A and FIG. 22B are views of a centering operation of the holding side contact arm 317 by the lock-and-free mechanism 318. Furthermore, FIG. 23 and FIG. 24 are views of images of an alignment of the position of the IC to be tested by the alignment device 320, wherein FIG. 23 is an image before the alignment and IFG. 24 is an image after the alignment. Note that FIG. 13 to FIG. 21 are schematic sectional views, wherein a viewpoint is set so that the X-axis is on the positive side with respect to the test portion 30, seen facing to the negative direction on the X-axis. The movable head portion 312 shown in FIG. 13 to FIG. 21 indicates the movable head portion 312 in the Y-axis positive direction in FIG. 1 and the alignment device 320 in FIG. 13 to FIG. 21 indicates a pair of two alignment devices 320 in the Y-axis positive direction in FIG. 1. Also, in FIG. 13 to FIG. 21, ICs shown on the right sides in the figures indicate ICs to be tested arranged at the first row on the first column and at the first row on the second column, while ICs shown on the left sides in the figures indicate ICs to be tested arranged at the second row on the first column and at the second row on the second column (it is the same in the first contact arm $315a_1$). Note that ICs arranged at the first row on the first column and at the second row on the first column are not illustrated because they are overlapped with those arranged at the first row on the second column and at the second row on the second column. Similarly, there is another alignment device 320 provided behind being overlapped by the illustrated alignment device 320, so that it is not shown.

The first XYZ transfer device 501 picks up by four suction pads 501d and holds four ICs to be tested on a supply tray positioned at the uppermost level of the supply tray stocker 401 of the IC magazine 40.

Next, the first XYZ transfer device 501 elevates the four ICs to be tested by the Z-axis direction actuator provided to the movable head portion 501c while holding the four ICs to be tested, slides the X-axis direction rail 501b on the Y-axis direction rails 501a, and the movable head portion 501c is slid on the X-axis direction rail 501b to move the ICs to the loader section 50. Then, the first XYZ transfer device 501 locates above concave portions 503a of the heat plate 503, extends the Z-axis direction actuator of the movable head portion 501c, and releases the suction pads 501d to drop the ICs to be tested into the concave portions 503a. When the ICs to be tested are heated to a predetermined temperature by the heat plate 503, the first XYZ transfer device 501 again holds the heated four ICs to be tested and transfers to above one loader buffer 502 in a standby state. Then, after locating above the movable portion 502a of the loader buffer portion 502 in a standby state, the first XYZ transfer device 501 extends the Z-axis direction actuator of the movable head portion 501c and releases the suction pads 501d, so that the four ICs to be tested are dropped into the concave portions 502c formed on the upper surface of the movable portion 502a.

Next, the loader buffer portion 502 extends the provided X-axis direction actuator 502b while holding the four ICs to be tested and moves the four ICs to be tested from the operation range of the first XYZ transfer device 501 of the loader section 50 to the operation range of the YZ transfer device 310 of the test section 30.

Next, the Z-axis direction actuator 313 provided on one movable head portion 312 of the YZ transfer device 310 positioned above the loader buffer portion 502 is extended, and four ICs to be tested positioned on the concave portions 502c of the movable portion 502a of the loader buffer portion 502 are picked up and held by the four suction pads 417c provided on the movable head portion 312.

Next, the movable head portion 312 is elevated while holding the four ICs to be tested by the Z-axis direction actuator 313 provided to the movable head portion 312.

Figure 13:
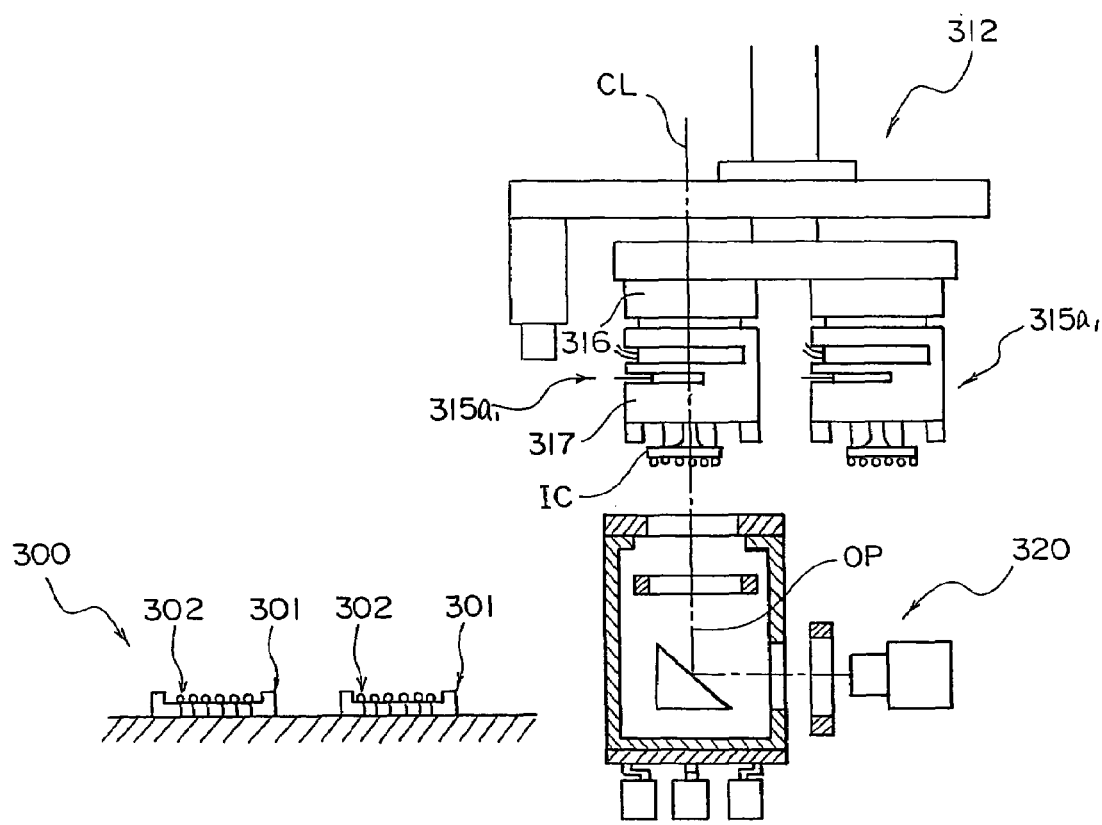
FIG. 13 is a schematic sectional view of a state where two ICs to be tested arranged at the second row on the first column and at the second row on the second column are aligned above the alignment device in an alignment operation of the first embodiment of the present invention.

Next, as shown in FIG. 13, the YZ transfer device 310 slides the X-axis direction supporting member 311a for supporting the movable head portion 312 on the Y-axis direction rail 311 and locates two ICs to be tested above the alignment device 320, so that the center line CL of the two handling side contact arms 317 arranged at the second row on the first column and at the second row on the second column substantially matches with the optical axis OP of the two alignment devices 320.

Figure 14:
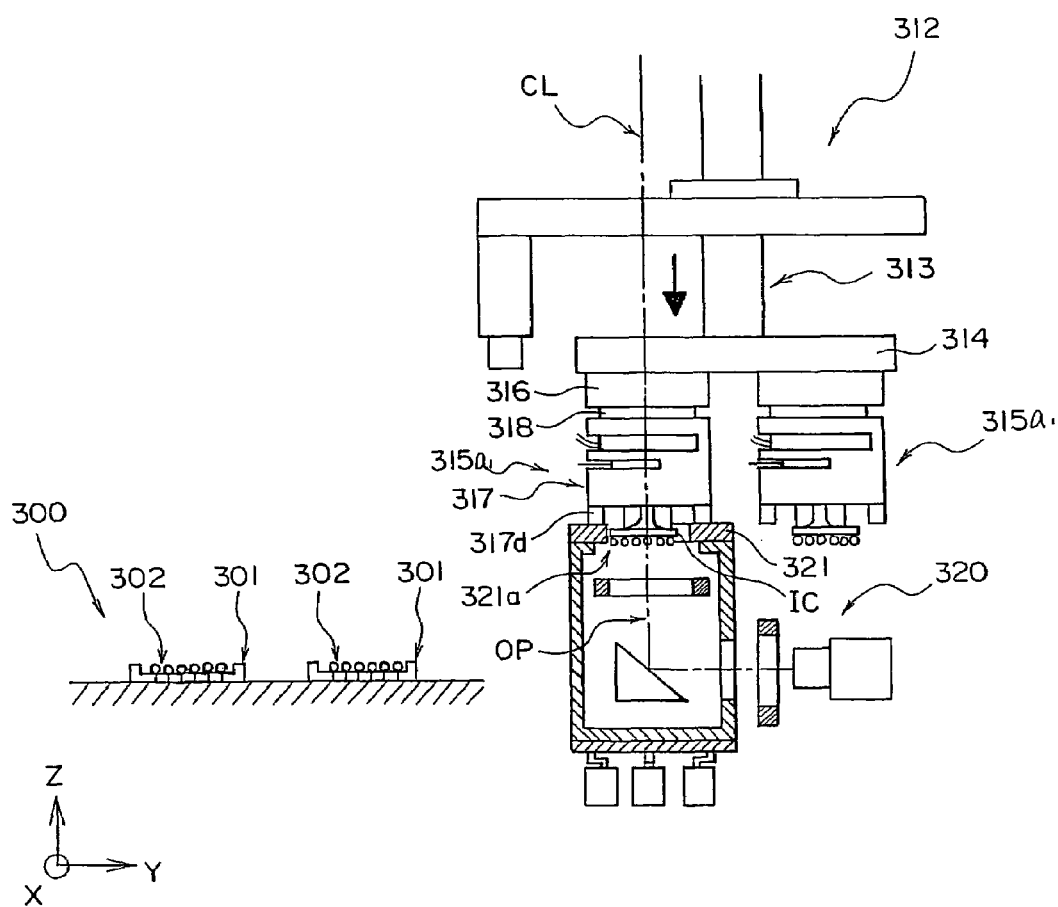
FIG. 14 is a schematic sectional view of a state wherein two ICs to be tested arranged at the second row on the first column and at the second row on the second column are inserted to the alignment device in an alignment operation of the first embodiment of the present invention.

Next, as shown in FIG. 14, the movable head portion 312 extends the Z-axis direction actuator 313 to insert two ICs to be tested arranged at the second row on the first column and at the second row on the second column to the first opening 321a of the alignment movable portion 321 of the pair of alignment devices 320, brings the contact member 317d formed on the bottom end portion of the holding side contact arm 317 to contact the alignment movable portion 321, and applies a predetermined pressure.

Next, in a step S100 in FIG. 12, images of two ICs to be tested arranged at the second row on the first column and at the second row on the second column are taken by the alignment CCD cameras 326 of the alignment devices 320 in a state that a predetermined pressure by the Z-axis direction actuator 313 is maintained. Image information taken by the alignment CCD camera 326 is transmitted to the image processing device 70.

Next, in a step S200 in FIG. 12, the image processing device 70 extracts positions of respective input/output terminals HB of the ICs to be tested from the image information by performing image processing.

Next, in a step S300, the image processing device 70 calculates the center position CP of the ICs to be tested and one axis of coordinate AL of the XY coordinates in the ICs to be tested from the extracted positions of the input/output terminals HB and calculates positions and postures of the ICs to be tested in the image taken by the alignment CCD camera 326. Note that a calculation method of one axis of coordinate AL in the ICs to be tested is, for example, calculating for every row an approximate line passing through the center of the input/output terminals HB forming a long row in the input/output terminals HB extracted in the step S200 and calculating an average line of the plurality of approximate lines. Note that, as to unevenness, etc. of positions of input/output terminals HB arisen in producing ICs to be tested, to improve accuracy of the positions and postures of the ICs to be tested, calculation of the other axis of the coordinate, etc. may be performed by the similar method as the above calculation method of one axis of coordinate AL.

Next, in a step S400, the image processing device 70 compares positions and postures of the contact portions 301 in the image with those of the ICs to be tested. When the positions and postures are matched in the comparison in the step S400 ("YES" in the step S400), the alignment is finished. Note that positions and postures of the contact portions 301 in the image are obtained by making the positions and postures of the contact portions 301 in the image taken by the contact portion recognition CCD camera 312b and recognized by image processing in advance at the time of changing a lot, etc. be correspondent to positions and postures in the image by the alignment CCD camera 326. An example of an image of the extracted respective input/output terminals HB of an IC to be tested before the alignment, calculated center position CP of the IC, and one axis of coordinate AL of the IC illustrated for convenience is shown in FIG. 23 (it is the same also in FIG. 24). Note that, for a convenient explanation, the center position of the contact portion 301 and the XY coordinates in the image match with the origin in the image, that is the optical axis OP and the XY coordinates.

When the positions and postures of the contact portions 301 in the image do not match with those of the ICs to be tested ("NO" in the step S400), in a step S500, the image processing device 70 calculates an alignment amount required in the X-axis and Y-axis directions and in the θ rotation about the Z-axis, so that the positions and postures of the ICs to be tested match with the positions and postures of the contact portions 301. The required alignment amount in the case shown n FIG. 23 is a movement of +x in the X-axis direction, a movement of −y in the Y-axis direction and a rotation of −α in the θ rotation direction about the Z-axis.

Next, in a step S600, the image processing device 70 transmits to the YZ transfer device control device 80 an instruction to make the lock-and-free mechanism 318 holding ICs to be tested arranged at the second row on the first column and at the second row on the second column to be in a non-restricting state. The YZ transfer device control device 80 controls to stop supplying an air to the restriction pistons 3183 of the lock-and-free mechanism 318 based on the instruction and, when the lock-and-free mechanism 318 becomes a non-restricting state, transmits a completion signal to the image processing device 70.

Note that, for example, in the case where concave portions 317e are formed on the contact members 317d and a convex portion 321c is formed on the alignment movable portion 321 in another embodiment of the present invention, for easily fitting the convex portion 321c in the concave portion 317e, the lock-and-free mechanism 318 may be made to be a non-restricting state before fitting.

Next, in a step S700, when the image processing device 70 receives the completion signal, the alignment amount calculated in the step S500 is transmitted to the movable portion driving device control device 90. Then, the movable portion driving device control device 90 drives the first driving motor 3221, second driving motor 3222 and the third driving motor 3223 of the alignment movable portion driving device 322 based on the transmitted alignment amount and performs alignment of positions of ICs. The movable portion driving device control device 90 transmits the completion signal to the image processing device 70 when the driving operations are completed.

When driving of the alignment movable portion driving device 322 is completed, in a step S800, the image processing device 70 again compares the positions and postures of the ICs to be tested with those of the contact portions 301, and when judged to be not matched ("NO" in the step S800), returns to the step S500 and calculates a necessary alignment amount. Note that the procedure may proceed from the step S700 to a step S900 without performing the comparison in the step S800, and thereby, a processing speed of the flowchart shown in FIG. 12 can be improved.

In the comparison in the step S800, when judged that the positions and postures of the ICs to be tested and those of the contact portions 301 are matched ("YES" in the step S800), in a step S900, the image processing device 70 transmits to the YZ transfer device control device 80 an instruction to make the lock-and-free mechanism 318 holding the ICs to be tested arranged at the second row on the first column and at the second row on the second column to be in a restricting state. The YZ transfer device control device 80 controls to supply an air to the restriction pistons 3183 of the lock-and-free mechanism 318 based on the instruction and the alignment is completed.

Figure 15:
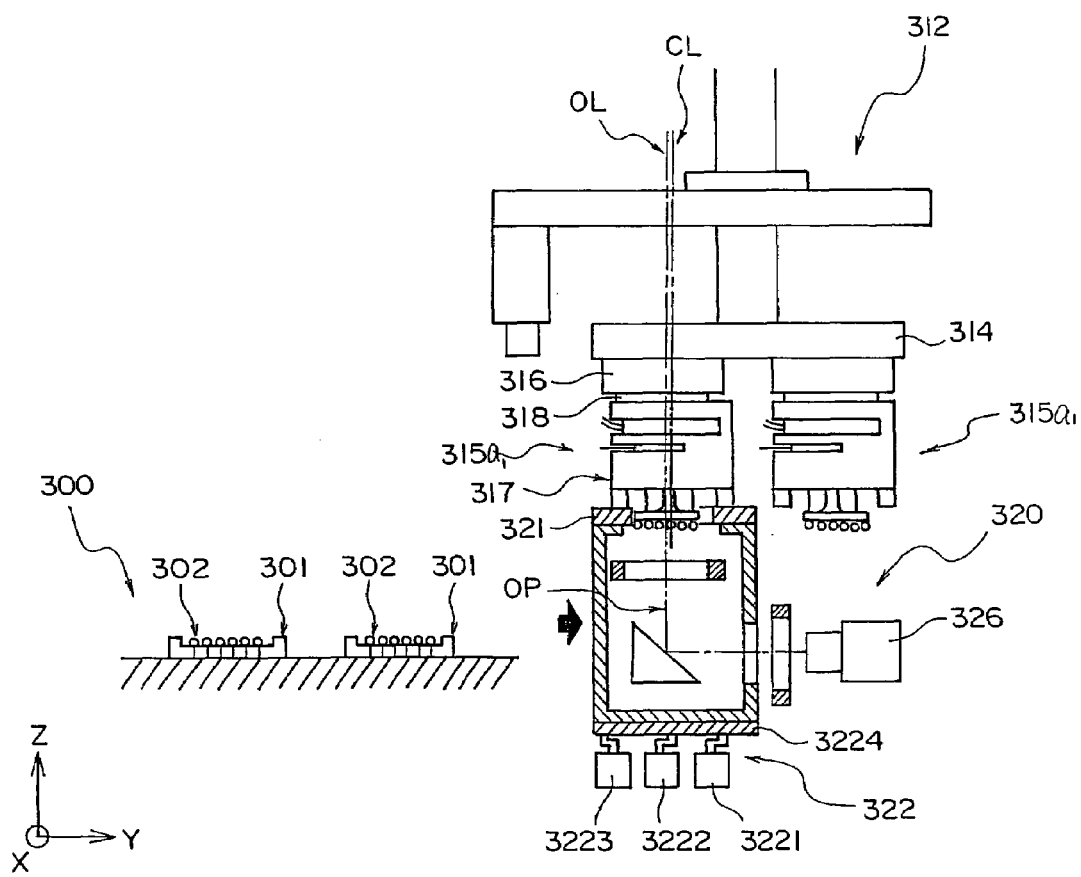
FIG. 15 is a schematic sectional view of a state wherein alignment of the two ICs to be tested arranged at the second row on the first column and at the second row on the second column is completed in an alignment operation of the first embodiment of the present invention.

FIG. 15 is a schematic sectional view of a state wherein the alignment of the ICs to be tested arranged at the second row on the first column and at the second row on the second column is completed by the above alignment processing. In FIG. 15, the holding side contact arm 317 for holding the ICs to be tested and the alignment movable portion 321 move together by being driven by the alignment movable portion driving device 322, and it is known that the optical axis OP and the center line CL of the holding side contact arm 317 are not matched. An example of an image of the extracted respective input/output terminals HB of the IC to be tested after the alignment, a calculated center position CP of the IC, and one axis of coordinate AL in the IC illustrated for convenience is shown in FIG. 24. Note that the central position of the contact portion 301 and the XY coordinates in the image are matched with the optical axis OP and the XY coordinates as an origin in the image for a convenient explanation.

Note that two alignment devices 320 attains the above alignment operation on two ICs to be tested arranged at the second row on the first column and at the second row on the second column substantially at the same time.

Figure 16:
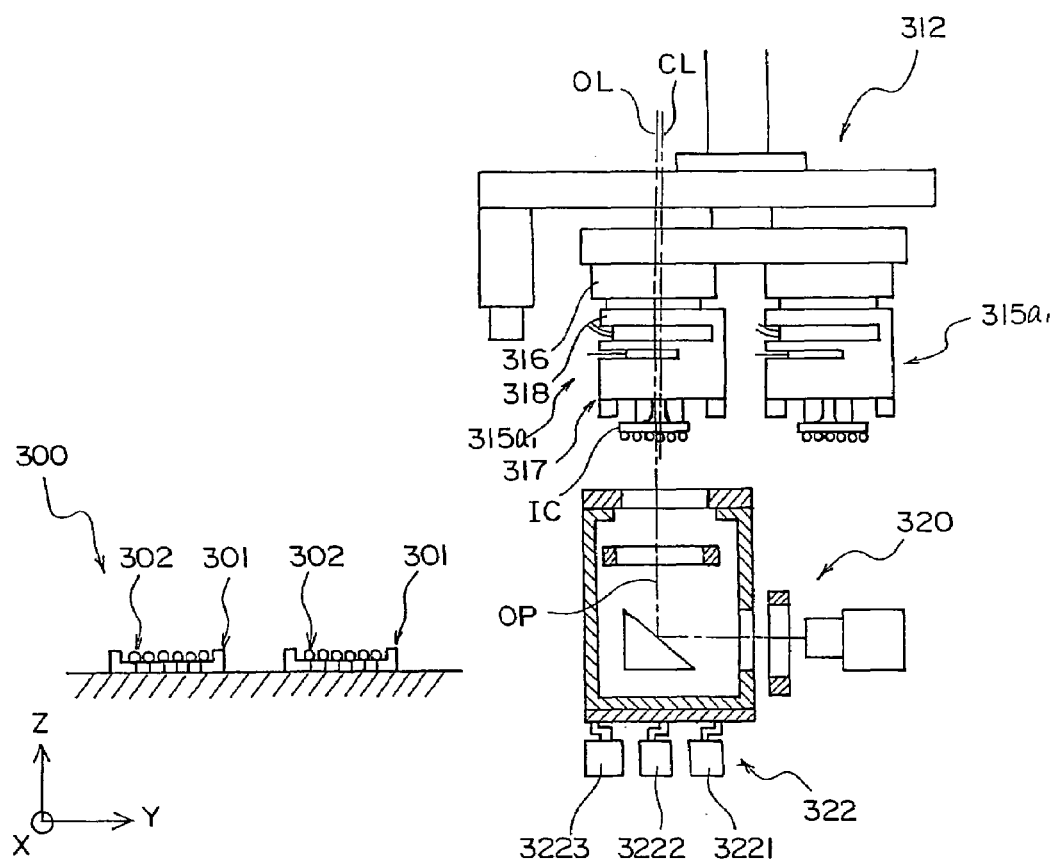
FIG. 16 is a schematic sectional view of a state wherein four ICs to be tested are elevated above the alignment device in the alignment operation of the first embodiment of the present invention.

When alignment of positions of the two ICs to be tested arranged at the second row on the first column and at the second row on the second column is completed by the alignment device 320, as shown in FIG. 16, four ICs to be tested are elevated while being held by the Z-axis direction actuator 313 of the movable head portion 312. When the ICs to be tested are separated from the alignment device 320 by being driven by the Z-axis direction actuator 313, the alignment movable portion 321 is returned to an initial state by the alignment movable portion driving device 322.

Figure 17:
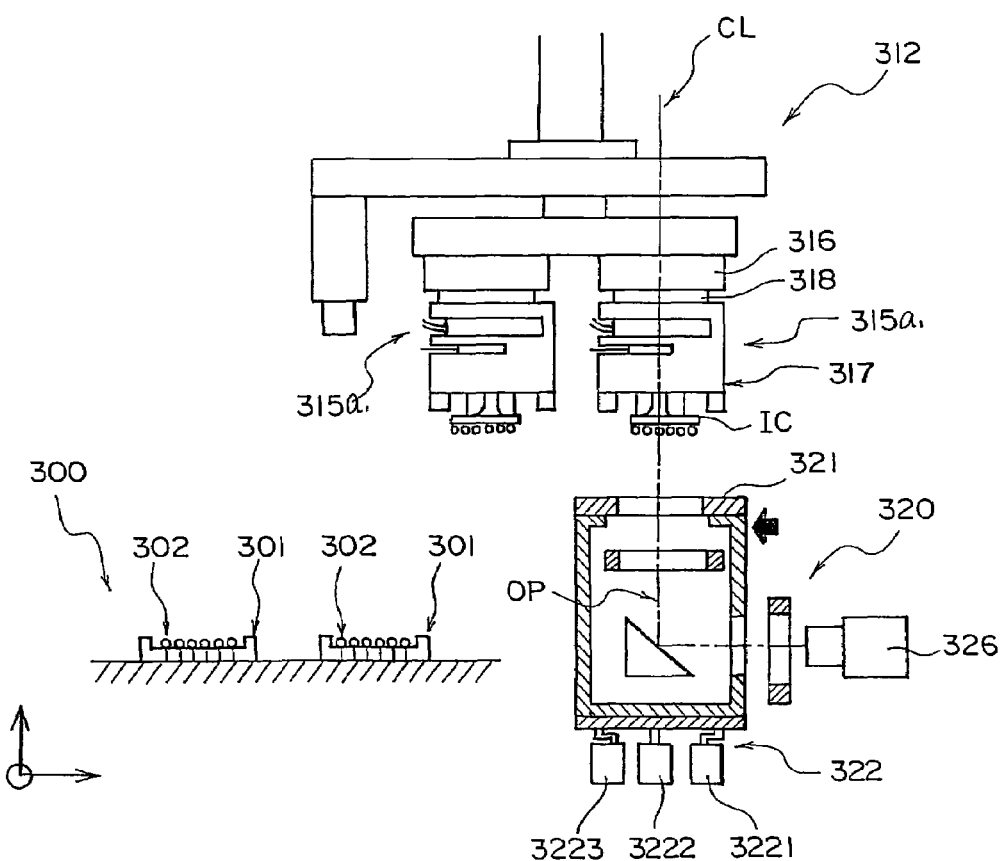
FIG. 17 is a schematic sectional view of a state wherein two ICs to be tested arranged at the first row on the first column and at the first row on the second column are aligned above the alignment device in the alignment operation of the first embodiment of the present invention.

Next, as shown in FIG. 17, the YZ transfer device 310 transfers the movable head portion 312 in the Y-axis negative direction for an amount of a pitch between the root side contact arm center line OL arranged at the first row on the first column and the root side contact arm center line OL arranged at the second row on the first column, and two ICs to be tested arranged at the first row on the first column and at the first row on the second column before being aligned are located above the pair of alignment devices 320, so that the center line CL of the two holding side contact arms arranged at the first row on the first column and at the first row on the second column and the optical axis OP of the two alignment devices are substantially matched.

Figure 18:
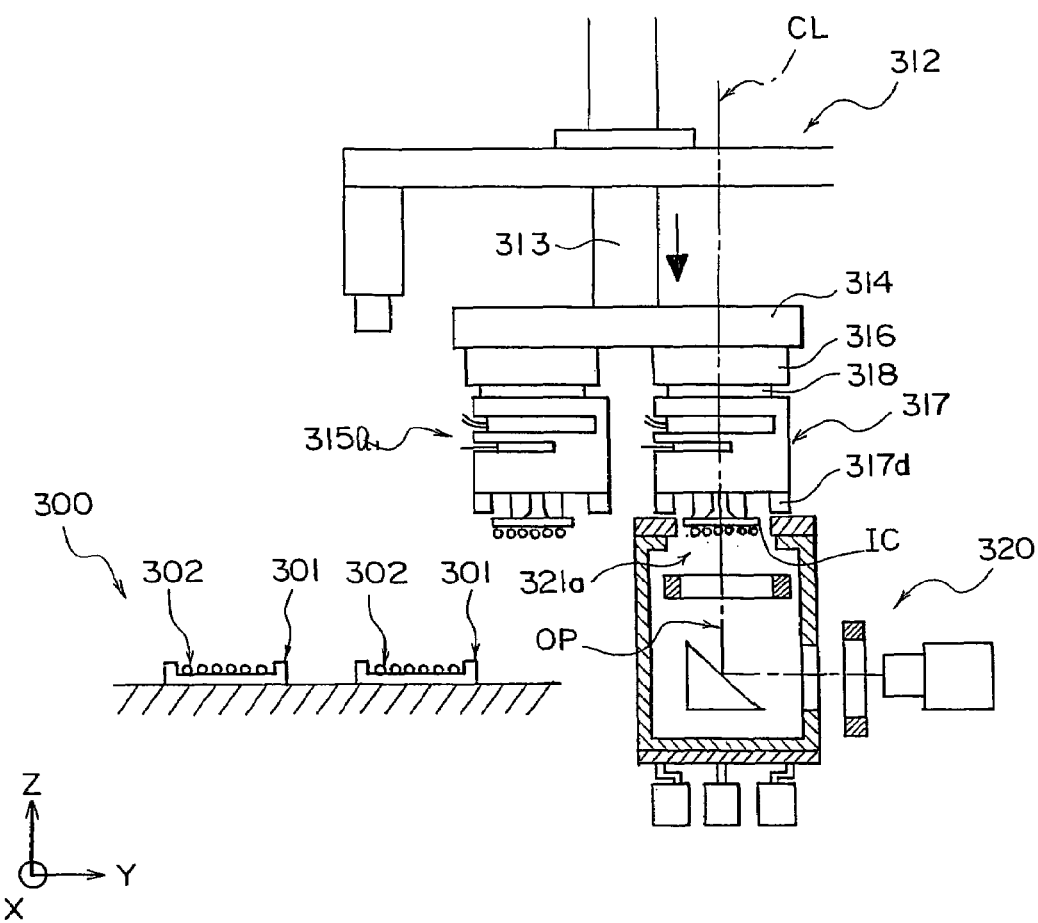
FIG. 18 is a schematic sectional view of a state wherein two ICs to be tested arranged at the first row on the first column and at the first row on the second column are inserted to the alignment device in the alignment operation of the first embodiment of the present invention.

Next, as shown in FIG. 18, the movable head portion 312 inserts two ICs to be tested arranged at the first row on the first column and at the first row on the second column to first openings 321a of the alignment movable portions 321 of the pair of alignment devices 320 by extending the Z-axis direction actuator 313, brings the contact members 317d formed on the bottom end portion of the holding side contact arm 317 to contact the alignment movable portion 321, and applies a predetermined pressure.

Figure 19:
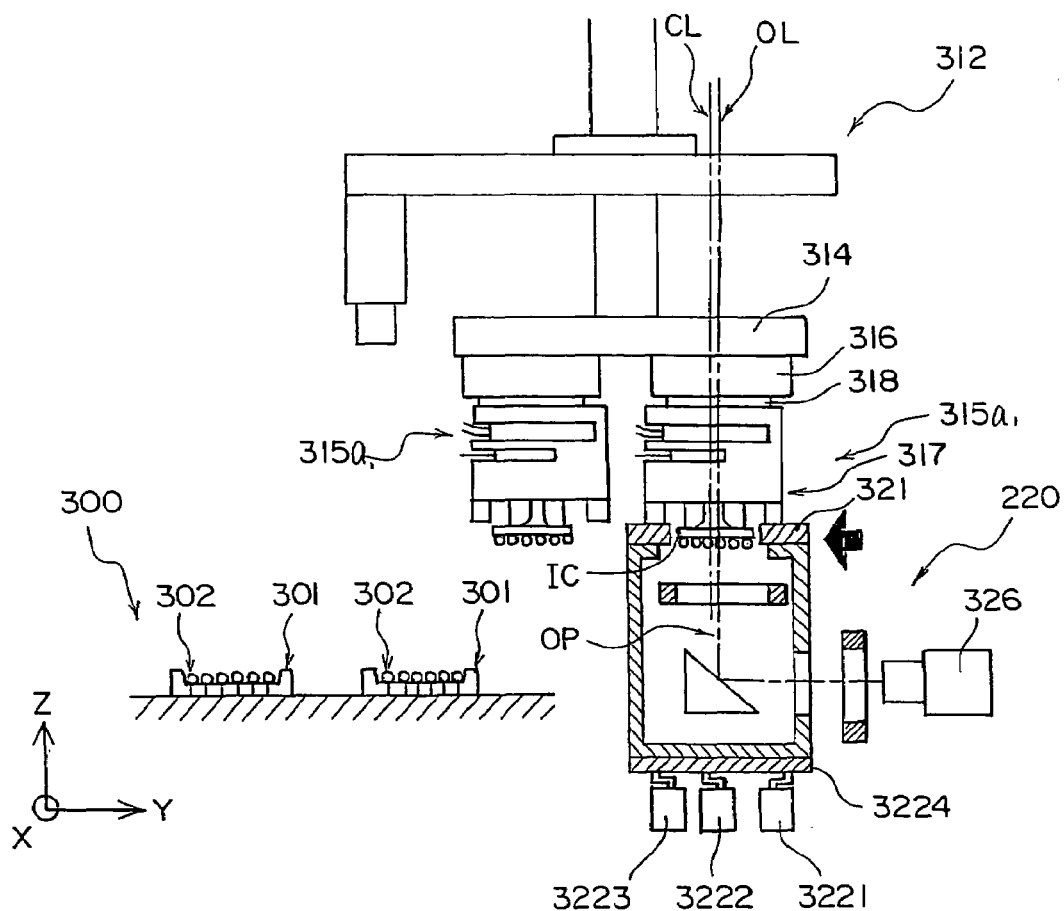
FIG. 19 is a schematic sectional view of a state wherein alignment of the two ICs to be tested arranged at the first row on the first column and at the first row on the second column is completed in the alignment operation of the first embodiment of the present invention.

Next, as shown in FIG. 19, in a state that a predetermined pressure by the Z-axis actuator 313 is maintained, the processing from the step S100 to the S900 in the flow chart in FIG. 12 explained above is performed by the image processing means 70, the YZ transfer device control device 80 and the movable portion driving device control device 90, and an alignment of positions of the two ICs to be tested arranged at the first row on the first column and at the first row on the second column is performed by the alignment devices 320.

Note that the above alignment operation on the two ICs to be tested arranged at the first row on the first column and at the first row on the second column is attained by two alignment devices 320 substantially at the same time.

Figure 20:
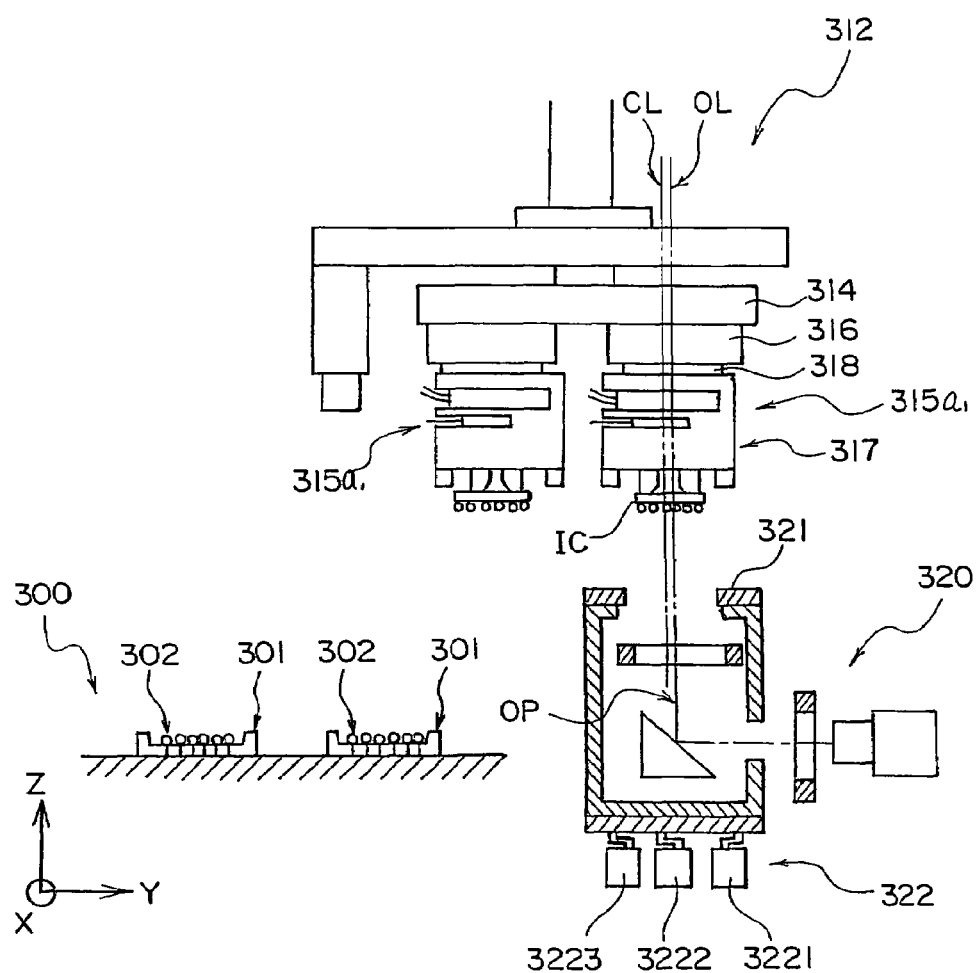
FIG. 20 is a schematic sectional view of a state wherein four ICs to be tested are elevated above the alignment device in the alignment operation of the first embodiment of the present invention.

When the alignment of the two ICs to be tested arranged at the first row on the first column and at the first row on the second column is completed by the alignment devices 320, as shown in FIG. 20, four ICs to be tested are elevated while being held by the Z-axis direction actuator 313 of the movable head portion 312. When the ICs to be tested are separated from the alignment devices 320 by being driven by the Z-axis direction actuator 313, the alignment movable portion 321 is returned to an initial state by the alignment movable portion driving device 322.

As explained above, the alignment operation is performed for two times by the pair of two alignment devices 320 for the four ICs to be tested.

During an alignment of the above ICs to be tested by one movable head portion 312 of the YZ transfer device 310, the other movable head portion 312 performs a test at the test head 300.

Next, the YZ transfer device 310 slides the X-axis direction supporting member 311a for supporting the movable head portion 312 on the Y-axis direction rails 311, and the four ICs to be tested held by the suction pads 317c at the end of the movable head portion 312 are located above four contact portions 310 of the test head 300.

Figure 21:
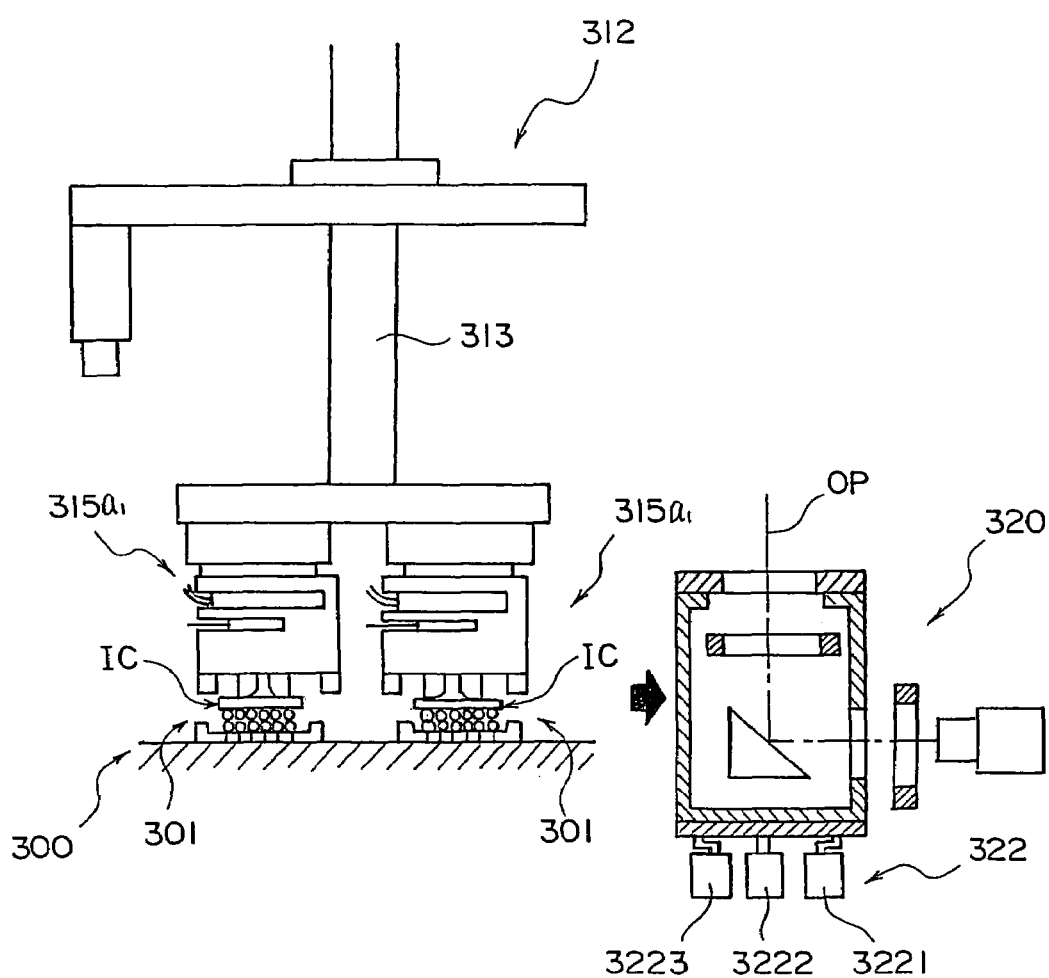
FIG. 21 is a schematic sectional view of a state wherein the four ICs to be tested are brought to contact the contact portion after completing alignment of the first embodiment of the present invention.

Next, as shown in FIG. 21, the movable head portion 312 extends the Z-axis direction actuator 313 to bring respective input/output terminals HB of the four ICs to contact respective contact pins 302 of four contact portions 301. During the contact, a test is conducted on the four ICs to be tested at the same time by transmitting and receiving of an electric signal are performed via the respective contact pins 302.

When the test on the four ICs is completed, the YZ transfer device 310 elevates the held post-test ICs by the Z-axis direction actuator 313 provided to the movable head portion 312, slides the X-axis direction supporting member 311a for supporting the movable head portion 312 on the Y-axis direction rails 311, and locates the held four ICs above the movable portion 602a of one unloader buffer portion 602 in a standby state in the operation range of the YZ transfer device 310.

Next, the movable head portion 312 extends the Z-axis actuator 313 and drops the four ICs into concave portions 602c formed on the upper surface of the movable portion 602a by releasing them from the suction pads 317c.

Note that, as shown in FIG. 22A and FIG. 22B, after taking out the post-test ICs, the movable head portion 312 of the YZ transfer device 310 stops supplying an air to the restriction pistons 3183 of the lock-and-free mechanism 318 so that the center line CL of the respective holding side contact arms 317 matches with the center line OL of the root side contact arms 316, and performs a centering operation on the holding side contact arms 317 by supplying an air to the centering pistons 3184. FIG. 22A shows the first contact arm 315$_1$ before the centering operation and FIG. 22B shows the first contact arm 315$_1$ after the centering operation.

Next, the unloader buffer portion 602 makes the provided X-axis actuator 602b drive while holding the post-test four ICs and transfers the post-test ICs from the operation range of the YZ transfer device 310 of the test section 30 to the operation range of the second XYZ transfer device 601 of the unloader section 60.

Next, the Z-axis direction actuator provided to the movable portion 602c of the second XYZ transfer device 601 positioned above the unloader buffer portion 602 is extended, and the post-test four ICs positioned on the concave portions 602c of the movable portion 602a of the unloader buffer portion 602 are picked up and held by the four suction pads 601d provided to the movable portion 602c.

Next, the second XYZ transfer device 601 elevates the post-test four ICs by the Z-axis direction actuator provided to the movable head portion 601c while holding them, slides the X-axis direction rail 601b on the Y-axis direction rails 601a, slides the movable head portion 601c on the X-axis direction rail 601b and transfers to the classification tray stocker 402 of the IC magazine 40. Here, based on the test results of the respective ICs to be tested, the respective ICs are loaded on respective classification trays positioned at the uppermost level of the respective classification tray stockers 402 corresponding to the test result as explained above.

As explained above, the alignment CCD camera takes an image of an electronic device to be tested held by the contact arm, the image processing means recognizes a relative position of the IC to be tested held by the contact arm with respect to a contact portion based on taken image information, and the alignment device performs correction of a position of the contact arm holding the IC to be tested based on the recognition, as a result, the frequency of erroneous contact occurrence can be reduced.

The contact arm comprises the holding side contact arm, the lock-and-free mechanism and the root side contact arm, wherein the lock-and-free mechanism is provided between the holding side contact arm and the root side contact arm, and a planar movement of the holding side contact arm with respect to the base side contact arm on the X-Y plane substantially in parallel with the contact portion is made to be restricted or non-restricted by the lock-and-free mechanism, while the root side contact arm is fixed to the YZ transfer device, as a result, the contact arm does not need to comprise a position correction means, a weight of the contact arm is reduced, moving at a high speed becomes possible and the frequency of erroneous contact occurrence reduces.

Furthermore, by using an electronic device testing apparatus having the YZ transfer device provided with two movable head portions having four contact arms, four alignment CCD cameras and four alignment devices for a test head having four contact portions, one movable head portion of the YZ transfer device performs correction of positions of ICs to be tested for one contact portion, and the other movable head portion conducts a test at the same time, the test efficiency can be improved. Also, by conducting a test on four ICs to be tested with four contact portions at a time, an optimal simultaneously measured amount can be secured.

Second Embodiment

Below, as a second embodiment of the present invention, an embodiment wherein a plane following mechanism for naturally bringing ICs to be tested to contact the contact portion by making the contact arm follow a plane in parallel with the contact portion when the contact portion is inclined a little will be explained.

Note that the configuration of an electronic device testing apparatus except for the contact arm is the same as that in the above first embodiment, so that explanations on the configuration of the electronic device testing apparatus other than the contact arm will be omitted and the same reference numbers will be used for the same components as those in the first embodiment.

Figure 25:
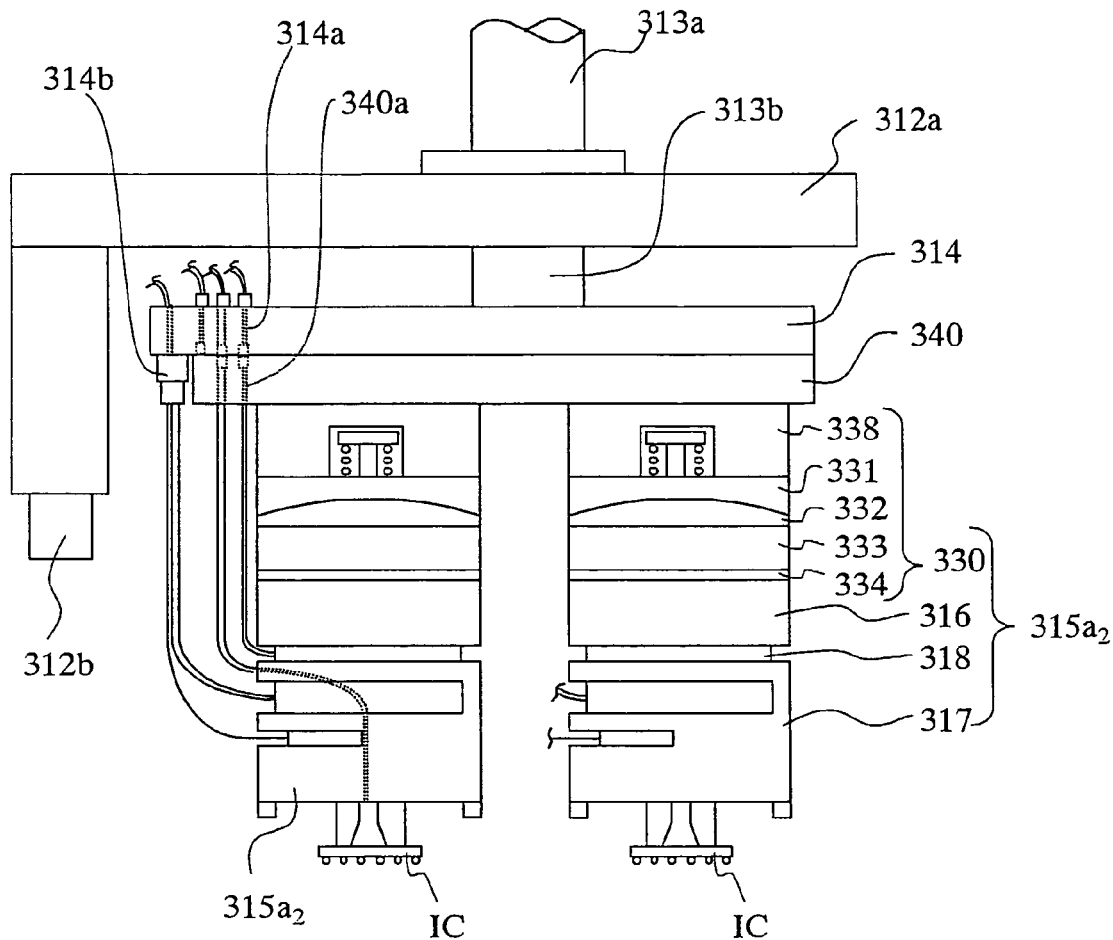
FIG. 25 is a schematic view from the side of the first contact arm of the YZ-transfer device in a second embodiment of the present invention.

In the electronic device testing apparatus 1 in the present embodiment, as shown in FIG. 25, the movable head portion 312 of the YZ transfer device 310 of the test section 30 is provided with a base member 340 for supporting four first contact arms $315a_2$ arranged in two rows by two columns. Note that, in FIG. 25, the first contact arm $315a_2$ shown on the right side in the figure indicates the first contact arms $315a_2$ arranged at the first row on the first column and at the first row on the second column in FIG. 1, and the first contact arm $315a_2$ shown on the left side in the figure indicates the first contact arms $315a_2$ arranged at the second row on the first column and at the second row on the second column in FIG. 1. Note that the first contact arms $315a_2$ arranged at the first row on the first column and at the second row on the first column are not shown because they overlap with those arranged at the first row on the second column and at the second row on the second column.

The base member 340 is a flat shaped member having a little smaller outer shape than that of the root portion 314 of the movable head portion 312 and detachably attached to the root portion 314, for example, by a bolt, etc. On the lower surface of the base member 340 is attached with four first contact arms $315a_2$ at a pitch corresponding to the four contact portions 301 of the test head 300 in the direction so that the suction pads 317c face to the contact portions 301. The four first contact arms $315a_2$ and the base member 340 compose one unit, and by changing this unit in accordance with the number and an arrangement of contact portions, it is possible to easily deal with changes of kinds of ICs to be tested.

On one end portion of the base member 340, a first air path 340a is formed by penetrating from the upper surface to the lower surface for flowing all air required by the four first contact arms $315a_2$ attached to the movable head portion 312, such as an air for a centering operation and restricting by the lock-and-free mechanism 318 and an air for suction by the suction pads 317c, etc.

Also, on the root portion 314 of the YZ transfer device 310 in the present embodiment, a second air path 314a is formed by penetrating from the upper surface to the lower surface at a position corresponding to the first air path 340a of the base member 340. When the base member 340 is attached to the root portion 314, the first air path 340a and the second air path 314a are connected to each other, and an air is suitably supplied from a supply means (not shown) to the lock-and-free mechanism 318 of the respective contact arms $315a_2$ and the suction pads 317c via the air paths 340a and 314a. Note that the first air path 340a and the second air pat 314a are respectively formed air paths in accordance with uses, such as suction, and centering operation and restricting, etc.

Furthermore, the root portion 314 is provided with a connector 314b near the second air path 314a for supplying all electricity required by the four first contact arms $315a_2$ attached to the movable head portion 312, such as a heater 317a and a temperature sensor 317b of the first contact arm $315a_2$, etc.

Each of the first contact arms $315a_2$ is a type of the first contact arm $315a_1$ explained in the first embodiment provided with a plane following mechanism 330, and comprises the plane following mechanism 330, a root side contact arm 316, a lock-and-free mechanism 318 and a holding side contact arm 317, wherein the lower surface of the base member 340 is attached with the upper surface of the plane following mechanism 330, and on the lower surface of the plane following mechanism 330 is attached with the root side contact arm 316, a lock-and-free mechanism 318 and the holding side contact arm 317 in this order.

Figure 30:
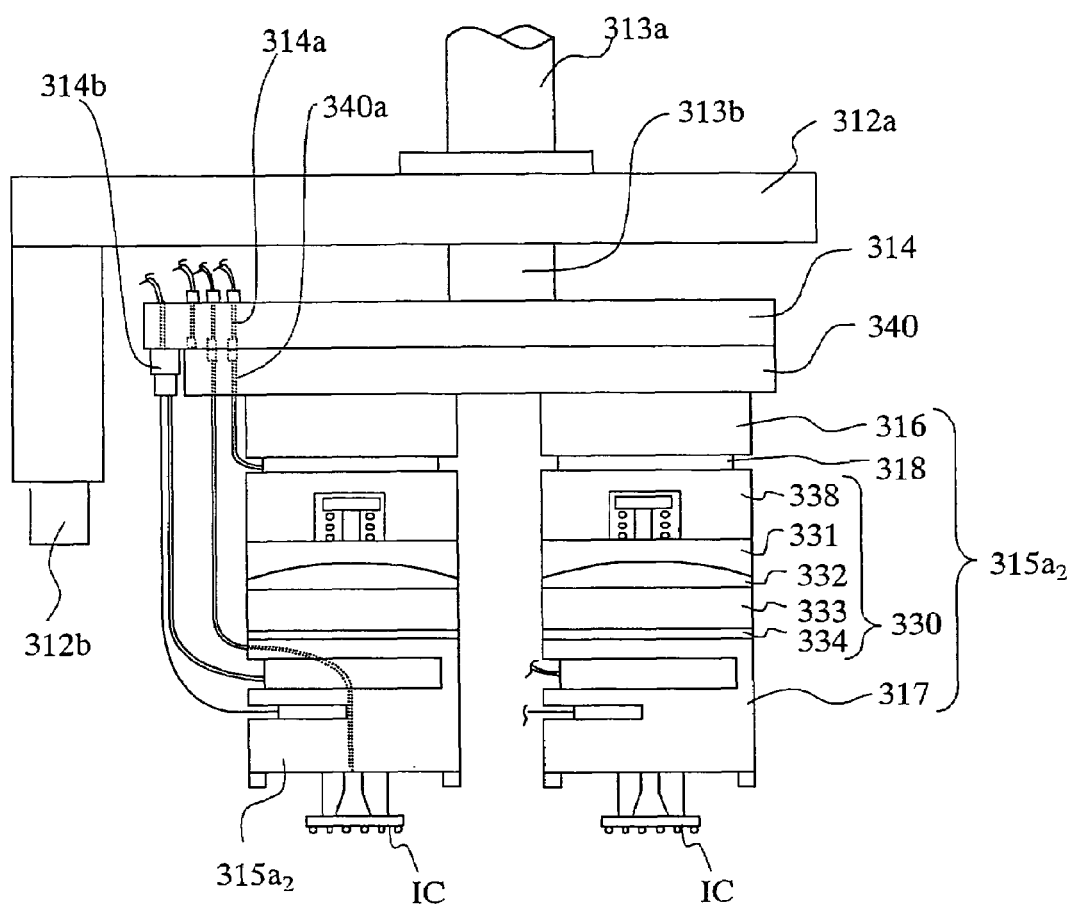
FIG. 30 is a schematic view from the side of another example of the first contact arm in the second embodiment of the present invention.

Note that, as shown in FIG. 30, the first contact arm $315a_2$ may be configured in an order of the root side contact arm 316, the lock-and-free mechanism 318, the plane following mechanism 330 and the holding side contact arm 317.

Each of the holding side contact arms 317 has the same configuration as those in the first embodiment, wherein an air piping for supplying a suction air extending from the respective suction pads 317c provided to each of the holding side contact arm 317 is connected to the first air path 340a of the base member 340. Also, electric wiring extending from the heater 317a and the temperature sensor 317b buried in the each of the holding side contact arm 317 is connected to a connector 314b of the root portion 314.

The configurations of the lock-and-free mechanism 318 and the root side contact arm 316 are the same as those in the first embodiment, and the air piping for a centering operation and restricting extending from the lock-and-free mechanism 318 is connected to the first air path 340a of the base member 340. Note that, while not particularly illustrated in FIG. 25, all air piping extending from the first contact arm 315$a_2$ shown on the right side in the figure is also connected to the first air path 340a of the base member 340, and the electric wiring extending from the first contact arm 315$a_2$ is also connected to the connector 314b provided to the root portion 314.

Figure 26:
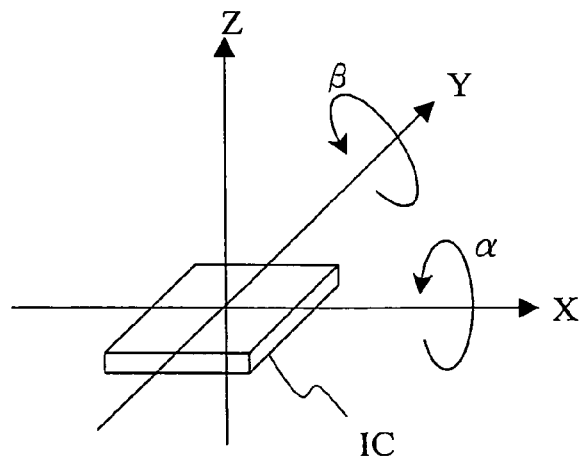
FIG. 26 is a view for explaining a following operation of an IC to be tested by the first contact arm in the second embodiment of the present invention.

The plane following mechanism 330 provided to each of the first contact arms 315$a_2$ is a hanging type plane following means for making the ICs to be tested held by the suction pads 317c perform a following operation to the X-Y plane in parallel with the contact portion 301 at the time the ICs to be tested contact a little inclined contact portion. As shown in FIG. 26, it realizes an α rotation about the X-axis substantially in parallel with the X-Y plane in parallel with the contact portion 301 and a β rotation about the Y-axis substantially in parallel with the plane.

Figure 27:
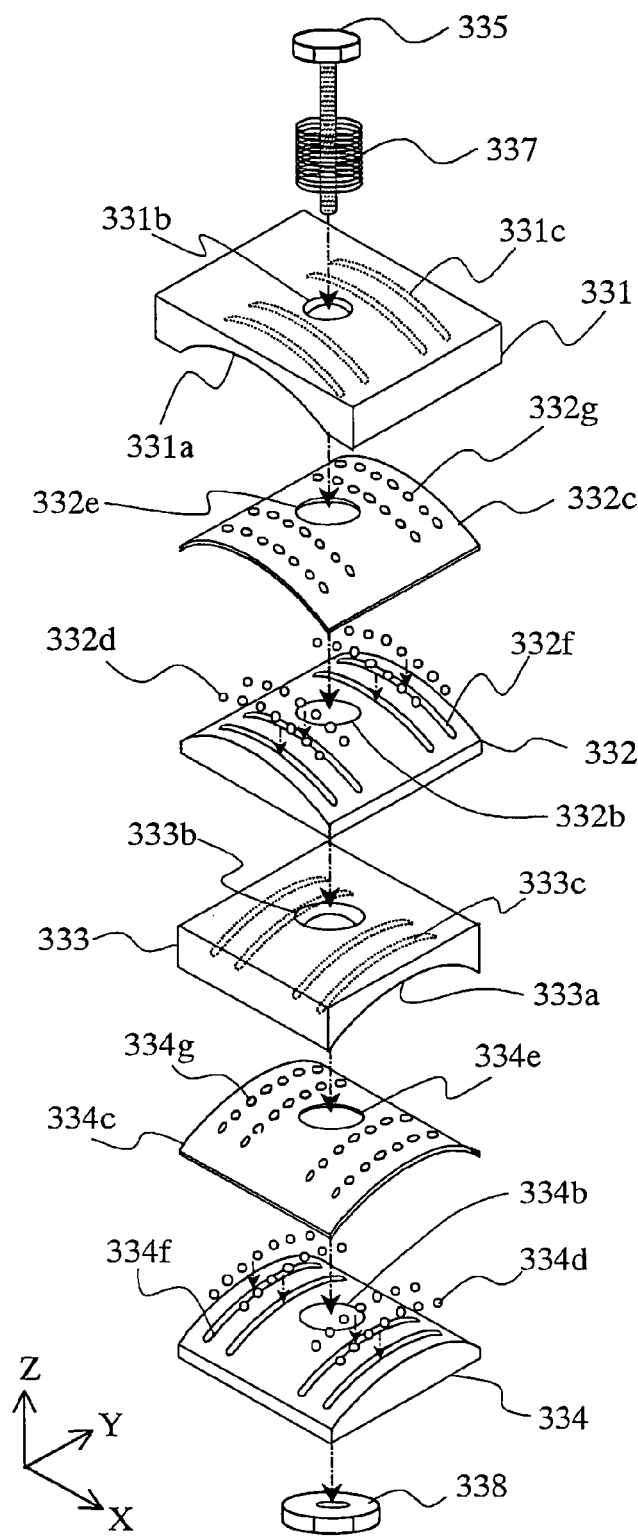
FIG. 27 is a disassembled perspective view of a plane following mechanism of the first contact arm in the second embodiment of the present invention.

The plane following mechanism 330 comprises, as shown in FIG. 27, a Y-axis rotation receiving member 331 and the Y-axis rotation following member 332 for performing the following operation about the Y-axis, an X-axis rotation receiving member 333 and the X-axis rotation following member 334 for performing the following operation about the X-axis, a bolt 335 and a nut 336 for fixing them so that they can mutually slide, a spring 337 for performing a centering operation by giving a suitable elastic force, and a connector 338 for connecting a base member 340 and the plane following mechanism 330.

As shown in FIG. 27, the Y-axis rotation receiving member 331 is formed on the lower surface thereof a first concave arc shape 331a along the circumferential direction about the Y-axis, and a first through hole 331b penetrated by the bolt 335 is formed at the approximate center portion thereof. On the other hand, the Y-axis rotation following member 332 is formed on the upper surface thereof a first convex arc shape 332a to fit with the first concave arc shape 331a of the Y-axis rotation receiving member 331, and a second through hole 332b penetrated by the bolt 335 is formed at an approximate center thereof.

The first concave arc shape 331a of the Y-axis rotation receiving member 331 and the first convex arc shape 332a of the Y-axis rotation following member 332 are set, as shown in FIG. 29A and FIG. 29B, so that the center $C_{02}$ of a circle $C_2$ as an extension of these arc shapes substantially matches with the center position of the IC to be tested in order to rotate the center of the IC to be tested.

The first through hole 331b of the Y-axis rotation receiving member 331 has a smaller diameter than an inner diameter of the spring 337, so that the spring 337 can be placed between the bolt 335 inserted to the through hole 331b and the Y-axis rotation receiving member 331.

Between the Y-axis rotation receiving member 331 and the Y-axis rotation following member 332 is provided a flexible spacer 332c made by a synthetic resin, such as Teflon, and a plurality of bearings 332d for a smoother sliding operation. At an approximate center portion of the spacer 332c is formed a third through hole 332e for being penetrated by the bolt 335.

As shown in FIG. 27, on the upper surface of the Y-axis rotation following member 332 is formed a plurality of grooves 332f along the circumferential direction of the first convex arc shape 332a. Also, the spacer 332c is formed a plurality of small holes 332g for the plurality of bearings 332d to be inserted at predetermined positions corresponding to the plurality of grooves 332f formed on the Y-axis rotation following member 332. Furthermore, on the lower surface of the Y-axis rotation receiving member 331 is formed a plurality of grooves 331c at positions corresponding to the plurality of grooves 332f on the Y-axis rotation following member 332.

When the arc shapes 331a and 332a of the Y-axis rotation receiving member 331 and the Y-axis rotation following member 332 are fit, the plurality of bearings 332d inserted to the small holes 332g on the spacer 332c are positioned between the grooves 331c of the Y-axis rotation receiving member 331 and the grooves 332f on the Y-axis rotation following member 3302, and the bearings 332d rotate along the grooves 332f, so that the Y-axis rotation following member 332 smoothly slides on the Y-axis rotation receiving member 331. Since in the first arc shapes 331a and 332a of the members 331 and 332, the rotation center $C_{02}$ and the center of the IC to be tested are matched, the β rotation of the IC to be tested about the Y-axis is attained.

As shown in FIG. 27, on the lower surface of the above Y-axis rotation following member 332 is attached with the X-axis rotation receiving member 333. The X-axis rotation receiving member 333 is formed a second concave arc shape 333a along the circumferential direction about the X-axis, and a fourth through hole 333b penetrated by the bolt 335 is formed at the approximate center thereof. On the other hand, the X-axis rotation following member 334 is formed a second convex arc shape 334a to fit in the second concave arc shape 333a of the X-axis rotation receiving member 333, and a fifth through hole 334b penetrated by the bolt 335 is formed at its approximate center portion.

Figure 28A:
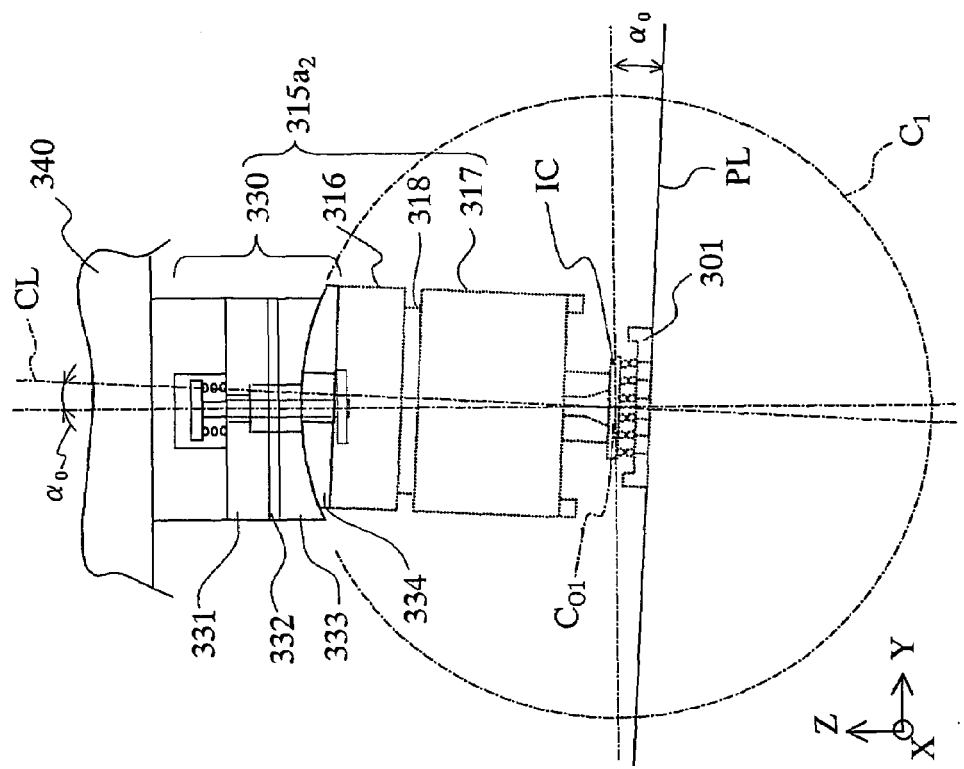
Figure 28B:
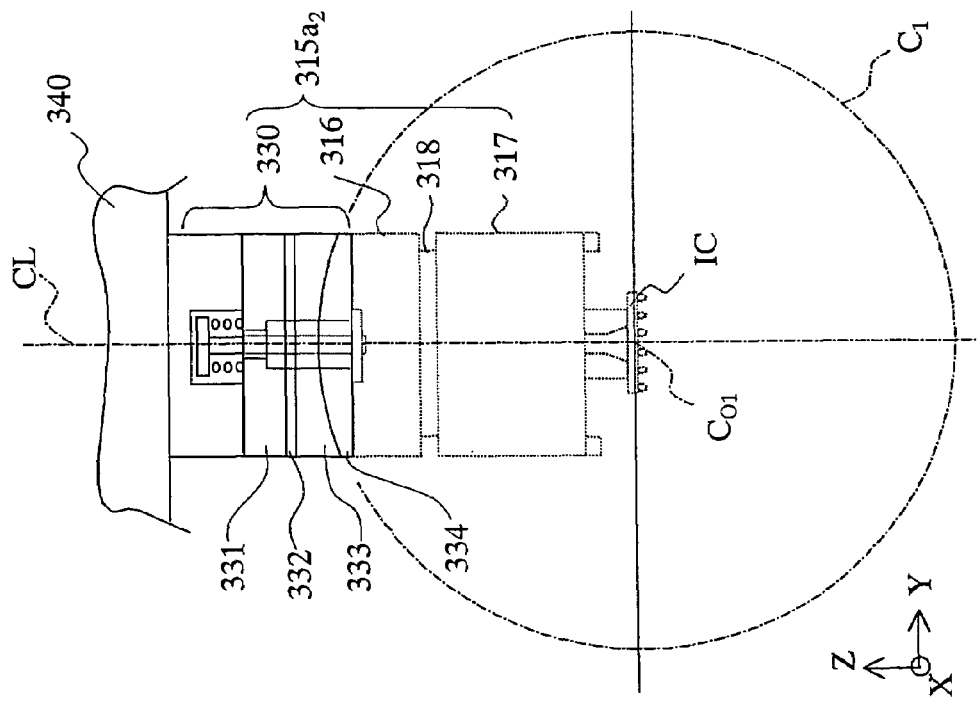

The second concave arc shape 333a of the X-axis rotation receiving member 333 and the second convex arc shape 334a of the X-axis rotation following member 334 are set, so that the center $C_{01}$ of the circle $C_1$ extended from these arc shapes substantially matches with the center position of the IC to be tested as shown in FIG. 28A and FIG. 28B in order to rotate the center of the IC to be tested.

Between the X-axis rotation receiving member 333 and the X-axis rotation following member 334, a flexible spacer 334c, for example, made by Teflon, etc. and a plurality of bearings 334d are provided for smoothing a sliding operation. At the approximate center of the spacer 334c is formed a sixth through hole 334e to be penetrated by the bolt 335.

As shown in FIG. 27, on the upper surface of the X-axis rotation following member 334 is formed a plurality of grooves 334f along the circumferential direction of the second convex arc shape 334a. Also, a plurality of small holes 334g for being inserted by the plurality of bearings 334d are formed at predetermined positions corresponding to the plurality of grooves 334f formed on the X-axis rotation following member 334. Furthermore, on the lower surface of the X-axis rotation receiving member 333 is formed a plurality of grooves 333c at positions facing to the plurality of grooves 334f of the X-axis rotation following member 334.

When the arc shapes 333a and 334a of the X-axis rotation receiving member 333 and X-axis rotation following member 334 are fit, the plurality of bearings 334d inserted to the small holes 334g of the spacer 334c are positioned between the grooves 333c of the X-axis rotation receiving member 333 and the grooves 334f of the X-axis rotation following member 334, and as a result that the respective bearings 334d rotate along the grooves 334f, the X-axis rotation following member 334 smoothly slides on the X-axis rotation receiving member 333. As explained above, since the rotation center $C_{01}$ and the center of the IC to be tested are matched in the arc shapes 333a and 334a of the members 333 and 334, the a rotation about the X-axis of the IC to be tested is attained by the above sliding operation.

On the lower surface of the X-axis rotation following member 334 is attached with the upper surface of the root side contact arm 316. Note that, in the present embodiment, the Y-axis rotation following member 332 and the X-axis rotation receiving member 333 are configured by separate independent members and, for example, they are mutually fixed by a method of screwing by a bolt, etc., but it is based on a reason of processing constraint, and by not being limited to this, the Y-axis rotation following member 332 and the X-axis rotation receiving member 333 may be integrally formed.

The respective members 331, 332, 333 and 334 configured as above are assembled by being combined so that axes of arcs of the first arc shapes 331a and 332b and the second arc shapes 333b and 334 are displaced from each other by 90 degrees, providing a spring 337 on the upper surface of the Y-axis rotation receiving member 331, and inserting the bolt 335 to the respective through holes 331b, 332b, 333b and 334b to be screwed with a nut 336 on the lower surface of the X-axis rotation following member 334. Note that the bolt 335 protrudes from the upper surface of the Y-axis rotation receiving member 331 to an extent of being able to give a sufficient elastic force to the spring 337.

Furthermore, on the upper surface of the Y-axis rotation receiving member 331 is attached, for example, by a bolt, etc. a connecting member 338 wherein a sufficiently large inner space is formed for accommodating the bolt 335 protruding from the upper surface of the Y-axis rotation receiving member 331 and the spring 337, and the base member 340 and the respective members 331, 332, 333 and 334 are connected by the connecting member 338.

Below, an operation of the plane following mechanism 330 provided to the first contact arm 315$a_2$ will be explained.

First, as shown in FIG. 28A and FIG. 28B, a plane following operation by the a rotation about the X-axis will be explained.

As shown in FIG. 28A, in a state that an IC to be tested does not contact the contact portion 301 as before conducting a test, since an outer force is not applied to the IC to be tested, the X-axis rotation following member 334 is subjected to a centering operation so as to true up the axis with that of the X-axis rotation receiving member 333 due to an elastic force of the spring 337. In this state, the center line CL of the holding side contact arm 317 is matched with the vertical direction (the Z-axis direction in FIG. 28A and FIG. 28B).

On the other hand, as shown in FIG. 28B, when the IC to be tested contacts the contact portion 301 on the plane PL inclined by $\alpha_0°$ when conducting a test, the X-axis rotation following member 334 slides relatively with respect to the X-axis rotation receiving member 333 in the direction of making the pressing force at the time of the contact substantially equal. Due to the sliding operation, the root side contact arm 316, the lock-and-free mechanism 318 and the holding side contact arm 317 provided to the X-axis rotation following member 334 rotate about the center position $C_{O1}$ of the IC to be tested and a following operation of the IC to be tested to the inclined contact portion 301 is performed. In this state, the center line CL of the holding side contact arm 317 is inclined with respect to the vertical direction by $\alpha_0°$. Also, in this state, the spring 337 is contracted by the sliding operation of the X-axis rotation following member 334, and when the IC to be tested and the contact portion 301 becomes a non-contact state after conducting the test, the spring 337 extends due to the elastic force, and a centering operation, that is zero return, of the X-axis rotation following member 334 is performed.

Next, as shown in FIG. 29A and FIG. 29B, a plane following operation by the β rotation about the Y-axis will be explained.

As shown in FIG. 29A, in a state that an IC to be tested does not contact the contact portion 301 as before conducting a test, an outer force is not applied to the IC to be tested in the same way as in the above case of FIG. 28A, the Y-axis rotation following member 332 is subjected to a centering operation so as to true up the axis with that of the Y-axis rotation receiving member 331 due to an elastic force of the spring 337. In this state, the center line CL of the holding side contact arm 317 is matched with the vertical direction (the Z-axis direction in FIG. 29A and FIG. 29B).

On the other hand, as shown in FIG. 29B, when the IC to be tested contacts the contact portion 301 on the plane PL inclined by $\beta_0°$ when conducting a test, the Y-axis rotation following member 332 slides relatively with respect to the Y-axis rotation receiving member 331 in the direction of making the pressing force at the time of the contact substantially equal. Due to the sliding operation, the X-axis rotation receiving member 333, the X-axis rotation following member 334, the root side contact arm 316, the lock-and-free mechanism 318 and the holding side contact arm 317 provided to the Y-axis rotation following member 332 rotate about the center position $C_{O2}$ of the IC to be tested and a following operation of the IC to be tested to the inclined contact portion 301 is performed. In this state, the center line CL of the holding side contact arm 317 is inclined with respect to the vertical direction by $\beta_0°$. Also, in this state, the spring 337 is contracted by the sliding operation of the Y-axis rotation following member 332, and when the IC to be tested and the contact portion 301 becomes a non-contact state after conducting the test, the spring 337 extends due to the elastic force, and a centering operation of the Y-axis rotation following member 332 is performed.

When the IC to be tested contacts the contact portion 301 on the plane PL inclined by $\alpha_0°$ about the X-axis and by $\beta_0°$ about the Y-axis, the Y-axis rotation following member 332 relatively slides with respect to the Y-axis rotation receiving member 331 and the X-axis rotation following member 334 relatively slides with respective to the X-axis rotation receiving member 333 attached to the slid Y-axis rotation following member 332, so that a following operation to a plane substantially in parallel with the contact portion 301 by the IC to be tested is performed.

Note that operations by the electronic device testing apparatus 1 other than the following operation of the first contact arm explained above are the same as those in the first embodiment.

As explained above, as a result that the contact arm performs the following operation to the plane substantially in parallel with the inclined contact portion at the time the IC to be tested contacts the contact portion, erroneous contact can be reduced even when the contact portion is inclined, and damages on input/output terminals of the IC to be tested and contact pins of the contact portion can be suppressed.

Also, at the time of aligning the IC to be tested with the contact portion, even when the movable plane of the alignment device is a little inclined, the contact arm can perform the following operation to the inclination of the movable plane, so that accurate alignment becomes possible.

Third Embodiment

In the above second embodiment, a case of providing two YZ transfer devices having four first contact arms in the test section was explained, but below, as a third embodiment, an electronic device testing apparatus wherein any number of first contact arms can be provided to the two YZ transfer devices will be explained.

Note that except that the number of the first contact arms is different, the configuration is the same as that of the electronic device testing apparatus in the above second embodiment, so that explanations on the configuration thereof other than the number of the first contact arm will be omitted and the same reference numbers will be used for the same components as those in the second embodiment.

In the electronic device testing apparatus 1 in the present embodiment, in the same way as in the second embodiment, the movable head portion 312 of the YZ transfer device 310 of the test section 30 is detachably attached with a unit composed of a base member 340 and any number of first contact arms $315a_2$ held by the base member 340.

Generally, the number and an arrangement of the contact portion 301 on the test head 300 are determined by a shape of the IC to be tested and the number of input/output terminals, etc. and changed for every kind of the ICs to be tested. On the other hand, in the present embodiment, a plurality of units having first contact arms $315a_2$ of the number and the arrangement corresponding to every kind of ICs to be tested are prepared in advance, and when a kind of ICs to be tested is changed, the unit is changed to what corresponds to the ICs to be tested at the time of changing the test head 300.

Figure 31:
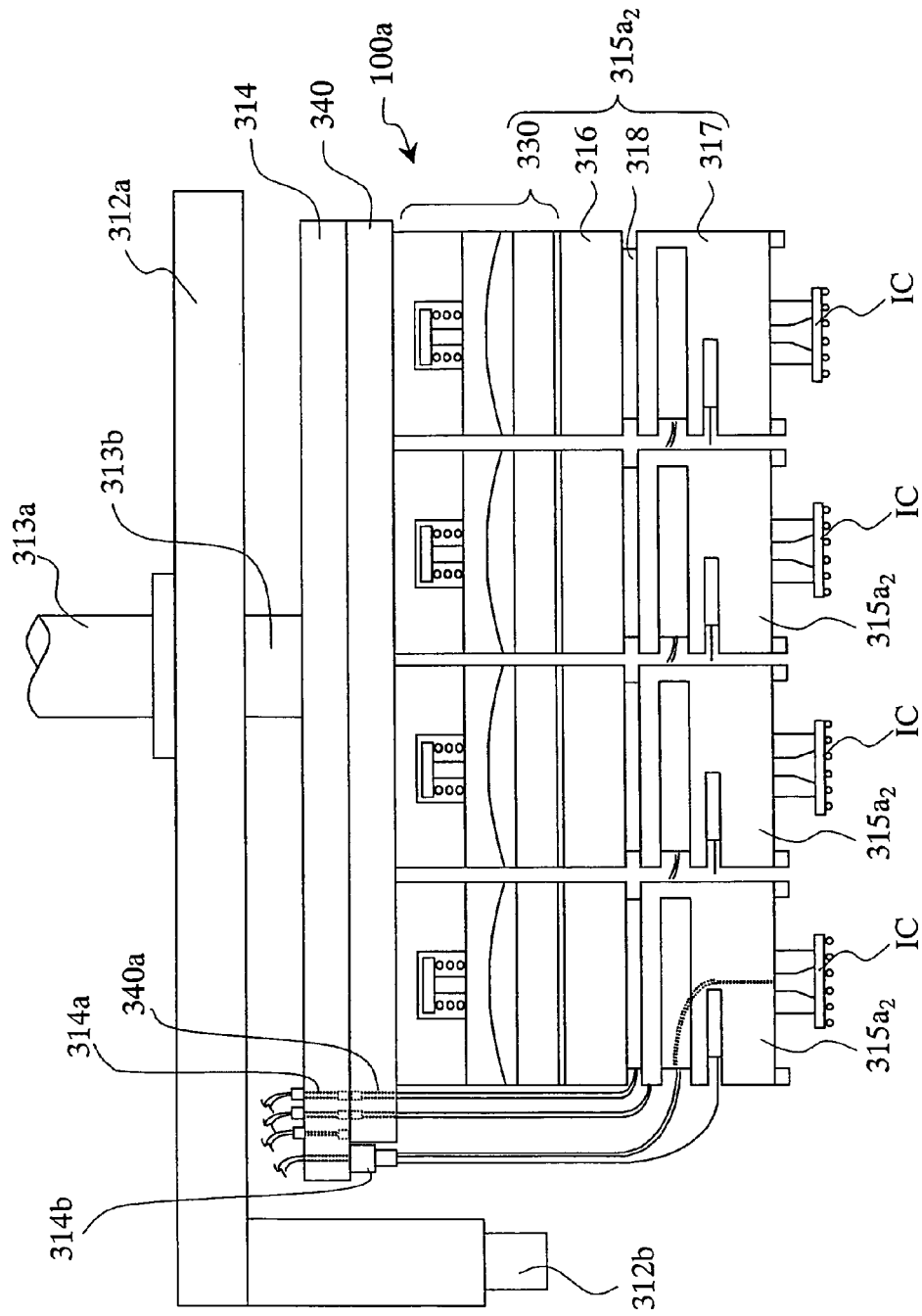
FIG. 31 is a schematic view from the side of the first contact arm of the YZ-transfer device in a third embodiment of the present invention.
Figure 32A:
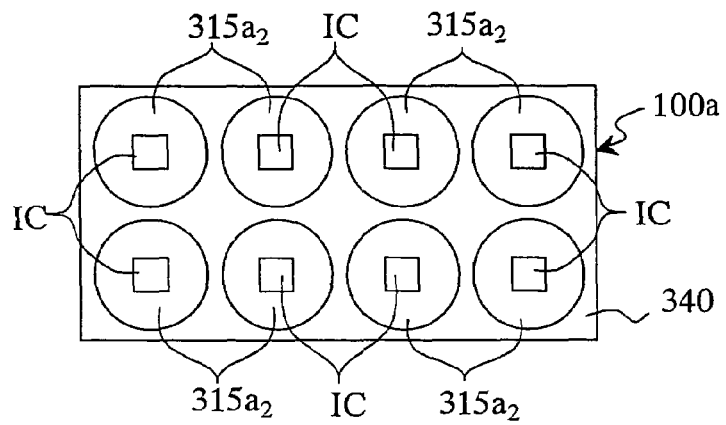

FIG. 31 and FIG. 32A show the first unit 100a having eight first contact arms $315a_2$ arranged, for example, in four rows by two columns as an example of the units prepared in advance. Note that, in FIG. 31, the first contact arm $315a_2$ shown on the rightmost side in the figure corresponds to the contact arms arranged at the first row on the first column and at the first row on the second column in FIG. 1, the first contact arm $315a_2$ shown next to that in the figure corresponds to the contact arms arranged at the second row on the first column and at the second row on the second column in FIG. 1, the first contact arm $315a_2$ shown next to the one on the leftmost side in the figure corresponds to the contact arms arranged at the third row on the first column and at the third row on the second column not shown in FIG. 1, and the first contact arm $315a_2$ shown on the leftmost side in the figure corresponds to the contact arm arranged at the fourth row on the first column and at the fourth row on the second column not shown in FIG. 1. Note that, in FIG. 31, the four first contact arms arranged at the first row on the first column, the second row on the first column, the third row on the first column, and the fourth row on first column are not shown because they are overlapped with the four contact arms $315a_2$ arranged at the first row on second column, the second row on the second column, the third row on the second line, and the fourth row on second column.

As shown in FIG. 31, the base member 340 of the first unit 100a is attached to the movable head portion 312 of the YZ transfer device 310 of the test section 30.

The base member 340 is a flat plate shaped member having a little smaller outer shape than the root portion 314 of the movable head portion 312, and detachably attached to the root portion 314, for example, by a bolt, etc. On the lower surface of the base member 340 is provided with eight first contact arms $315a_2$ arranged in four rows by two columns in an arrangement corresponding to that of eight contact portion 301 of the test head 300 in the direction so that the suction pads 317c and the contact portions 301 face to each other.

On one end portion of the base member 340, a first air path 340a is formed by penetrating from the upper surface to the lower surface for flowing all air required by the eight first contact arms $315a_2$ in the same way as in the second embodiment. Also, on the root portion 314 of the YZ transfer device 310 is formed a second air path 314a. When the base member 340 is attached to the root portion 314, the first air path 340a and the second air path 314a are connected to each other and an air is suitably supplied from the air supply means (not shown) to the lock-and-free mechanism 318 and suction pads 317c of the respective first contact arms $315a_2$ via the air paths 340a and 314a.

Furthermore, a connector 314b for supplying all electricity required by the eight first contact arms $315a_2$, such as a heater 317a and a temperature sensor 317b, etc. of the first contact arm $315a_2$ is provided near the second air path 314a on the root portion 314.

The configuration of each of the first contact arm $315a_2$ held by the base member 340 is the same as that in the second embodiment, wherein the plane following mechanism 330, the root side contact arm 316, a lock-and-free mechanism 318 and the holding side contact arm 317 are attached on the lower surface of the base member 340 in this order.

All air piping extending from the suction pads 317c and the respective lock-and-free mechanism 318 of the respective holding side contact arms 315a is connected to the first air path 340a of the base member 340, and all electric wiring extending from the heater 317a and temperature sensor 317b buried in the respective holding side contact arms 315a is connected to the connector 314b of the root portion 314. Note that, while not particularly illustrated in FIG. 31, all air piping extending from the first contact arms $315a_2$ positioned first to third from the right in the figure is also connected to the first air path 340a of the base member 340, and electric wiring extending from the first contact arm $315a_2$ is also connected to the connector 314b provided to the root portion 314.

Figure 32B:
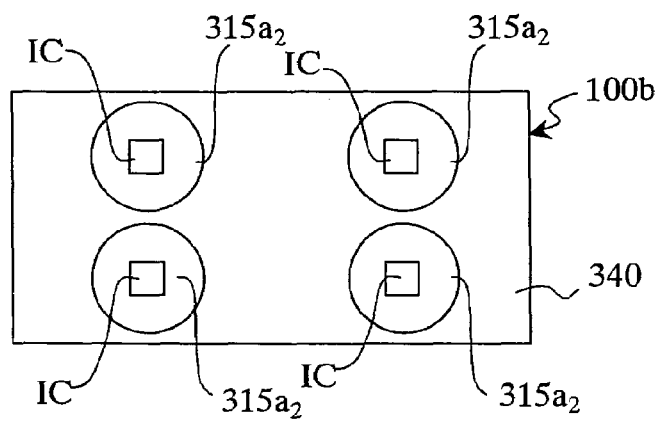
Figure 32C:
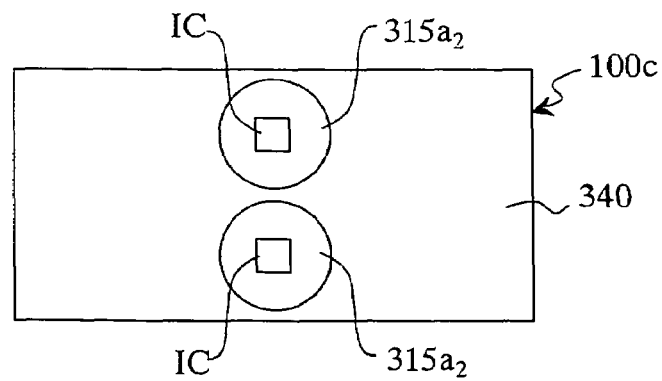

FIG. 32B shows a second unit 100b having four first contact arms $315a_2$ arranged, for example, in two rows by two columns as another example of the unit prepared in advance. Also, FIG. 32C shows a third unit 100c having two first contact arms $315a_2$ arranged, for example, in two rows by one column as still another example of the unit prepared in advance.

The respective first contact arms $315a_2$ and base members 340 of the units 100b and 100c are configured the same as those in the first unit 100a shown in FIG. 31 and FIG. 32A, and only the number and the arrangement of the first contact arms $315a_2$ are different. Note that a shape of the base member 340 is substantially the same and the first air path 340a provided to the base member 340 is formed at substantially the same position.

These units 100a, 100b and 100c are suitably exchanged when changing a kind of ICs to be tested in accordance with the number and arrangement of the contact portion 301 of the test head 300 determined by a shape of the ICs to be tested and the number of input/output terminals HB, etc.

For example, in the case where eight contact portions 301 are arranged in four rows by two columns on the test head 300, the first unit 100a is attached to the base portion 314 of the movable head portion 312 of the YZ transfer 310 when changing the kind of the IC to be tested. On the other hand, in the case where four contact portions 301 are arranged in two rows by two columns on the test head 300, it is changed to the second unit 100b when changing the kind of the IC to be tested. Also, in the case where two contact portions 301 are arranged in two rows by one column on the test head 300, it is changed to the third unit 100c when changing the kind of the IC to be tested. Such changing is respectively made on the two YZ transfer devices 310 provided to the electronic device testing apparatus 1 when changing kinds of ICs to be tested.

Note that when changing the unit, since the respective units 100a, 100b and 100c have substantially the same shape and have the base member 340 formed with the first air path 340a at substantially the same position, only by detaching the base member 340 form the root portion 314 by unscrewing the bolt and attaching a base member 340 of a new unit, the first air path of the base member 340 is connected to the second air path 314a of the root portion 314 of the movable head portion 312 of the YZ transfer device 310 and an air is supplied to the respective contact arms $315a_2$. Also, only by connecting the electric wiring introduced from the respective contact arms $315a_2$ provided to the unit to the connector 314b of the root portion 314, electricity is easily supplied.

By enabling to suitably change to a unit having contact arms of the number and arrangement corresponding to a kind of ICs to be tested, the simultaneously measured amount in the electronic device testing apparatus can be optimized and the test efficiency of the ICs to be tested can be improved.

An alignment operation of the ICs to be tested held by the eight contact arms $315s_2$ arranged in four rows by two columns is performed by the same procedure as in the first embodiment. First, alignment of two ICs to be tested arranged at the fourth row on the first column and the fourth row on the second column positioned on the leftmost side in FIG. 31 is performed, next, alignment of two ICs to be tested arranged at the third row on the first column and the third row on the second column is performed, then, alignment of two ICs to be tested arranged at the second row on the first column and the second row on the second column is performed, and finally, alignment of two ICs to be tested arranged at the first row on the first column and the first row on the second column positioned on the rightmost side in FIG. 31 is performed. When alignments of all ICs to be tested is completed, the eight ICs to be tested are transferred by the YZ transfer device 310 and brought to contact the contact portion 301 all at a time for conducting a test. Note that while the alignment of the eight ICs to be tested is performed as above, the test is conducted by other YZ transfer device 310. Operations other than the alignment operation are the same as those in the second embodiment.

Note that, in the present embodiment, a case where two, four or eight contact arms are provided to one unit was explained, however, the present invention is not particularly limited to this and one, three, five to seven or nine or more contact arms may be provided. Also, furthermore prompt alignment can be attained by increasing a simultaneously aligned amount of the alignment device.

Fourth Embodiment

In the above second embodiment, an explanation was made on the electronic device testing apparatus comprising a first contact arm of a type provided with a lock-and-free mechanism for performing alignment of a position of an IC to be tested with the contact portion by image processing. However, as a fourth embodiment, an electronic device testing apparatus wherein it is possible to suitably change two types of contact arms for bringing the IC to be tested to contact the contact portion without performing alignment of a position of an IC to be tested by image processing will be explained below.

Note that except that it is possible to change to different types of contact arms, the configuration of the electronic device testing apparatus is the same as that in the above second embodiment, so the explanations on the configuration of the electronic device testing apparatus other than the contact arm will be omitted and the same reference numbers will be used for the same components as those in the second embodiment.

A unit having three kinds of contact arms 315a, 315b and 315c below can be attached to the movable head portion 312 of the YZ transfer device 310 of the electronic device testing apparatus 1 in the present embodiment.

The first contact arm $315a_2$ is a type of performing alignment of a position of an IC to be tested with the contact portion by image processing in the same way as in the second embodiment and is a contact arm for dealing with ICs to be tested of a kind requiring highly accurate alignment at the time the contact portion 301 contacts the IC to be tested.

On the other hand, the second contact arm 315b and the third contact arm 315c do not perform alignment of a position of an IC to be tested by image processing and are contact arms for dealing with ICs of a kind requiring accuracy of not as high as that in the first contact arm $315a_2$.

The second contact arm 315b is a type of managing a pressing force when the contact portion 301 contacts the IC to be tested by stroke control of the Z-axis direction actuator 313 for elevating and lowering the movable head portion 312 of the YZ transfer device 310 along the Z-axis direction. On the other hand, the third contact arm 315c is a type of managing the pressing force at the time of the contact by pressure control of an air pressure of a diaphragm cylinder 361 provided to the contact arm.

Accordingly, the third contact arm 315c is to deal with ICs to be tested of a kind requiring management of the pressing force at high accuracy at the time the contact portion 301 contacts the IC to be tested, while the second contact arm 315b is to deal with ICs to be tested of a kind requiring management of the pressing force not as highly accurately as in the third contact arm 315c.

Below, the respective contact arms will be explained.

First, the first contact arm 315a is a contact arm having the same configuration as that in the second embodiment as shown in FIG. 25, comprises the plane following mechanism 330, the root side contact arm 316, the lock-and-free mechanism 318 and the holding side contact arm 317 and attached to the lower surface of the base member 340 in this order. The first contact arm $315a_2$ is capable of performing alignment of a position of an IC to be tested with the contact portion 301 by image processing and performing a following operation to the plane substantially in parallel with the contact portion 301 when the IC to be tested contacts the contact portion 301.

Four first contact arms $315a_2$ configured as above are held by a base member 340 to compose one unit, wherein all air piping introduced from the respective contact arms $315a_2$ is connected to the first air path 340a formed on the base member 340.

Figure 33:
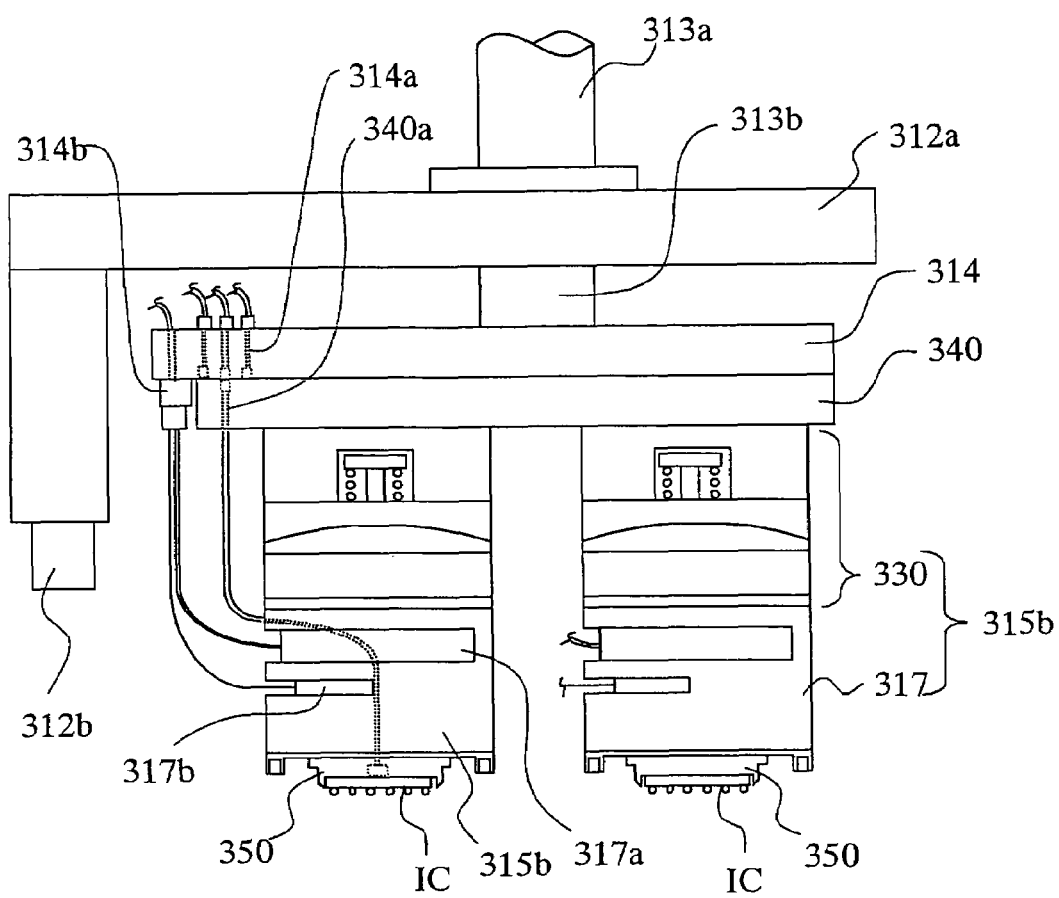
FIG. 33 is a schematic view from the side of a second contact arm in a fourth embodiment of the present invention.

Next, the second contact arm 315b comprises, as shown in FIG. 33, the above plane following mechanism 330 and the holding side contact arm 317 and attached to the lower surface of the base member 340 in this order. The configurations of the plane following mechanism 330 and the holding side contact arm 317 of the second contact arm 315*b* are the same as those in the second embodiment except that a change kit 350 corresponding to a kind and shape, etc. of an IC to be tested to be held is attached.

As shown in FIG. 33, four second contact arms 315*b* configured as above held by the base member 340 to compose one unit, wherein all air piping for suction introducing from the respective contact arms 315*b* is connected to the first air path 340*a* of the base member 340. Note that, in FIG. 33, the second contact arm 315*b* shown on the right side in the figure corresponds to the contact arms arranged at the first row on the first column and the first row on the second column in FIG. 1, and the second contact arm 315*b* shown on the left side in the figure corresponds to the contact arms arranged at the first row on the second column and the second row on the second column in FIG. 1. Note that the second contact arms 315*b* arranged at the first row on the first column and the second row on the first column are not shown in the figure because they overlap with the contact arms 315*b* arranged at the first row on the second column and the second row on the second column. Also, while not particularly illustrated in FIG. 33, all air piping extending from the second contact arms 315*b* shown on the right side in the figure is connected to the first air path 340*a* of the base member 340.

A shape of the base member 340 for supporting the second contact arm 315*b* is substantially the same shape as one holding the first contact arm 315$a_2$ and the first air path 340*a* is formed also at substantially the same position, but since the second contact arm 315*b* is not provided with the lock-and-free mechanism 318, the air path for supplying an air for a centering operation and restricting is not formed on the base member 340.

ICs to be tested of a kind to be dealt by the second contact arm 315*b* do not require alignment for conducting a test thereon, so that the YZ transfer device 310 directly transfers the ICs to be tested from the loader buffer portion 502 of the loader section 50 to the contact portion 301. When the ICs to be tested are positioned above the contact portion 301, the YZ transfer device 310 lowers the movable head portion 312 of the YZ transfer device 310 to detect terminals or an upper surface of the contact portions 301. The detection of the terminals or the upper surface of the contact portion 301 may be performed by a torque limiter of the Z-axis direction actuator 313 for elevating and lowering the movable head portion 312 or an approaching sensor.

When the terminals or upper surface of the contact portion 301 are detected, a test is conducted at a time on four ICs to be tested by pressing to the contact portion 301 by adding a previously set terminal change amount to a stroke to the terminals or the upper surface of the contact portion 301. In the case erroneous contact occurs during the test, a contact stroke amount is gradually increased from the amount up to then until erroneous contact does not occur. At this time, when the contact stroke amount in total exceeds the upper limit, a warning is given at the point. Note that alignment of the IC to be tested with the contact portion 301 is performed by fitting the concave portion formed at the end portion of the change kit 350 in a not shown convex portion provided near the contact portion 301.

Figure 34:
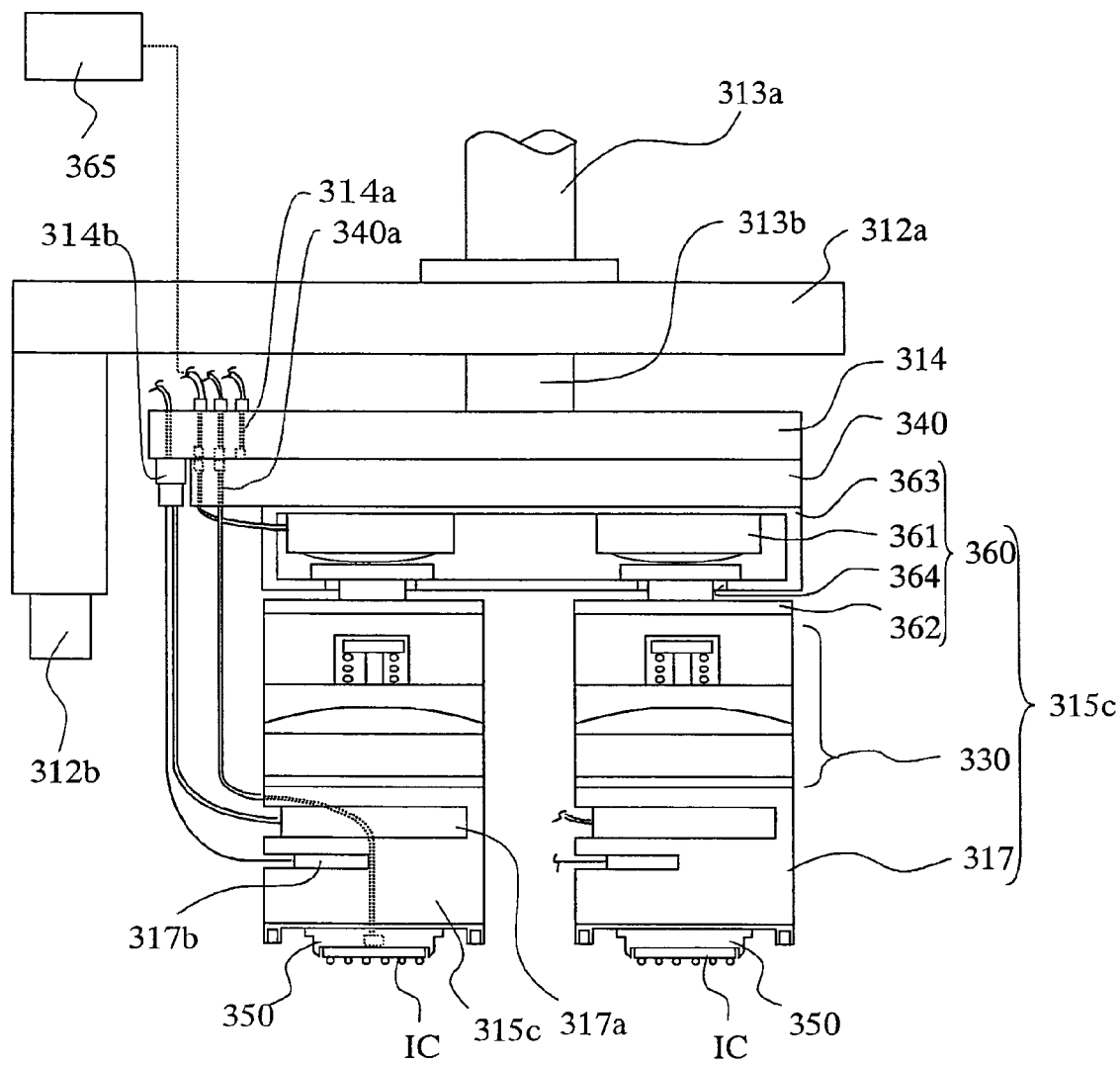
FIG. 34 is a schematic view from the side of a third contact arm in the fourth embodiment of the present invention.

Next, the third contact arm 315*c* comprises, as shown in FIG. 34, the diaphragm portion 360, the above plane following mechanism 330 and the holding side contact arm 317 and attached to the lower surface of the base member 340 in this order. The configurations of the plane following mechanism 330 and the holding side contact arm 317 of the third contact arm 315*c* are the same as those in the second embodiment except that the change kit 350 corresponding to a kind and shape, etc. of a holding IC to be tested is attached to the lower end surface of the holding side contact arm 317.

The diaphragm portion 360 of the third contact arm 315*c* comprises diaphragm cylinders 361, rods 362 and a case 363 for accommodating them, wherein two openings 364 are formed on the case 363 and the rods 362 are inserted to the openings 364 by leaving a slight space. An upper end of the rod 362 is made to have a larger diameter than that of the opening 364, so that the rod 362 is supported by the case 363, but the rod 362 is movable with respect to the base 363 due to the above space left between itself and the opening 364.

The diaphragm cylinder 361 for giving a pressing force to the upper end of each rod 362 is provided inside the case 363. In the example shown in FIG. 34, the diaphragm cylinder 361 is provided respectively to the two rods 362, and the respective diaphragm cylinders 361 are controlled by a respectively provided accuracy regulator 365. Namely, in the present example, by controlling the respective diaphragm cylinders 361, a pressing force to the respective rods 362 can be adjusted. Note that while FIG. 34 shows one accuracy regulator 365, the accuracy regulator 365 is actually provided in accordance with the number of diaphragm cylinders 361.

As shown in FIG. 34, the four third contact arms 315*c* configured as above held by the base member 340 compose one unit, wherein all air piping for suction introduced from the respective contact arms 315*c* is connected to the first air path 340*a* of the base member 340, and the air piping for pressing of the diaphragm cylinder 361 introduced from the diaphragm unit 360 of the respective contact arms 315*c* is connected to the first air path 340*a* of the base member 340. Note that, in FIG. 34, the third contact arm 315*c* shown on the right side in the figure corresponds to the contact arms arranged at the first row on the first column and the first row on the second column in FIG. 1, and the second contact arm 315*b* shown on the left side in the figure corresponds to the contact arms arranged at the second row on the first column and the second row on the second column in FIG. 1. Note that the third contact arms 315*c* arranged at the first row on the first column and the second row on the first column are not shown because they overlap with the contact arms 315*c* arranged at the first row on the second column and the second row on the second column. Also, while not particularly illustrated in FIG. 34, all air piping extending from the third contact arms 315*c* shown on the right side in the figure is connected to the first air path 340*a* of the base member 340.

A shape of the base member 340 for holding the third contact arm 315*c* is substantially the same shape as what held by the first contact arm 315$a_2$ and the first air path 340*a* is formed at substantially the same position. However, the third contact arm 315*c* is not provided with the lock-and-free mechanism 318, so that the base member 340 is not formed an air path for supplying an air to the lock-and-free mechanism 318. On the other hand, the third contact arm 315*c* is provided with the diaphragm unit 360, so that the base member 340 is formed an air path for supplying an air to the diaphragm unit 360.

ICs to be tested of a kind to be dealt by the third contact arm 315*c* do not require alignment for conducting a test thereon in the same way as in the case of the second contact arm 315*b*, so that the YZ transfer device 310 directly transfers the ICs to be tested from the loader buffer portion 502 of the loader section 50 to the contact portion 301. When the ICs to be tested are positioned above the contact portions 301, the YZ transfer device 310 lowers the movable head portion 312 to detect terminals or an upper surface of the contact portions 301 while applying a maximum air pressure to the respective diaphragm cylinders 361 from the respective accuracy regulators 365.

When the terminals or upper surface of the contact portion 301 are detected, a test is conducted at a time on four ICs to be tested by slightly lowering the movable head portion 312 to a stroke to the terminals or upper surface of the contact portion 301 and supplying an air pressure set in advance in accordance with a reactive force of the terminals of the contact portion 301 from the respective accuracy regulators 365 to the respective diaphragm cylinders 361. The set air pressure at this time is a value in accordance with the arrangement and number of the contact portion 301 and the arrangement and number of ICs to be tested picked up by the contact arms 315c. In the case erroneous contact occurs during the test, the air pressure to be supplied to the diaphragm cylinder 361 is gradually raised until erroneous contact does not occur. At this time, when the air pressure exceeds the upper limit value, a malfunction warning is given at the point. Note that alignment of the IC to be tested with the contact portion 301 is performed by fitting the concave portion formed at the end portion of the change kit 350 in a not shown convex portion provided near the contact portion 301.

On the root portion 314 of the YZ transfer device 310 of the present embodiment, a second air path 314a is formed by penetrating from the upper surface to the lower surface at a position corresponding to the first air piping 314a formed on the base member 340 of the unit having respective types of contact arms 315a2, 315b and 315c. The second air path 314a is provided with all air paths required by the all types of the contact arms $315a_2$, 315b and 315c able to be attached to the base portion 314 for suction, a centering operation, restricting and pressing, etc., so that one root portion 314 is able to deal with the all types of contact arms $315a_2$, 315b and 315c. Furthermore, a connector 314b for supplying all electricity required by the four contact arms $315a_2$ attached to the movable head portion 312, such as a heater 317a and a temperature sensor 317b of the contact arms $315a_2$, is provided near the second air path 314a on the root portion 314. Note that, while not particularly illustrated in FIG. 33 and FIG. 34, all electric wiring extending from the contact arms 315b and 315c shown on the right side in the figure is connected to the connector 314b provided on the root portion 314.

As explained above, by making it possible to change to a unit having a suitable contact arm in accordance with aligning accuracy and accuracy of pressing force management required by every kind of ICs to be tested at the time of the contact, functions required for the contact arm can be optimized.

For example, when dealing with ICs to be tested of a kind requiring highly accurate alignment at the time of the contact, a unit having four first contact arms $315a_2$ is attached to the root portion 314 of the YZ transfer device 310 for handling the IC to be tested of the kind. During this time, when a base member 340 of the unit having four first contact arms $315a_2$ is attached to the root portion 314, the first air path 340a for suction, a centering operation and restricting of the base member 340 of the unit is connected to the second air path 314a for suction, a centering operation and restricting of the root portion 314. Note that the first air path 340a for pressing is not formed on the base member 340 of the unit, so that the second air path 314a for pressing of the root portion 314 is in a closed state. A valve, etc. for opening and closing along with the connection with the first air path 340a may be provided at the lower end portion of the second air path 314a.

On the other hand, when dealing with ICs to be tested of a kind not requiring aligning accuracy very much and not requiring strict management of a pressing force at the time of the contact, for example, the base member 340 of the unit having four first contact arms $315a_2$ is detached from the root portion 314 by unscrewing the bolt and a base member 340 of a unit having four second contact arms 315b is attached so as to handle the ICs to be tested of the kind. During this time, when the base member 340 of a unit having four second contact arms 315b is attached to the root portion 314, only the first air path 340a for suction of the base member 340 of the unit is connected to the second air path 314a for suction of the root portion 314. Note that the base member 340 of the unit is not formed the first air path 340a for a centering operation, restricting and pressing, the second air path 314a of pressing of the root portion 314 becomes a closed state.

Also, when dealing with ICs to be tested of a kind not requiring aligning accuracy very much but requiring strict management of a pressing force at the time of the contact, for example, the base member 340 of the unit having four first contact arms $315a_2$ or the base member 340 of the unit having four second contact arms 315b before changing a kind is detached from the root portion 314 by unscrewing the bolt and a base member 340 of a unit having four third contact arms 315c is attached so as to handle the ICs to be tested of the kind. During this time, when the base member 340 of a unit having four third contact arms 315c is attached to the root portion 314, only the first air path 340a for suction and pressing of the base member 340 of the unit is connected to the second air path 314a for suction and pressing of the root portion 314. Note that the base member 340 of the unit is not formed the first air path 340a for a centering operation and restricting, the second air path 314a for a centering operation and a restricting operation of the root portion 314 become a closed state.

As explained above, in the test of ICs to be tested of a kind not requiring alignment accuracy very much at the time of the contact, by changing the unit having the first contact arms $315a_2$ to the unit having the second contact arms 315b or the unit having the third contact arms 315c, functions required to the contact arms can be optimized. Also, when compared with the cases of the above first to third embodiments, a range of kinds of ICs to be tested able to be dealt with an identical electronic device testing apparatus can become remarkably wide.

Note that the embodiments explained above are for easier understanding of the present invention and not to limit the present invention. Accordingly, respective elements disclosed in the above embodiments include all modifications in designs and equivalents belonging to the technical field of the present invention.

The invention claimed is:

1. An electronic device testing apparatus comprising a first contact arm for holding the electronic device to be tested and bringing the electronic device to be tested to contact a contact portion of a test head, and a moving means provided on a base side for moving said first contact arm, including:
   a first image pickup means for taking an image of the electronic device to be tested in a state of being held by said first contact arm;
   an image processing means for recognizing a relative position of the electronic device to be tested held by said first contact arm with respect to said contact portion based on image information taken by said first image pickup means; and a contact arm position correction means for correcting the position of said first contact arm holding said electronic device to be tested based on the relative position of the electronic device to be tested with respect to said contact portion recognized by said image processing means, wherein said first contact arm comprises:

a holding side contact arm for holding said electronic device to be tested, a fixing side contact arm fixed to said moving means and a lock-and-free means for restricting or non-restricting a movement of said holding side contact arm relative to said fixing side contact arm, said contact arm position correction means is provided on said base side and moves said holding side contact arm relative to said fixing side contact arm.

2. The electronic device testing apparatus as set forth in claim 1, comprising a second image pickup means for taking an image of said contact portion, wherein said image processing means recognizes a relative position of the electronic device to be tested held by said first contact arm with respect to said contact portion based on image information taken by said first image pickup means and second image pickup means.

3. The electronic device testing apparatus as set forth in claims 1, wherein a reflection means for reflecting an image is provided on an optical axis of said first image pickup means.

4. The electronic device testing apparatus as set forth in claim 1, wherein said lock-and-free means provided between said holding side contact arm and said fixing side contact arm, for restricting or non-restricting a planar movement of said holding side contact arm with respect to said fixing side contact arm on a X-Y plane substantially in parallel with said contact portion.

5. The electronic device testing apparatus as set forth in claim 4, wherein said first contact arm further includes a plane following means capable of rotating said electronic device to be tested about any axis in parallel with the X-Y plane substantially in parallel with said contact portion.

6. The electronic device testing apparatus as set forth in claim 4, wherein said first contact arm can be attached to and detached from said moving means and able to be exchanged with a second contact arm not provided with said lock-and-free means.

7. The electronic device testing apparatus as set forth in claim 4, wherein said first contact arm can be attached to and detached from said moving means and able to be exchanged with a third contact arm not provided with said lock-and-free means but provided with a fluid pressure cylinder for adjusting a relative pressing force of said electronic device to be tested against said contact portion.

8. The electronic device testing apparatus as set forth in claim 4, wherein said contact arm position correction means includes a driving means for moving the holding side contact arm made to be in a non-restricted state by said lock-and-free means to any position on the X-Y plane substantially in parallel with said contact portion.

9. The electronic device testing apparatus as set forth in claim 8, wherein said driving means comprises a first driving portion for moving said holding side contact arm in the X-direction on the X-Y plane substantially in parallel with said contact portion, a second driving portion for moving said holding side contact arm in the Y-direction on said X-Y plane, and a third driving portion for rotating said holding side contact arm about any point on said X-Y plane.

10. The electronic device testing apparatus as set forth in claim 8, wherein said first contact arm holding said electronic device to be tested approaches said contact arm position correction means by said moving means, and said holding side contact arm contacting said contact arm position correction means is made to be in a non-restricted state by said lock-and-free means.

11. The electronic device testing apparatus as set forth in claim 10, wherein said holding side contact arm comprises one or more contact members for contacting said contact arm position correction means.

12. The electronic device testing apparatus as set forth in claim 11, wherein:

said contact member has either one of a convex portion or a concave portion formed at an end portion of the contact member; and said contact arm position correction means has the other of the convex portion or the concave portion to fit with said one of the convex portion or the concave portion.

13. An electronic device testing apparatus comprising two or more first contact arms for holding electronic devices to be tested and bringing said electronic devices to be tested to contact corresponding contact portions of a test head, and one or more moving means provided on a base side for moving one or more said first contact arms, including:

two or more first image pickup means for taking images of the electronic devices to be tested in a state of being held by corresponding said respective first contact arms;

one or more image processing means for recognizing relative positions of the electronic devices to be tested held by said respective first contact arms with respect to corresponding said contact portions based on image information taken by corresponding said respective image pickup means; and two or more contact arm position correction means for correcting positions of the respective first contact arms holding said electronic devices to be tested based on the relative positions of said electronic devices to be tested with respect to said contact portions recognized by corresponding said respective image processing means, wherein said each first contact arm comprises:

a holding side contact arm for holding said electronic device to be tested, a fixing side contact arm fixed to said moving means and a lock-and-free means for restricting or non-restricting a movement of said holding side contact arm relative to said fixing side contact arm, said each contact arm position correction means is provided on said base side and moves said holding side contact arm relative to said fixing side contact arm.

14. The electronic device testing apparatus as set forth in claim 13, further comprising a base member detachably attached to said respective moving means; wherein said respective first contact arms are fixed to said moving means via said base member.

15. The electronic device testing apparatus as set forth in claim 13, wherein a reflection means for reflecting an image is provided on an optical axis of said each first image pickup means.

16. The electronic device testing apparatus as set forth in claim 13, including one or more second image pickup means for taking images of corresponding said contact portions;

wherein said respective image processing means recognize relative positions of the electronic devices to be tested held by said respective first contact arms with respect to corresponding said contact portions based on image information taken by corresponding said respective first image pickup means and respective second image pickup means.

17. The electronic device testing apparatus as set forth in claim 16, wherein said each first contact arm further includes a plane following means capable of rotating said electronic device to be tested about any axis in parallel with the X-Y plane substantially in parallel with said two or more contact portions.

18. The electronic device testing apparatus as set forth in claim 13, wherein
said lock-and-free means provided between said holding side contact arm and said fixing side contact arm, for restricting or non-restricting a planar movement of said holding side contact arm with respect to said fixing side contact arm on the X-Y plane substantially in parallel with said two or more contact portions.

19. The electronic device testing apparatus as set forth in claim 18, wherein said each contact arm position correction means includes a driving means for moving the holding side contact arms made to be in a non-restricted state by said lock-and-free means to any position on the X-Y plane substantially in parallel with said contact portions.

20. The electronic device testing apparatus as set forth in claim 19, wherein said driving means comprises a first driving portion for moving said holding side contact arm in the X-direction on the X-Y plane substantially in parallel with said contact portions, and a second drive portion for moving said holding side contact arm in the Y-direction on said X-Y plane, and a third driving portion for rotating said holding side contact arm about any point on said X-Y plane.

21. The electronic device testing apparatus as set forth in claim 19, wherein said respective first contact arms holding said electronic devices to be tested approach to corresponding said contact arm position correction means by corresponding said moving means, and said holding side contact arm contacting said contact arm position correction means is made to be in a non-restricted state by said lock-and-free means.

22. The electronic device testing apparatus as set forth in claim 21, wherein said holding side contact arm comprises one or more contact members for contacting corresponding said contact arm position correction means.

23. The electronic device testing apparatus as set forth in claim 22, wherein:
said contact member has either one of a convex portion or a concave portion formed at an end portion of the contact member; and
said respective contact arm position correction means have the other of the convex portion or the concave portion to fit with said one of the convex portion or the concave portion.

24. The electronic device testing apparatus as set forth in claim 18, wherein
said respective first contact arms can be attached to and detached from said moving means and able to be exchanged with second contact arms not provided with said lock-and-free means.

25. The electronic device testing apparatus as set forth in claim 18, wherein said respective first contact arms can be attached to and detached from said moving means and able to be exchanged with third contact arms not provided with said lock-and-free means but provided with a fluid pressure cylinder for adjusting a relative pressing force of said electronic device to be tested against said contact portions.

26. A method of testing an electronic device using a first contact arm for holding an electronic device to be tested and bringing said electronic device to be tested to contact a contact portion of a test head; a moving means provided on a base side for moving said first contact arm; and a first image pickup means for taking an image of the electronic device to be tested in a state of being held by first contact arm, including:
an image pickup step for taking an image of the electronic device to be tested in a state of being held by said first contact arm;
a recognition step for recognizing a relative position of the electronic device to be tested held by said first contact arm with respect to said contact portion based on taken image information; and
a correction step for correcting a position of said first contact arm holding said electric device to be tested based on the relative position of recognized said electronic device to be tested with respect to said contact portion,
wherein said first contact arm comprises:
a holding side contact arm for holding said electronic device to be tested,
a fixing side contact arm fixed to said moving means and
a lock-and-free means for restricting or non-restricting a movement of said holding side contact arm relative to said fixing side contact arm,
a contact arm position correction means provided on said base side moves said holding side contact arm relative to said fixing side contact arm in said correction step.

27. The method of testing an electronic device as set forth in claim 26, comprising
a second image pickup means for taking an image of said contact portion;
wherein a relative position of the electronic device to be tested held by said first contact arm with respect to said contact portion is recognized based on image information taken by said first image pickup means and said second image pickup means in said recognition step.

28. A method of testing an electronic device as set forth in claims 26, wherein said correction step includes a step of moving said holding side contact made to be non-restricted on a planar movement with respect to said fixing side contact arm on the X-Y plane substantially in parallel with said contact portion, and making said planar movement restricted.

* * * * *